(12) United States Patent
Takai et al.

(10) Patent No.: US 9,759,879 B1
(45) Date of Patent: Sep. 12, 2017

(54) TRANSCEIVER MODULE, TRANSCEIVER MODULE RECEPTACLE ASSEMBLY AND TRANSCEIVER MODULE ASSEMBLY

(71) Applicant: YAMAICHI ELECTRONICS CO., LTD., Tokyo (JP)

(72) Inventors: Yosuke Takai, Sakura (JP); Toshiyasu Ito, Togane (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 15/154,151

(22) Filed: May 13, 2016

(51) Int. Cl.
| H05K 1/00 | (2006.01) |
| G02B 6/42 | (2006.01) |
| H01R 12/72 | (2011.01) |
| H01R 12/73 | (2011.01) |
| H04B 10/40 | (2013.01) |
| H04B 10/25 | (2013.01) |

(52) U.S. Cl.
CPC ........... *G02B 6/428* (2013.01); *G02B 6/4245* (2013.01); *G02B 6/4246* (2013.01); *G02B 6/4278* (2013.01); *G02B 6/4284* (2013.01); *G02B 6/4292* (2013.01); *H01R 12/721* (2013.01); *H01R 12/73* (2013.01); *H04B 10/25* (2013.01); *H04B 10/40* (2013.01)

(58) Field of Classification Search
CPC ....................................................... G02B 6/428
USPC .............................................. 439/60; 385/92
See application file for complete search history.

(56) References Cited

U.S. PATENT DOCUMENTS

| 5,013,247 | A  | * | 5/1991  | Watson   | G02B 6/3817 385/56 |
| 5,039,194 | A  | * | 8/1991  | Block    | H04B 10/50 385/53 |
| 6,609,838 | B1 | * | 8/2003  | Branch   | G02B 6/4246 361/752 |
| 6,952,532 | B2 | * | 10/2005 | Dair     | G02B 6/4214 385/88 |
| 7,101,188 | B1 | * | 9/2006  | Summers  | H01R 12/725 439/59 |
| 7,116,912 | B2 | * | 10/2006 | Pang     | G02B 6/4201 385/92 |
| 7,118,281 | B2 | * | 10/2006 | Chiu     | G02B 6/3893 385/53 |
| 7,160,036 | B2 | * | 1/2007  | Keeble   | G02B 6/4201 385/88 |
| 7,273,381 | B2 | * | 9/2007  | Ito      | H01R 12/58 439/79 |
| 7,798,820 | B2 | * | 9/2010  | Hong     | H05K 1/117 385/92 |
| 8,545,234 | B2 | * | 10/2013 | Szczesny | G02B 6/428 439/62 |

(Continued)

FOREIGN PATENT DOCUMENTS

| JP | 2015-166762 A | 9/2015 |
| JP | 2015-219454 A | 12/2015 |

*Primary Examiner* — Tulsidas C Patel
*Assistant Examiner* — Peter G Leigh
(74) *Attorney, Agent, or Firm* — Studebaker & Brackett PC

(57) ABSTRACT

An electrode portion of a module board to be disposed in a transceiver module is formed from a group of contact pads which are arrayed substantially in parallel to a long side of the module board, and the group of contact pads include a line of ground line pads formed at predetermined intervals from one end to the other end, and two lines of signal line pads formed in spaces between the ground line pads.

10 Claims, 51 Drawing Sheets

(56) References Cited

U.S. PATENT DOCUMENTS

| | | | | |
|---|---|---|---|---|
| 8,727,793 | B2* | 5/2014 | Cafiero | G02B 6/4201 439/540.1 |
| 9,354,407 | B2* | 5/2016 | Teo | G02B 6/4261 |
| 2012/0207427 | A1* | 8/2012 | Ito | G02B 6/4261 385/14 |
| 2013/0189856 | A1* | 7/2013 | Ko | H04B 10/60 439/65 |
| 2015/0249503 | A1 | 9/2015 | Sone et al. | |
| 2015/0338588 | A1 | 11/2015 | Matsui et al. | |

* cited by examiner

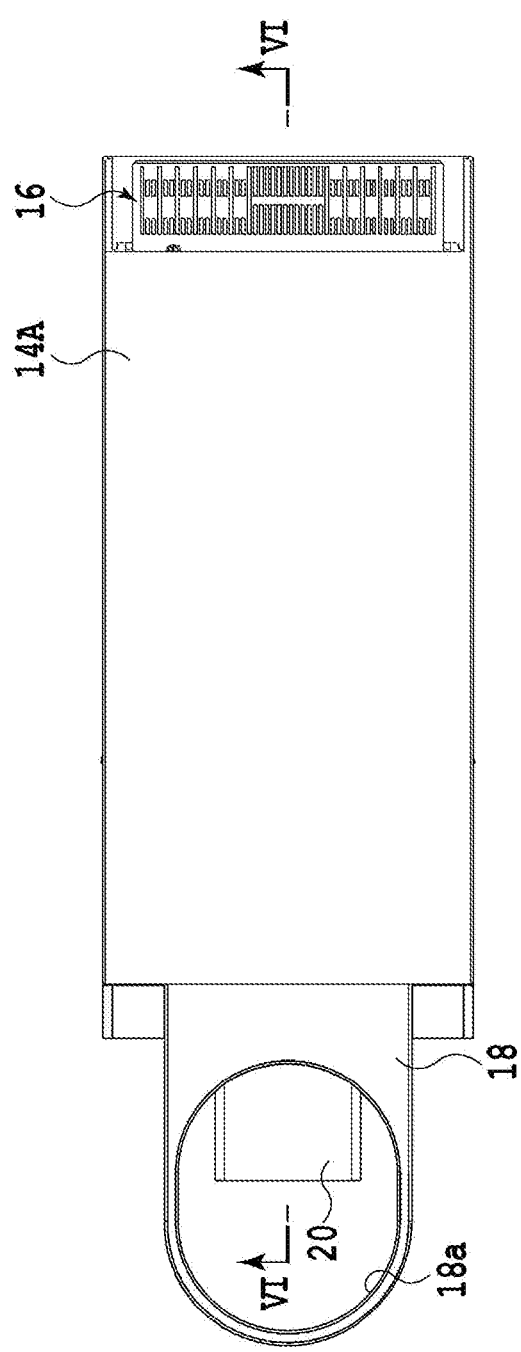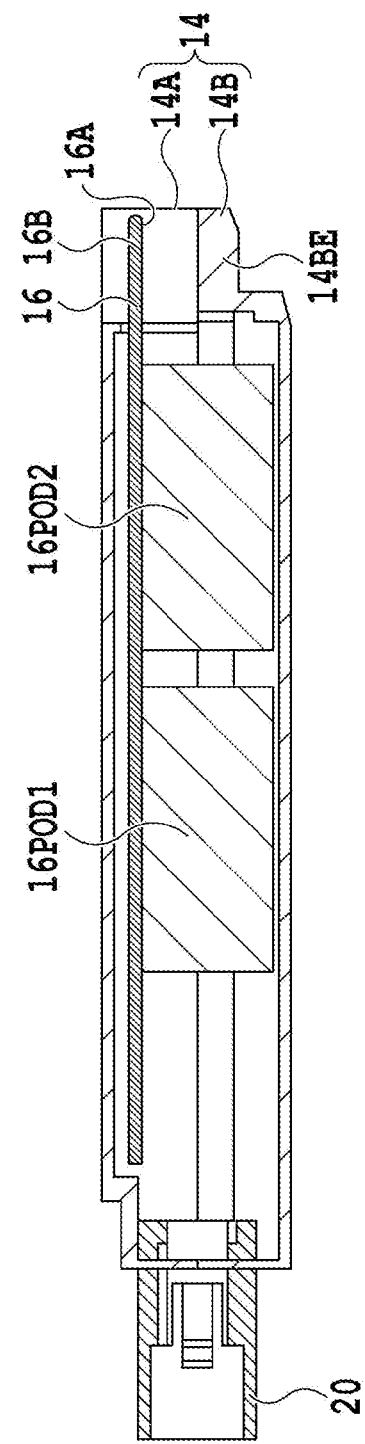

FIG.19A LINE 1

FIG.19B LINE 2

TRANSCEIVER MODULE, TRANSCEIVER MODULE RECEPTACLE ASSEMBLY AND TRANSCEIVER MODULE ASSEMBLY

BACKGROUND OF THE INVENTION

Field of the Invention

The present invention relates to a transceiver module, a transceiver module receptacle assembly, and a transceiver module assembly.

Description of the Related Art

In an optical communication system, a transceiver module is put to practical use in order to transmit a motherboard an optical signal, which is to be transmitted by using an optical fiber or a copper cable, as well as an optical connector and the like. As disclosed in Japanese Patent Application Publication No. 2015-219454, for example, such a transceiver module comprises a transmitting optical sub-assembly (hereinafter also referred to as a TOSA), a receiving optical sub-assembly (hereinafter also referred to as an ROSA), a circuit board configured to perform signal processing, control, and the like for the TOSA and the ROSA, and a plug connector part (which is referred to as a plug board in Japanese Patent Application Publication No. 2015-219454), which electrically connects the circuit board to a host connector of a receptacle assembly as main components in a housing.

Each of the transmitting optical sub-assembly and the receiving optical sub-assembly is connected to an optical connector and a cable through a connection port that is provided at an end portion of the housing. A plurality of semiconductor elements to perform the signal processing, the control, and the like are mounted on a common plane of the circuit board.

One end portion of the circuit board is inserted into a circuit board connecting portion at an inner side of the plug connector part. A group of contact pads to be connected, respectively, to solder-fixed end portions of contact terminals of the plug connector part to be described later, are provided at the one end portion of the circuit board. Moreover, a line of contact terminals corresponding to the group of contact pads of the circuit board are provided at a host connector connecting portion that protrudes forward from the plug connector part. The contact terminals constituting the line of contact terminals are formed at predetermined intervals and in parallel to a long side of the circuit board. Each contact terminal is comprised of: a contact portion to be electrically connected to the corresponding contact terminal of the host connector mentioned above; a solder-fixed end portion to be connected to the corresponding contact pad of the circuit board mentioned above; and a connecting portion which connects the contact portion to the solder-fixed end portion.

Moreover, as disclosed in Japanese Patent Application Publication No. 2015-166762, for example, when the transceiver module is of a single-core bi-directional type, the transceiver module is comprised of a BOSA (bi-directional optical sub-assembly) on which a light-transmitting/receiving element is mounted, a printed wiring board assembly on which an electronic circuit for driving the light-transmitting/receiving element is mounted, and a flexible wiring board which electrically connects the BOSA and the printed wiring board assembly to each other in the housing.

SUMMARY OF THE INVENTION

In recent years, optical communication systems using the above-described transceiver modules have been growing demands for a higher speed, a higher density, and an increase in the number of channels in data transmission.

However, there is a certain limit to arrange the transceiver modules in juxtaposition in one direction on a common plane inside a predetermined chassis. Further, regarding the transceiver module as shown in Japanese Patent Application Publication No. 2015-219454, there is also a limit to an increase in the number of the contact terminals that constitute the line of contact terminals in the transceiver modules by way of reducing the intervals of the contact terminals.

In view of the above-described problem, the present invention aims to provide a transceiver module, a transceiver module receptacle assembly, and a transceiver module assembly. The transceiver module, a transceiver module receptacle assembly, and a transceiver module assembly can achieve a higher speed, a higher density, and an increase in the number of channels in data transmission.

To achieve the above-described object, a transceiver module according to the present invention comprises: at least one module board which is electrically connected to at least one electric signal transmission path, and has a connection end; and a case having an aperture from which the connection end of the module board protrudes, and being configured to accommodate the module board wherein at least one of electrode surfaces of the connection end of the module board has a first contact pad array comprised from a plurality of contact pads arrayed at predetermined intervals and in parallel to one another, and a second contact pad array located away from the first contact pad array, and comprised from a plurality of contact pads arrayed at predetermined intervals and in parallel to one another.

In addition, the transceiver module according to the present invention has: at least one module board which is electrically connected to at least one electric signal transmission path, and has a connection end; and a case having an aperture from which the connection end of the module board protrudes, and being configured to accommodate the module board, wherein, at least one of the electrode surfaces of the connection end of the module board is formed from a plurality of contact pads arrayed at predetermined intervals and in parallel to one another, and a plug connector having a plurality of contact terminals to be electrically connected to the connection end.

Further, the transceiver module according to the present invention comprises: a first module board and a second module board which are electrically connected to at least one electric signal transmission path, and each of which has a connection end; and a case having an aperture from which the connection end of the first module board and the second module board protrude, and being configured to accommodate the module boards, wherein the connection end of the first module board has a first plug connector having a plurality of contact terminals to be electrically connected to the connection end of the first module board, and the connection end of the second module board has a second plug connector having a plurality of contact terminals to be electrically connected to the connection end of the second module board.

Still further, a transceiver module receptacle assembly according to the present invention comprises: a connector to be connected to the transceiver module described above; and a receptacle cage having a module accommodating portion having a module slot on one end to allow passage of the transceiver module, and being configured to detachably accommodate the transceiver module, and a connector accommodating portion communicating with the module accommodating portion and configured to accommodate the connector.

Finally, a transceiver module assembly according to the present invention comprises the transceiver module described above; and a transceiver module receptacle assembly including a connector to be connected to the transceiver module, and a receptacle cage having a module accommodating portion having a module slot on one end to allow passage of the transceiver module, and being configured to detachably accommodate the transceiver module, and a connector accommodating portion communicating with the module accommodating portion and configured to accommodate the connector.

According to the transceiver module, the transceiver module receptacle assembly, and the transceiver module assembly of the present invention, at least one of electrode surfaces of a connection end of a module board has: a first contact pad array comprised from a plurality of contact pads arrayed at predetermined intervals and in parallel to one another; and a second contact pad array located away from the first contact pad array, and comprised from a plurality of contact pads arrayed at predetermined intervals and in parallel to one another. Accordingly, it is possible to achieve a higher speed, a higher density, and an increase in the number of channels in data transmission.

Further features of the present invention will become apparent from the following description of exemplary embodiments (with reference to the attached drawings).

BRIEF DESCRIPTION OF THE DRAWINGS

FIG. 5 is a plan view of a transceiver module used in the first embodiment of the transceiver module assembly according to the present invention;

FIG. 6 is a cross-sectional view taken along IV-IV line in FIG. 5;

DESCRIPTION OF THE EMBODIMENTS

Figure 2:
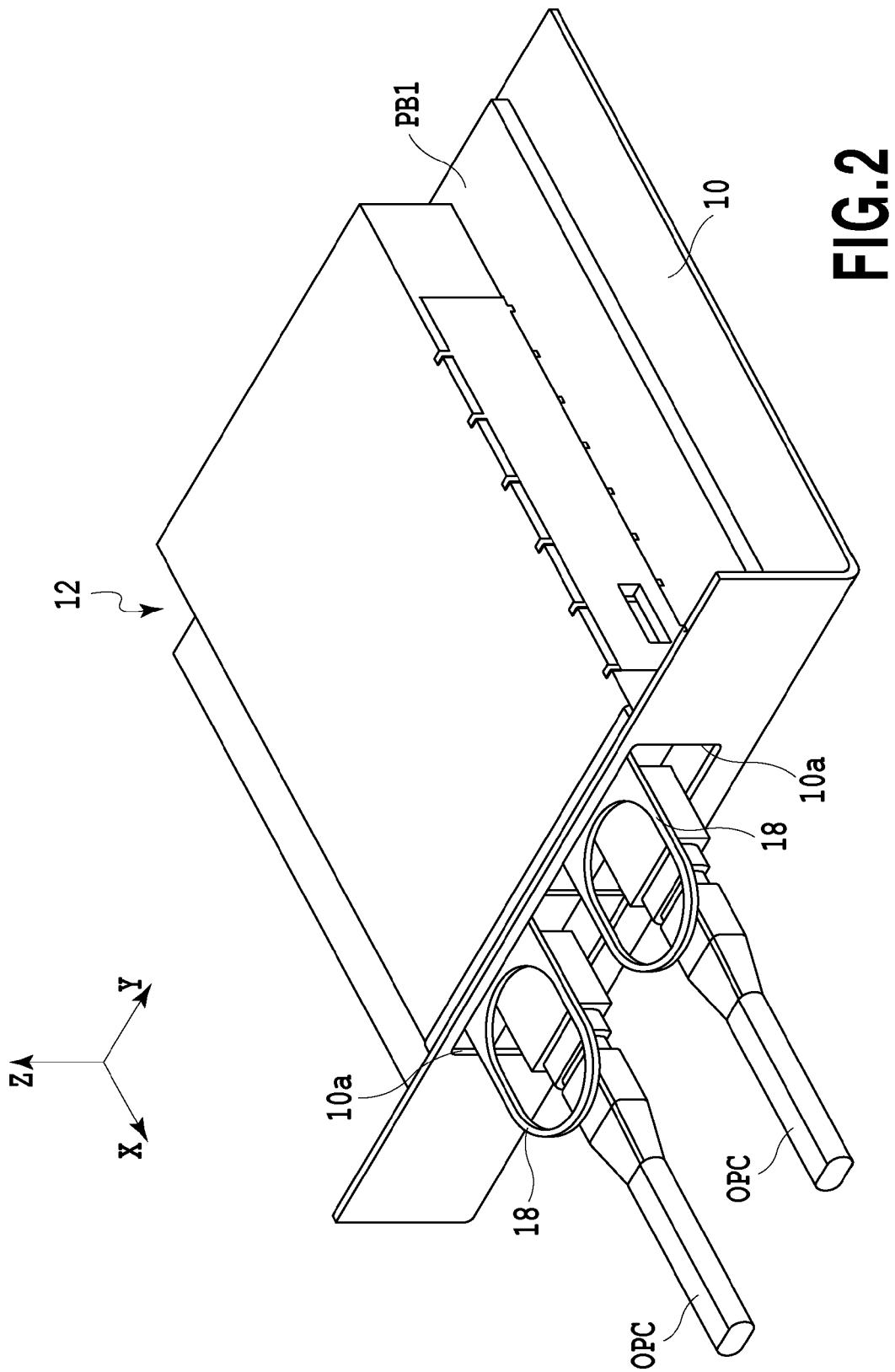
FIG. 2 is a perspective view showing external appearance of the first embodiment of the transceiver module assembly according to the present invention, which is viewed from a front face side of a support panel.
Figure 3:
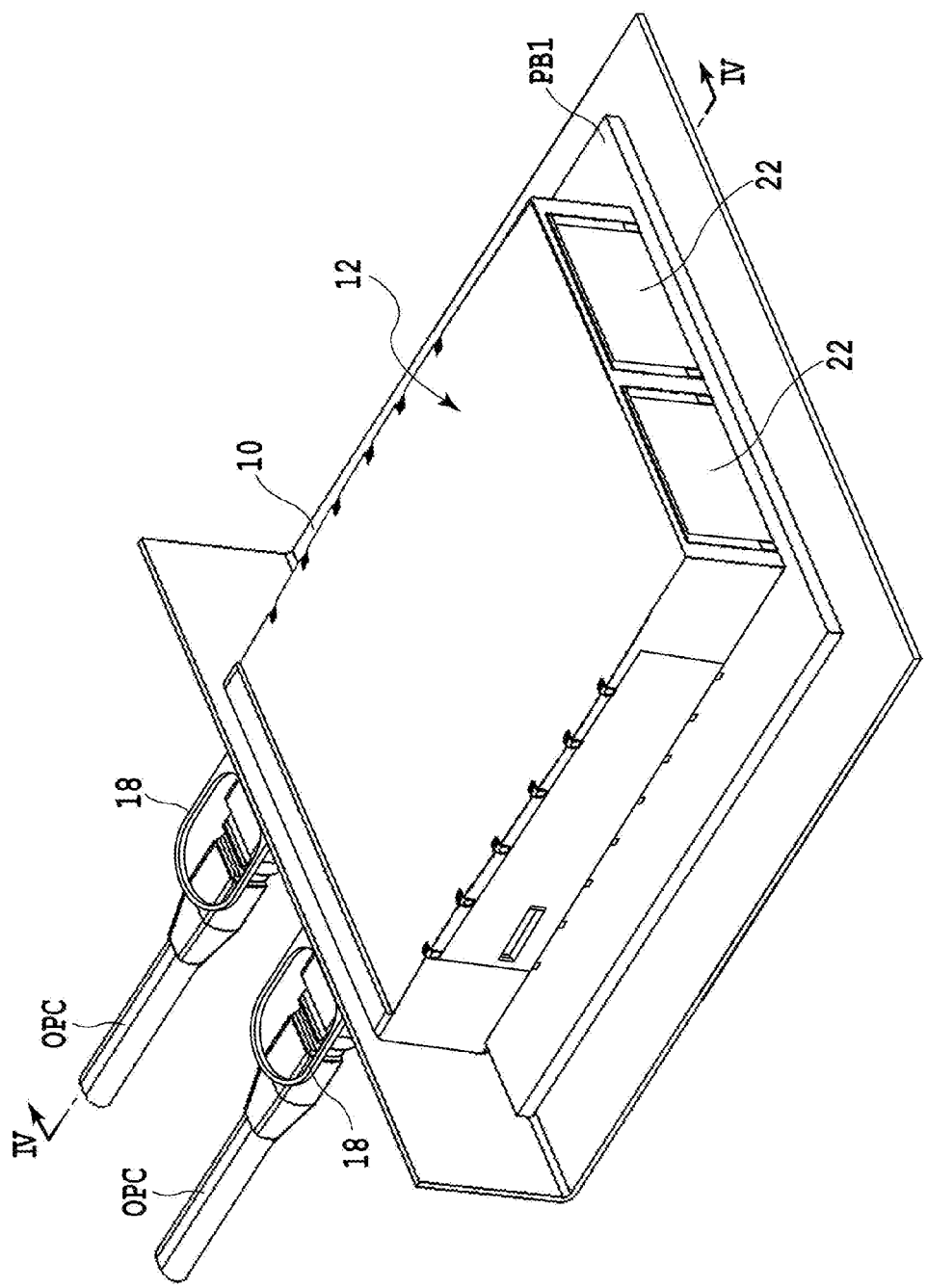
FIG. 3 is a perspective view of external appearance of the first embodiment of the transceiver module assembly according to the present invention, which is viewed from a back face side of the support panel.

FIG. 2 shows external appearance of a first embodiment of a transceiver module assembly according to the present invention.

In FIG. 2, the transceiver module assembly according to the present invention comprises transceiver modules to be described later, and transceiver module receptacle assemblies 12.

A plurality of transceiver module receptacle assemblies 12 are juxtaposed on a support panel 10 inside predetermined electronic equipment. It should be note that FIG. 2 representatively illustrates a transceiver module receptacle assembly which is supported by the support panel 10 and configured to accommodate two transceiver modules 14 individually.

Figure 7:
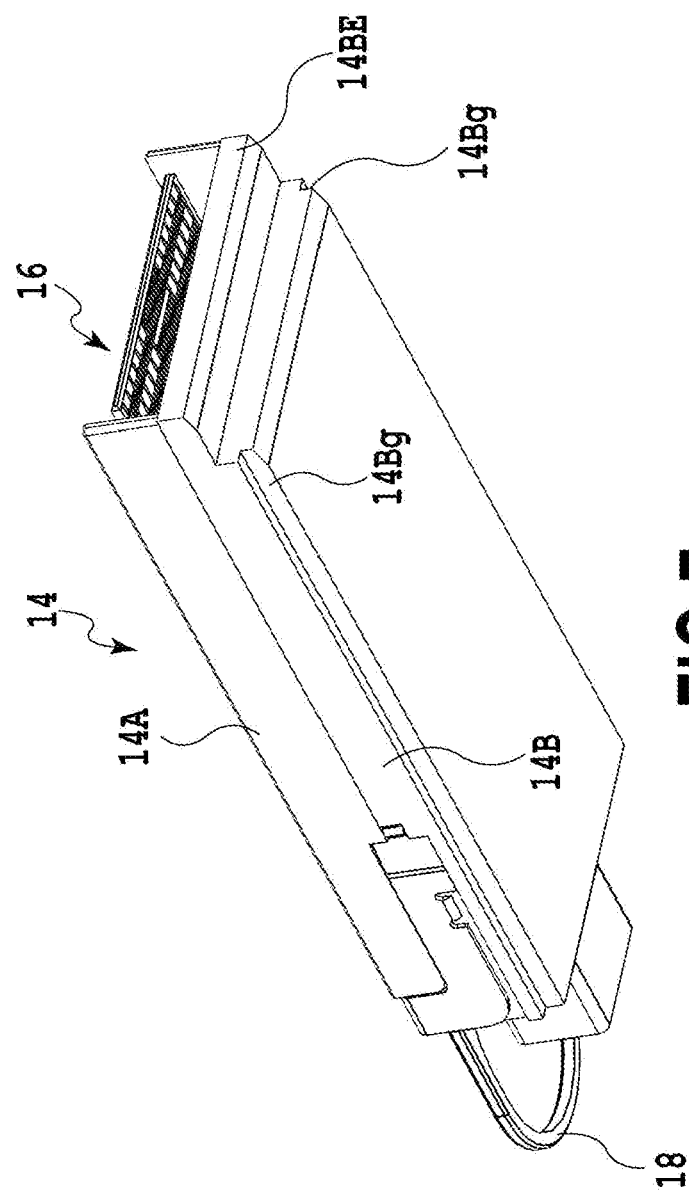
FIG. 7 is a perspective view showing external appearance of the transceiver module used in the first embodiment of the transceiver module assembly according to the present invention.

As shown in FIG. 5 and FIG. 7, each transceiver module 14 comprises, as its main components: an upper case 14A and a lower case 14B which are made of a metal and collectively form a contour; and a module board 16 of an on-board type located at a predetermined position in a accommodating space defined between the upper case 14A and the lower case 14B.

The upper case 14A as an upper member has a lower end that is opened. A pair of protection walls having a thin sheet shape and protruding in a longitudinal direction continuously with two side surfaces of the upper case are formed at one end portion of the upper case 14A. As shown in FIG. 5, a space between the pair of protection walls is opened upward.

Figure 1:
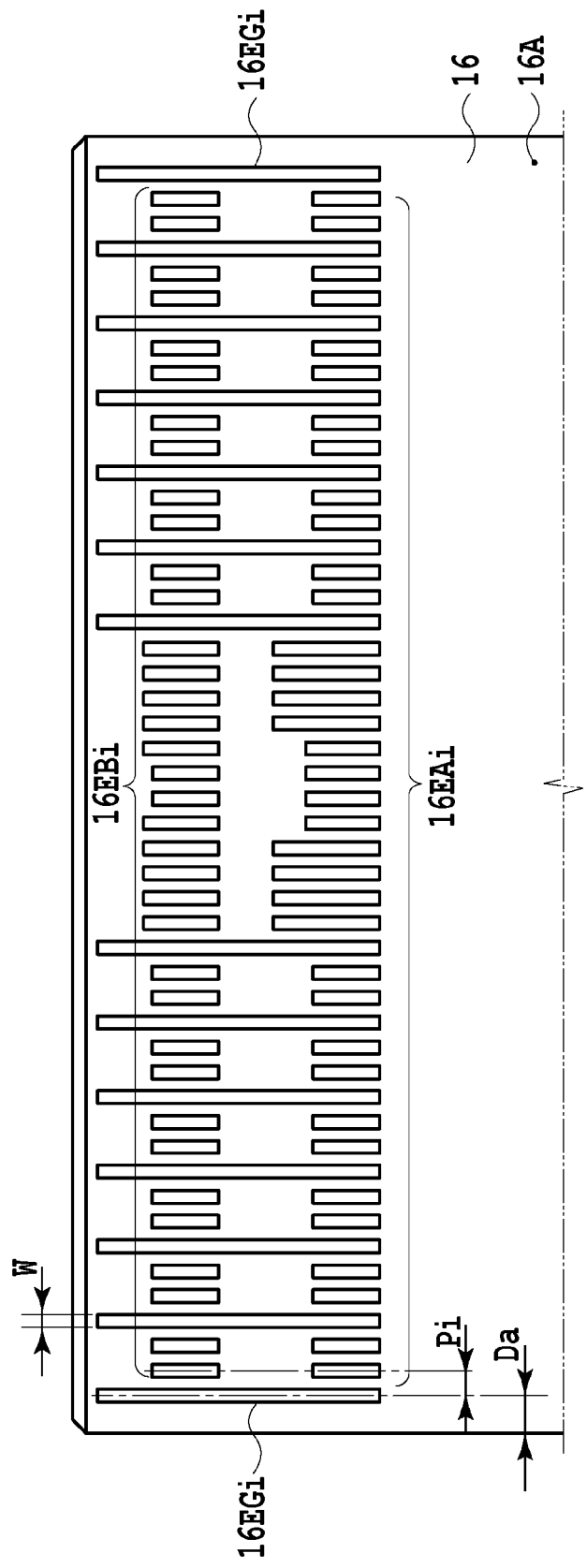
FIG. 1 is a plan view showing an enlarged partial group of contact pads of a module board used in a first embodiment of a transceiver module assembly according to the present invention.

As shown in the enlarged view of FIG. 1, the module board 16 has electrode portions serving as a connection end portion, which is located at one end portion protruding into the space between the pair of protection walls mentioned above. The one end portion has a short side of about 31.3 mm, for example. The electrode portions are formed on one surface 16A and another surface 16B of the end portion of the module board 16, respectively. Since these electrode portions have the same configuration, the electrode portion to be formed on the surface 16A will be hereinbelow described, and description of the electrode portion to be formed on the surface 16B will be omitted.

The electrode portion is formed, for example, from a group of contact pads which are arrayed substantially in parallel to a long side of the module board 16. The electrode portion is electrically connected to a conductive layer formed inside the module board 16. The conductive layer is electrically connected to an electronic component (not shown) mounted on the module board 16.

The group of contact pads comprise, for example, a line of ground line pads 16EGi (i=1 to 14) formed at predetermined intervals from one end to the other end, and two lines of signal line pads 16EAi and 16EBi (i=1 to 36) formed in spaces between the ground line pads 16EGi.

In FIG. 1, center positions of the leftmost and rightmost ground line pads 16EGi are set at a distance Da (about 0.925 mm) from corresponding side surfaces of the module board 16. Moreover, seven ground line pads 16EGi each having a predetermined width W are formed sequentially from each of the left end and the right end and at predetermined equal intervals such as about 1.8 mm. The respective ground line pads 16EGi are formed adjacent to the two lines of the signal line pads 16EAi and 16EBi to be described later, and extend along the long side of the module board 16. Hereby, as described later, the ground lines are prevented from being undesirably disconnected when the transceiver module 14 is attached to and detached from the transceiver module receptacle assembly 12.

Each of the signal line pads 16EAi at the left end and the right end is located adjacent to the corresponding ground line pad 16EGi at a predetermined center axis interval Pi, such as a center axis interval of about 0.6 mm. Each of the signal line pads 16EAi has the same width as the width W of the ground line pads 16EGi, and two signal line pads 16EAi are formed at an equal interval between every two adjacent ground line pads 16EGi. The length of each of the signal line pads 16EAi along the long side of the module board 16 is set smaller than the corresponding length of each of the grounding line pads 16EGi. Moreover, at a central part of the electrode portion, twelve signal line pads 16EAi are formed at predetermined equal intervals between the adjacent ground line pads 16EGi. The length of each of the twelve signal line pads 16EAi along the long side of the module board 16 is set larger than the corresponding length of the aforementioned two signal line pads 16EAi formed between the adjacent ground line pads 16EGi. At that time, the length of each of four signal line pads 16EAi located at a central part among the twelve signal line pads 16EAi, which is the length along the long side of the module board 16, is set smaller than the corresponding length of the rest of the signal line pads 16EAi.

The signal line pads 16EBi (i=1 to 36) are opposed to the signal line pads 16EAi at predetermined intervals, and are formed closer to the one end portion of the module board 16 than the signal line pads 16EAi are.

Each of the signal line pads 16EBi on the left end and the right end is located adjacent to the corresponding ground line pad 16EGi at the predetermined center axis interval Pi, such as the center axis interval of about 0.6 mm. Each of the signal line pads 16EBi has the same width as the width W of the ground line pads 16EGi, and two signal line pads 16EBi are formed at an equal interval between every two adjacent ground line pads 16EGi. The length of each of the signal line pads 16EBi along the long side of the module board 16 is set smaller than the corresponding length of each of the grounding line pads 16EGi. Moreover, at the central part of the electrode portion, twelve signal line pads 16EBi are formed at predetermined equal intervals between the adjacent ground line pads 16EGi. The length of each of the twelve signal line pads 16EBi along the long side of the module board 16 is set larger than the corresponding length of the aforementioned two signal line pads 16EBi formed between the adjacent ground line pads 16EGi. At that time, the length of each of two signal line pads 16EBi located substantially at a central part among the twelve signal line pads 16EBi, which is the length along the long side of the module board 16, is set equal to the corresponding length of the aforementioned two signal line pads 16EBi formed between the adjacent ground line pads 16EGi.

Accordingly, since the two lines of signal line pads 16EAi and 16EBi are formed on the module board 16, it is possible to achieve a higher speed, a higher density, and an increase in the number of channels in data transmission.

Pod connectors 16POD1 and 16POD2 are mounted on the surface 16B of the module board 16. The pod connectors 16POD1 and 16POD2 incorporate IC chips that have photoelectric conversion elements. Each of the pod connectors 16POD1 and 16POD2 is connected to an optical connector, which is provided in a port 20 to be described later. Thus, the module board 16 can be replaced easily.

As shown in FIG. 7, the lower case 14B as a lower member is fixed to the lower end of the upper case 14A in such a way as to cover the above-mentioned aperture at the lower end of the upper case 14A. The lower case 14B has a protrusion 14BE formed in such a way as to bridge lower ends of the pair of protection walls of the upper case 14A mentioned above. A step portion is formed at the protrusion 14BE.

Moreover, two corners at a lower end of the lower case 14B are provided with grooves 14Bg, respectively. When the transceiver module 14 is attached to and detached from the transceiver module receptacle assembly 12, the grooves 14Bg are engaged with guide portions 12BE, which are formed on peripheral edges of a module slot of the corresponding transceiver module receptacle assembly 12 to be described later.

The above-mentioned module board 16 has the group of contact pads as the connection end portion. However, the module board is not limited only to this example, for instance, the module board may have plug connectors as the connection end portion as described later.

An optical connector coupled to an end of an optical cable OPC is connected to the port 20 provided at the end portion of each of the transceiver modules 14 shown in FIG. 2. Another end of each optical cable is connected to an optical connector of another not-illustrated housing which constitutes a communication system. It should be noted that the port of the transceiver module is not limited only to this example, for instance, the port may be configured to be connected to a coaxial connector coupled to a coaxial cable. Moreover, although the single port 20 is provided therein, the port is not limited to this example and two ports may be provided in parallel to each other either vertically or horizontally.

A manipulation lever 18 is provided at a portion of the upper case 14A located above the port 20. The manipulation lever 18 provided with a hole 18a is linked to a lock/unlock mechanism provided on two side surface portions of each of the upper case 14A and the lower case 14B. Herewith, a locked state of the transceiver module 14 with respect to the transceiver module receptacle assembly 12 by means of the lock/unlock mechanism is changed to an unlocked state by pulling the manipulation lever 18 in a direction away from the support panel 10.

The transceiver module receptacle assembly 12 is supported by the support panel 10. The support panel 10 spreads out along an X coordinate axis and a Y coordinate axis in orthogonal coordinates in FIG. 2, while an end portion of a short side of the support panel 10 is bent at right angle along a Z coordinate axis in the orthogonal coordinates in FIG. 2. At a central part of the bent end portion of the support panel 10, rectangular apertures 10a are formed at two positions with a given interval along the Y coordinate axis. The transceiver modules 14 pass through the apertures 10a, respectively, along an attachment/detachment direction of the transceiver modules 14 indicated with an arrow in FIG. 2.

Figure 9:
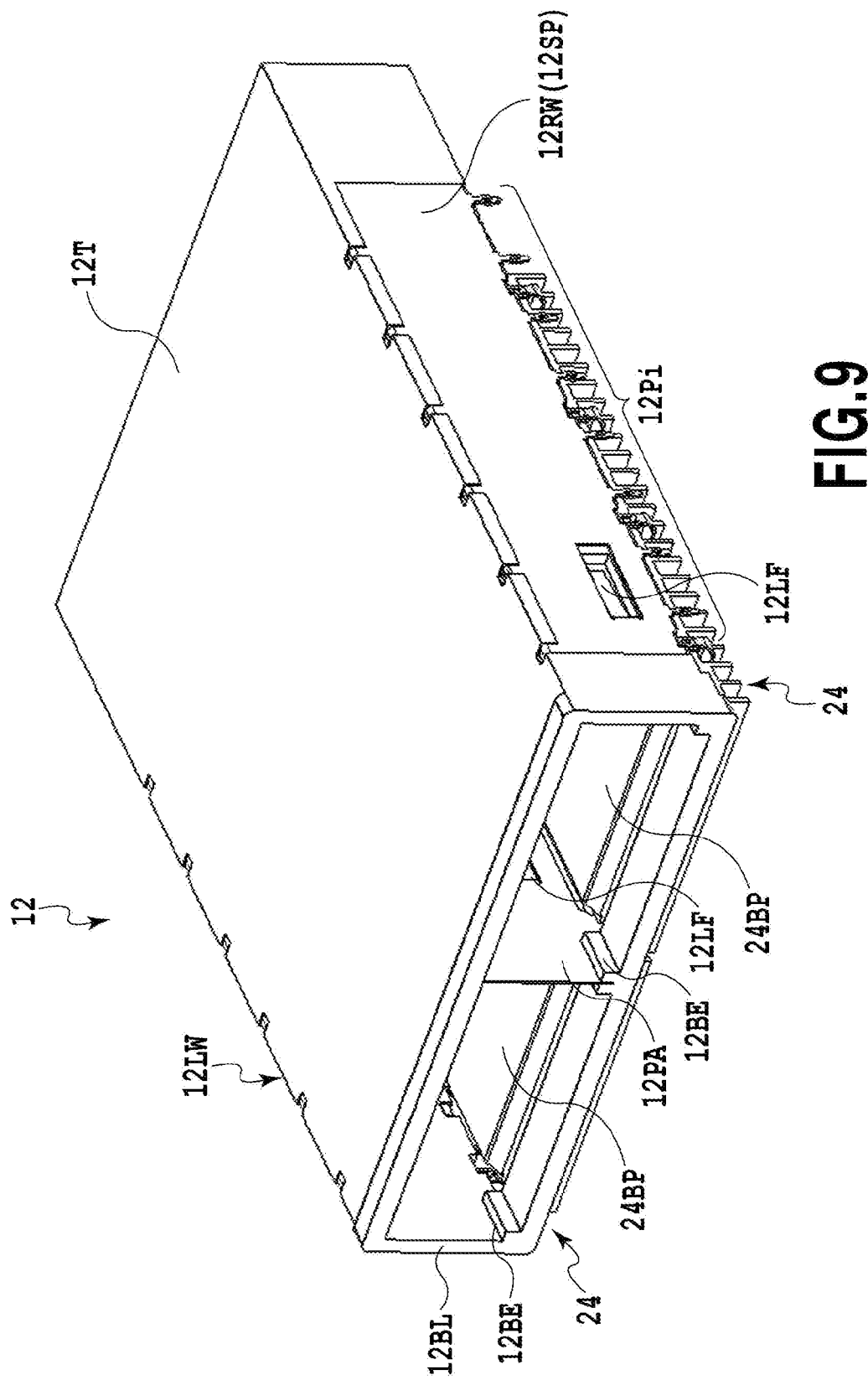
FIG. 9 is a perspective view showing a transceiver module receptacle assembly used in the first embodiment of the transceiver module assembly according to the present invention.
Figure 10:
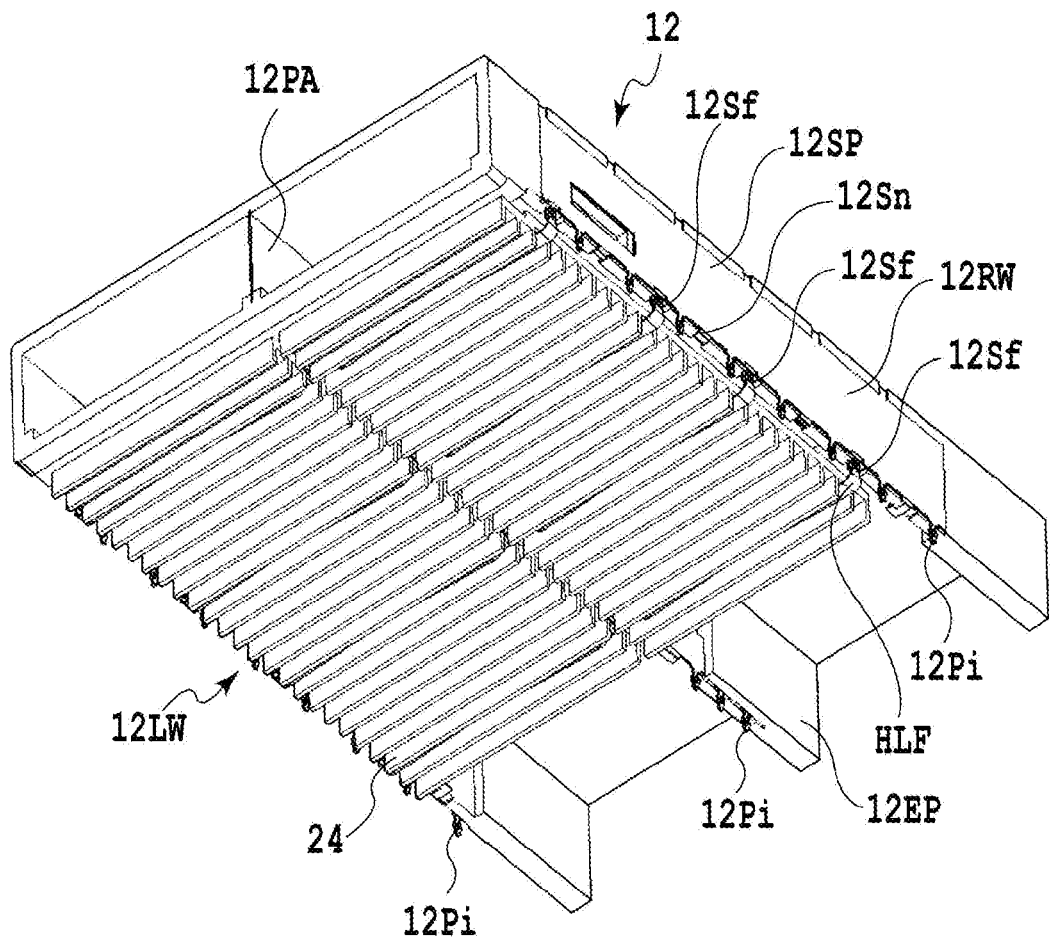
FIG. 10 is a perspective view showing the transceiver module receptacle assembly illustrated in FIG. 9, which is viewed from a heatsink side.

As shown in FIG. 9 and FIG. 10, the transceiver module receptacle assembly 12 comprises, as its main components: a bracket 12BL which guides the transceiver module 14 at the time of attachment and detachment of the transceiver module 14 as described above; two side wall portions 12RW and 12LW being connected to the bracket 12BL and constituting a contour; a top portion 12T connecting the two side wall portions 12RW and 12LW to each other; a partition plate 12PA which partitions an inner side of the bracket 12BL and each transceiver module accommodating portion communicated with the inner side of the bracket 12BL; two heats inks 24 which radiate heat generated from the transceiver modules 14; and two host connectors 22 each of which electrically connects the group of contact pads provided at the connection end portion of the attached transceiver module 14, to a conductive pattern on a printed wiring board PB1.

The bracket 12BL has two guide slots which are partitioned at a central part by the partition plate 12PA, and penetrate the bracket 12BL along the two side wall portions 12RW and 12LW. The guide portions 12BE to be engaged with the grooves 14Bg of the transceiver module 14 are formed in such a way as to protrude inward at two corners of a lower end portion of an inner peripheral portion of the bracket 12BL which defines each guide slot.

As shown in FIG. 10, the partition plate 12PA extends from the central part on the inside of the bracket 12BL to a partition wall portion 12EP so as to be substantially in parallel to the two side wall portions 12RW and 12LW. One end of the partition plate 12PA is supported by the inner peripheral portion of the bracket 12BL, while another end of the partition plate 12PA is supported by the partition wall portion 12EP. The partition wall portion 12EP is adapted to partition host connector accommodating portion to be communicated with the transceiver module accommodating portions, respectively. At portions of the partition plate 12PA in the vicinity of the guide slots of the bracket 12BL, two lock pieces 12LF are formed at positions corresponding to the lock/unlock mechanism of the attached transceiver module 14. A tip end portion of each lock piece 12LF protrudes obliquely toward the corresponding each transceiver module accommodating portion. Herewith, each lock piece 12LF is configured to selectively hold the transceiver module 14 in cooperation with the lock/unlock mechanism of the transceiver module 14 mentioned above. Moreover, the side wall portions 12RW and 12LW are also provided with the lock pieces 12LF that are opposed to the lock pieces 12LF on the partition plate 12PA.

A plurality of press-fit nibs 12Pi are formed at predetermined intervals on a lower end of each of: a portion of the partition plate 12PA supported by the partition wall portion 12EP; the side wall portion 12RW; and the side wall portion 12LW. Each of the press-fit nibs 12Pi is press-fitted into each of pores formed in a surface of the printed wiring board PB1 in conformity to arrays of the press-fit nibs 12Pi. Hereby, as shown in FIG. 2, a lower end surface of the transceiver module receptacle assembly 12 is closely attached and fixed to the surface of the printed wiring board PB1.

Figure 4:
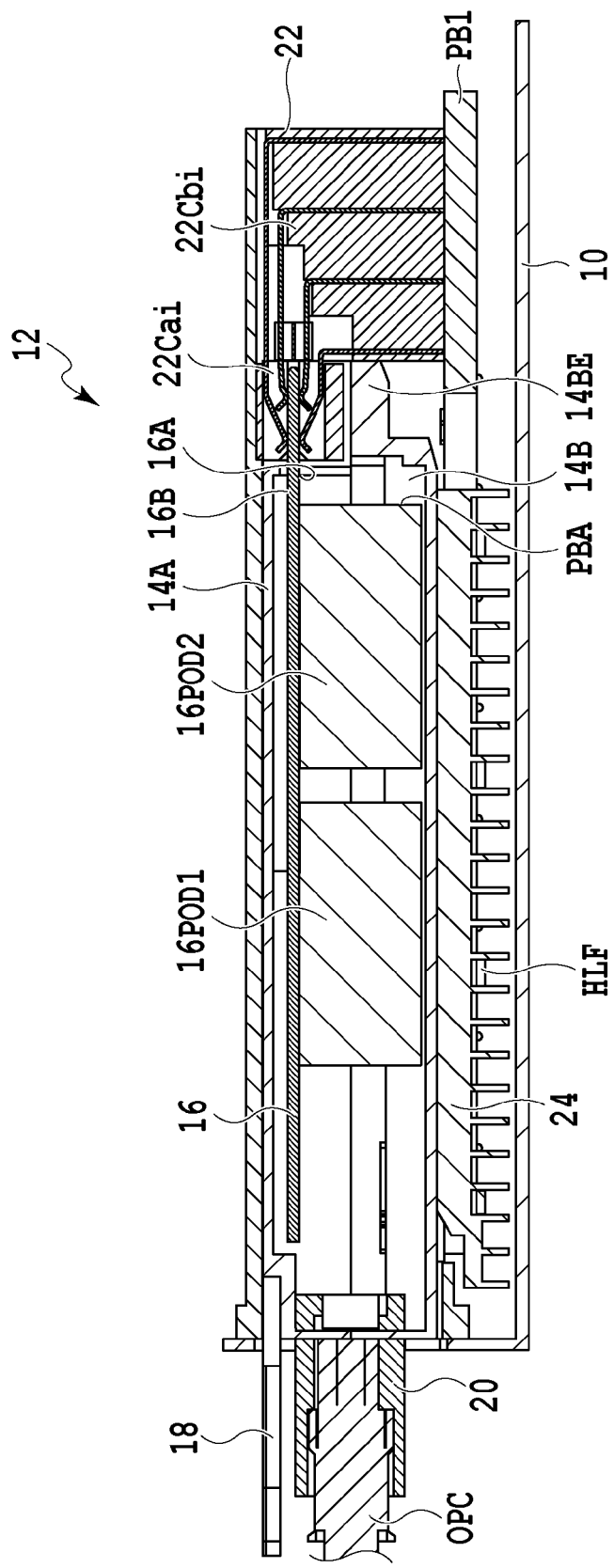
FIG. 4 is a cross-sectional view taken along IV-IV line in FIG. 3.

The two heatsinks 24 are located at a portion immediately below the top portion 12T in such away as to close respective apertures partitioned by the partition plate 12PA. As shown in FIG. 4, each heatsink 24 is supported on the lower ends of the partition plate 12PA and any of the side wall portions 12RW and 12LW by using four elastic clip pieces HLF. As shown in FIG. 10, both ends of each clip piece HLF are fixed with a fixing piece 12sf formed at a lower end of a plate 12SP that forms part of any of the side wall portions 12RW and 12LW. Hereby, each heatsink 24 is biased by an elastic force of the clip pieces HLF toward the inside of the corresponding each of the apertures partitioned by the partition plate 12PA.

Moreover, a plurality of positioning pieces 12sn, which are to be positioned with respect to grooves formed in a peripheral edge of an aperture of the printed wiring board PB1 to be described later, are formed in a line at predetermined intervals on the lower end of the plate 12SP.

As a consequence, a cage of the transceiver module receptacle assembly 12 is formed by the bracket 12BL, the two side wall portions 12RW and 12LW, the top portion 12T, and the partition plate 12PA.

Each heatsink 24 is formed into a thin sheetshape by using a metal having fine heat conductivity such as an aluminum alloy, for example. At a portion of the heatsink 24 inserted into the transceiver module accommodating portion, there is formed a contact portion 24BP (see FIG. 9), which comes into contact with a surface of the lower case 14B of the attached transceiver module 14 with a predetermined pressure attributed to the elastic force of the clip pieces HLF. Moreover, a group of fins are formed at a portion of the heatsink 24 to be inserted into an aperture PBA of the printed wiring board PB1 to be described later. The group of fins are comprised of a plurality of heat radiating fins each having a rectangular transverse section. Each of the heat radiating fins are arrayed in a longitudinal direction of the heatsink 24 at predetermined intervals, and are formed in parallel to one another. As shown in FIG. 4, the group of fins protrude from the aperture PBA of the printed wiring board PB1 toward a surface of the support panel 10 located below.

When the heatsinks 24 are assembled to the lower ends of the side wall portions 12RW and 12LW through the clip pieces HLF, because the groups of fins of the heatsinks 24 are disposed between a lower surface of the printed wiring board PB1 and the surface of the support panel 10 as shown in FIG. 4, a height from a mounting surface of the printed wiring board PB1 to the top portion 12T of the transceiver module receptacle assembly 12 is set relatively low. As a consequence, the low-profile transceiver module receptacle assembly 12 is substantially planned.

Figure 11:
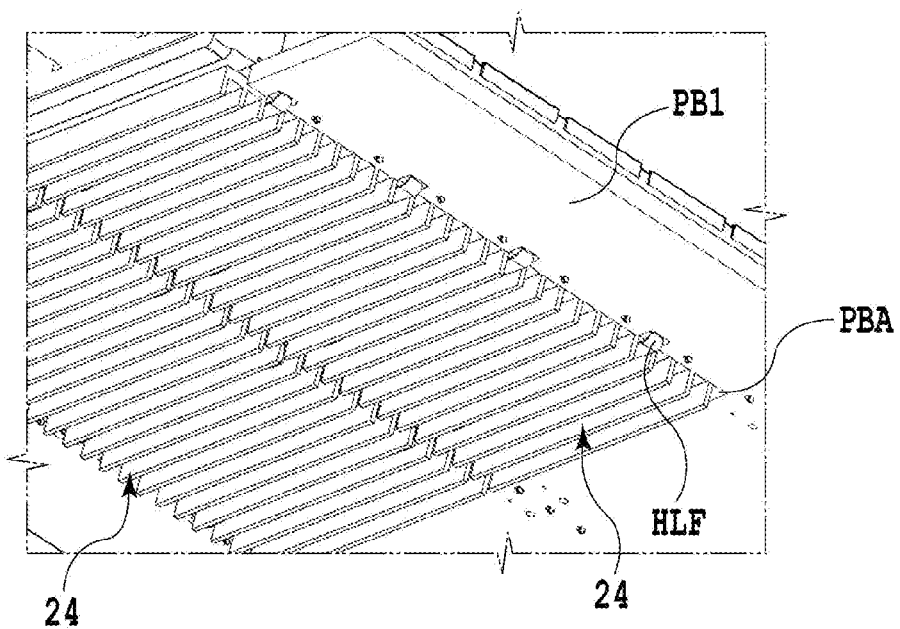
FIG. 11 is a partial enlarged view showing a partial enlarged portion shown in FIG. 10.

As shown in the enlarged view of FIG. 11, the printed wiring board PB1 has the aperture PBA located at a central part thereof. The aperture PBA is formed by being surrounded by long sides of the printed wiring board PB1, which are relatively long and opposed to each other, and by a connector placing portion PBHC (see FIG. 8) that is orthogonal to end portions of the long sides and designed to connect the end portions of the long sides. The host connectors 22 to be described later are disposed on the connector placing portion PBHC.

Figure 12:
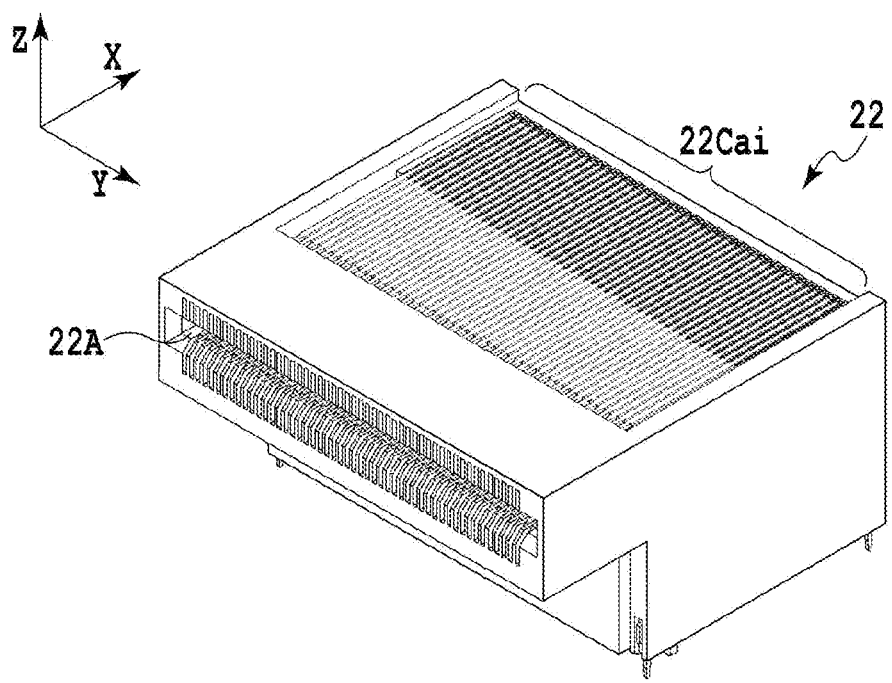
FIG. 12 is a perspective view showing a host connector used in the first embodiment of the transceiver module assembly according to the present invention.
Figure 13:
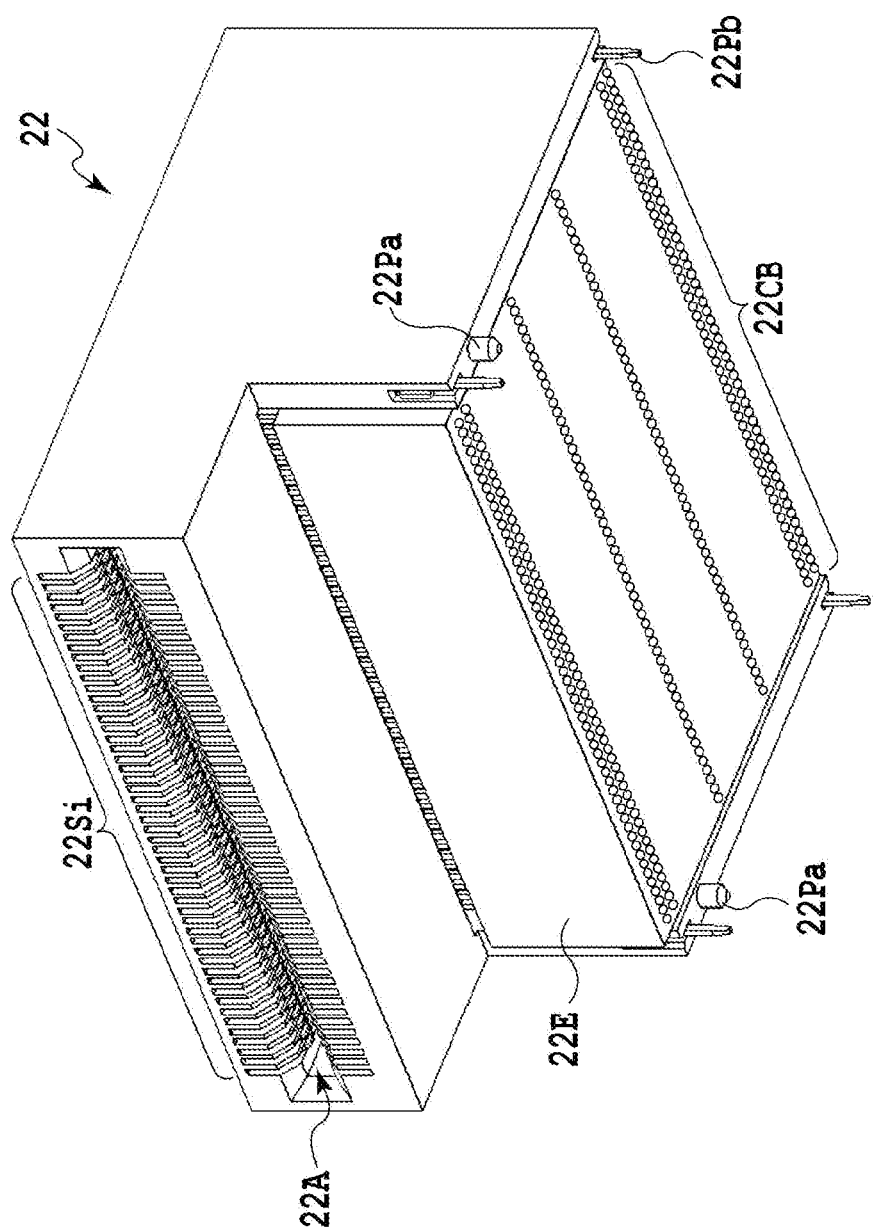
FIG. 13 is a perspective view showing the host connector illustrated in FIG. 12, which is viewed from a bottom side.

As shown in FIG. 12 and FIG. 13, each host connector 22 comprises a connector insulator provided with a slot 22A into which the connection end of the transceiver module 14 is detachably inserted, and a plurality of contact terminals 22Cai and 22Cbi (i=1 to n, n is a positive integer) (see FIG. 4). The respective contact terminals 22Cai and 22Cbi are configured to electrically connect the connection end of the transceiver module 14 to a group of electrodes (see FIG. 8) to be connected to the conductive pattern on the printed wiring board PB1.

Each of the contact terminals 22Cai and 22Cbi is made of a thin metal sheet material, and comprises: movable contact portions to be connected to the corresponding electrode portions of the module board 16 described above; solder ball terminals each connected to the corresponding one of the group of electrodes of the printed wiring board PB1; and connecting portions to connect the movable contact portions to the solder ball terminals. The contact terminals 22Cai are disposed in such a way as to surround the contact terminals 22Cbi located inside.

Figure 14:
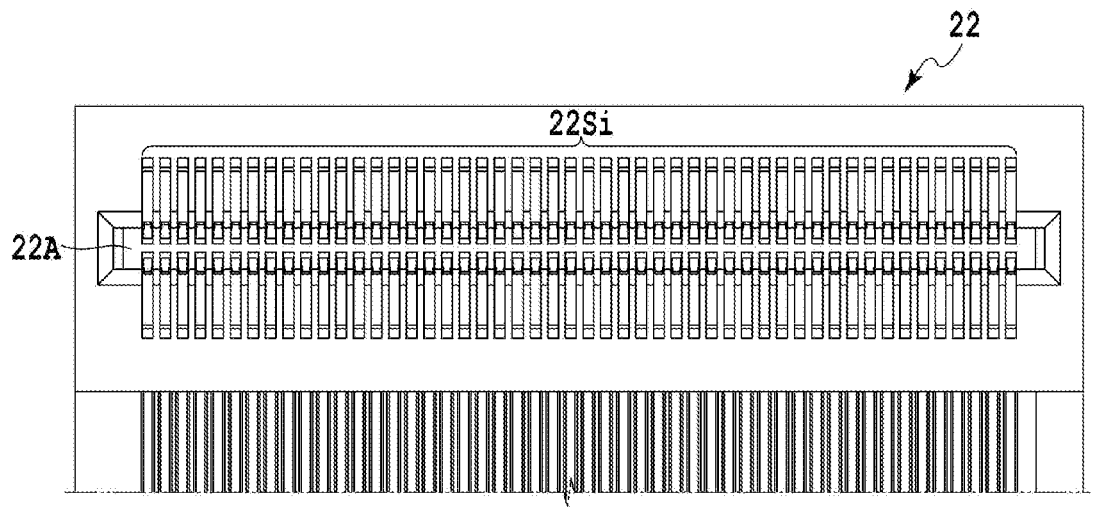
FIG. 14 is a front view partially showing the host connector illustrated in FIG. 12, which is viewed from a slot side.
Figure 15:
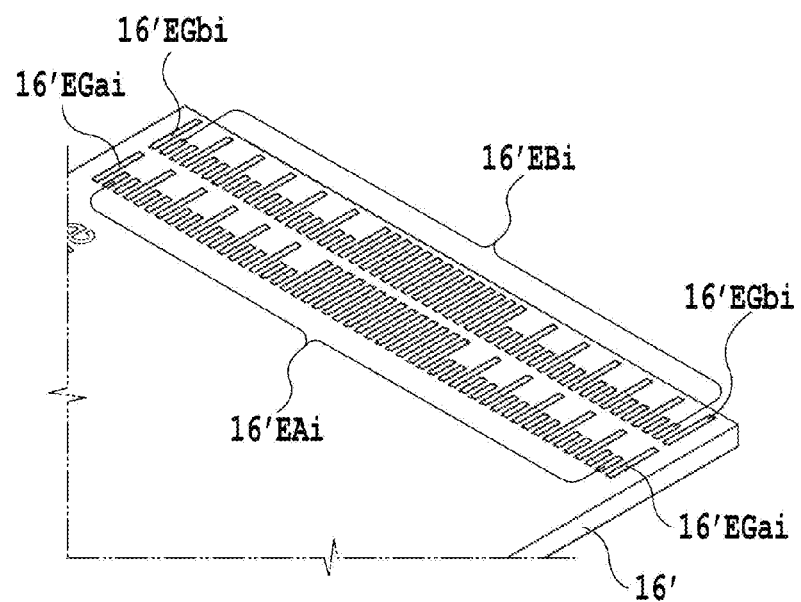
FIG. 15 is a plan view showing a partial enlarged group of contact pads of a module board in a modified example.

For example, a plurality of slits 22Si (i=1 to n, n is the positive integer) to be formed at predetermined intervals along a Y coordinate axis of orthogonal coordinates in FIG. 12, are formed in two lines along a Z coordinate axis on peripheral edges of the slot 22A of the connector insulator molded of a resin material. As shown in FIG. 14, each space between two adjacent slits 22Si is partitioned by a partition wall.

As shown in FIG. 4, one of the movable contact portions of the contact terminal 22Cai and one of the movable contact portions of the contact terminal 22Cbi are disposed inside each of the slits 22Si on an upper side. The one movable contact portion of the contact terminal 22Cai and the one movable contact portion of the contact terminal 22Cbi are connected to the electrode portion formed on the surface 16A of the module board 16 mentioned above. The one movable contact portion of the contact terminal 22Cai is connected to the corresponding signal line pad 16EAi and the corresponding ground line pad 16EGi in the electrode portion. Moreover, the one movable contact portion of the contact terminal 22Cbi is connected to the corresponding signal line pad 16EBi and the corresponding ground line pad 16EGi in the electrode portion.

As shown in FIG. 4, another of the movable contact portions of the contact terminal 22Cai and another of the movable contact portions of the contact terminal 22Cbi are disposed inside each of the slits 22Si on a lower side. The another movable contact portion of the contact terminal 22Cai and the another movable contact portion of the contact terminal 22Cbi are connected to the electrode portion formed on the surface 16B of the module board 16 mentioned above. The another movable contact portion of the contact terminal 22Cai is connected to the corresponding signal line pad 16EAi and the corresponding ground line pad 16EGi in the electrode portion. Moreover, the another movable contact portion of the contact terminal 22Cbi is connected to the corresponding signal line pad 16EBi and the corresponding ground line pad 16EGi in the electrode portion.

Figure 8:
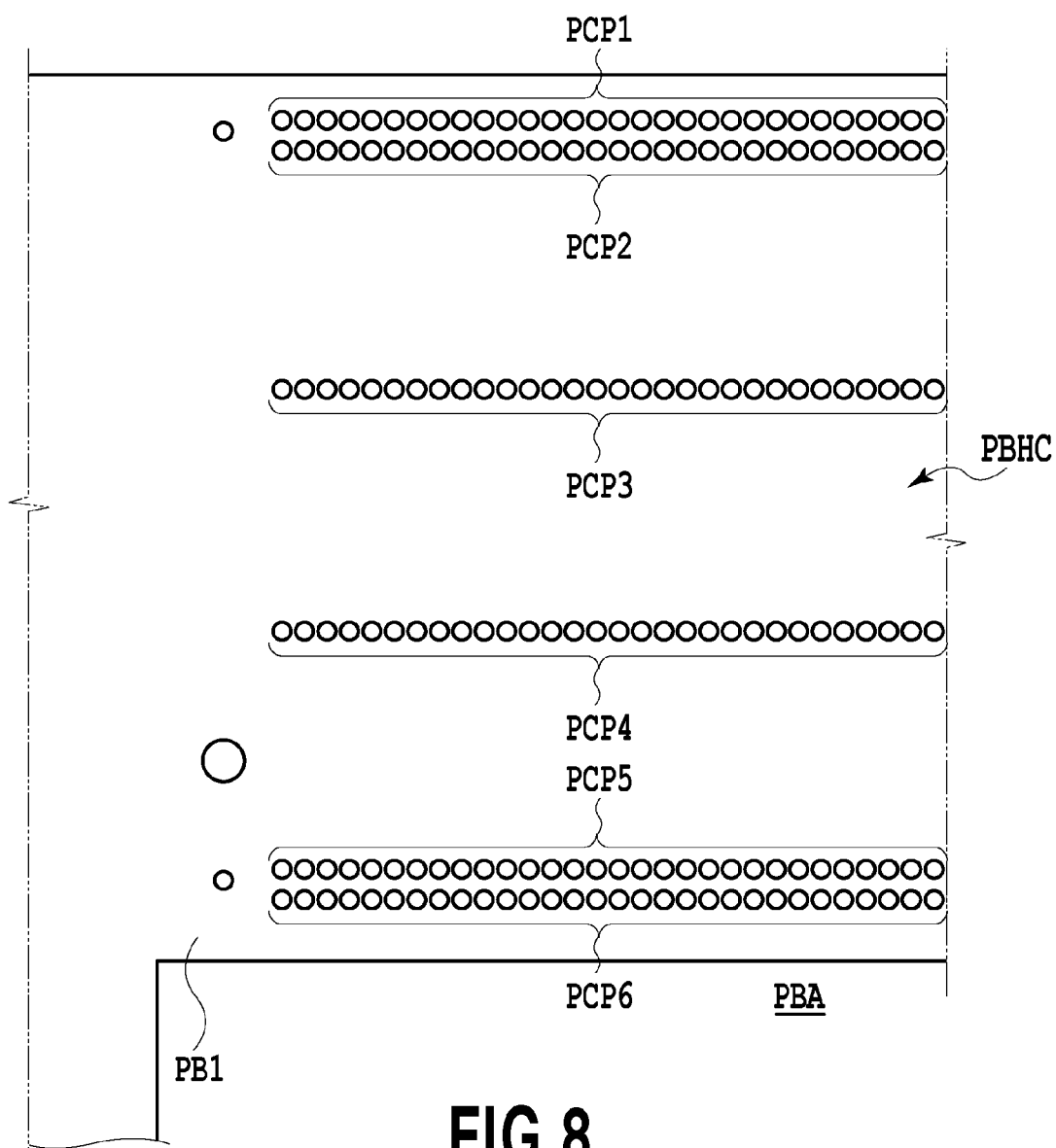
FIG. 8 is a partial enlarged view showing a partial enlarged group of electrodes formed at a connector placing portion of a printed wiring board.

As shown in FIG. 8, a group of electrodes are formed on the connector placing portion PBHC so as to correspond to the arrays of the solder ball terminals of the contact terminals 22Cai and 22Cbi. Note that FIG. 8 illustrates the groups of electrodes of one of the two host connectors 22. The group of electrodes are formed from a plurality of bumps each in a substantially semi-spherical shape, for example, and comprise: a line of electrodes PCP5 each of which corresponds to one of the solder ball terminals of the contact terminal 22Cai; a line of electrodes PCP2 each of which corresponds to the other one of the solder ball terminals of the contact terminal 22Cai; a line of electrodes PCP4 each of which corresponds to one of the solder ball terminals of the contact terminal 22Cbi; and a line of electrodes PCP3 each of which corresponds to the other one of the solder ball terminals of the contact terminal 22Cbi. Note that a group of electrodes PCP1 and a group of electrodes PCP6 in a line are provided as groups of electrodes for reinforcement in order to firmly fix the host connector 22 to the connector placing portion PBHC.

Moreover, a plurality of positioning holes into which positioning/reinforcing pins 22Pa and 22Pb of the connector insulator are to be fitted are formed at positions adjacent to the two lines of electrodes PCP1 and PCP2 and to the two lines of electrodes PCP5 and PCP6.

It should be noted that although in the above-mentioned example, the group of contact pads on the module board 16 comprise the line of ground line pads 16EGi (i=1 to 14) formed at the predetermined intervals from the one end to the other end, and the two lines of signal line pads 16EAi and 16EBi (i=1 to 36) formed between the ground line pads 16EGi, the group of contact pads on the module board is not limited only to this example. For instance, as shown in FIG.

15, a group of contact pads on a module board 16' may comprise two lines of ground line pads 16'EGai and 16'EGbi (i=1 to 14) formed at predetermined intervals from one end to another end, a line of signal line pads 16'EAi (i=1 to 36) formed between the ground line pads 16'EGai, and a line of signal line pads 16'EBi (i=1 to 36) formed between the ground line pads 16'EGbi.

In this example as well, since the two lines of signal line pads 16'EAi and 16'EBi are formed on the module board 16', it is possible to achieve a higher speed, a higher density, and an increase in the number of channels in data transmission.

Figure 16:
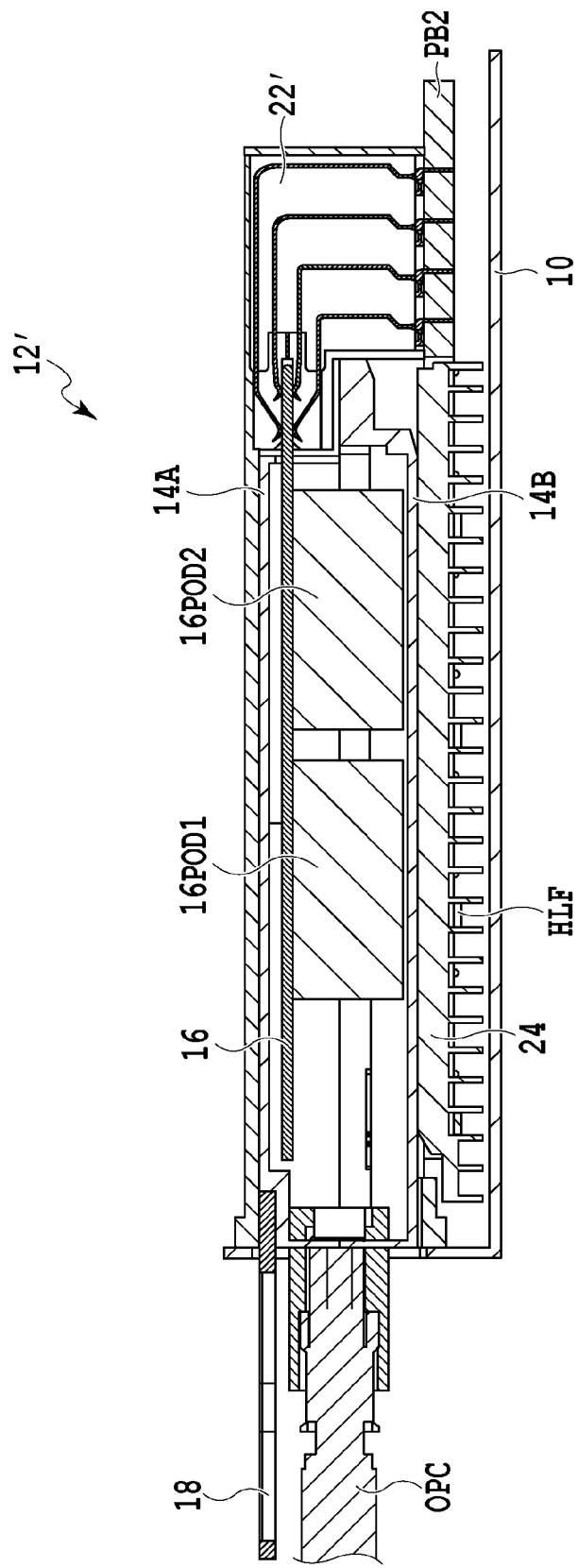
FIG. 16 is a cross-sectional view showing a configuration of a second embodiment of a transceiver module assembly according to the present invention.

FIG. 16 shows a configuration of a second embodiment of a transceiver module assembly according to the present invention.

In FIG. 16, the transceiver module assembly according to the present invention comprises the above-described transceiver module 14, and a transceiver module receptacle assembly 12'. Note that constituents in FIG. 16 which are the same as the constituents in the example shown in FIG. 2 will be denoted by the same reference numerals and overlapping description thereof will be omitted.

In the example shown in FIG. 2, the contact terminals 22Cai and 22Cbi of each host connector 22 provided to the transceiver module receptacle assembly 12 are electrically connected to the group of electrodes of the printed wiring board PB1 via the solder ball terminals. Instead, in the example shown in FIG. 16, contact terminals 22'Cai and 22'Cbi of each host connector 22' are electrically connected to a group of plated through-holes (see FIG. 18) of the printed wiring board PB1 via solder fixation terminals.

Figure 22:
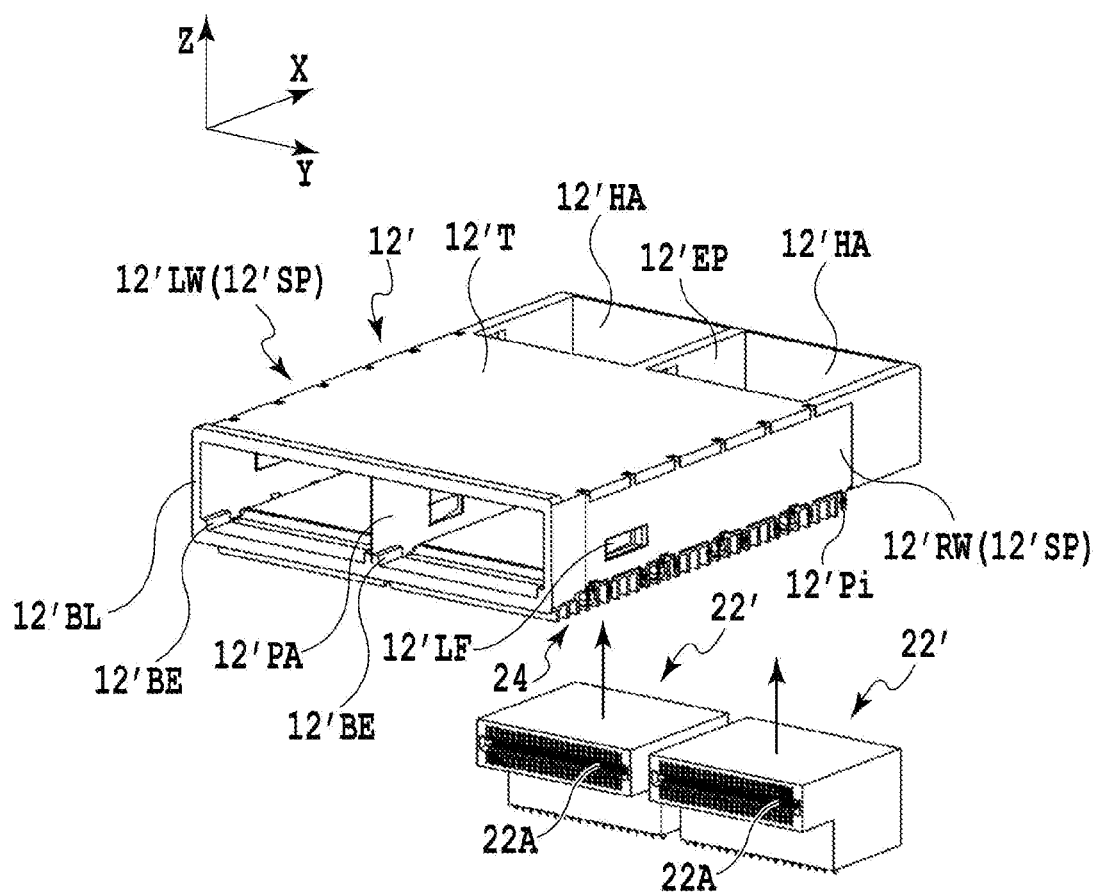
FIG. 22 is an exploded perspective view showing a transceiver module receptacle assembly used in the second embodiment of the transceiver module assembly according to the present invention.

As shown in FIG. 16, the transceiver module receptacle assembly 12' is supported by the support panel 10. As shown in FIG. 22, the transceiver module receptacle assembly 12' comprises, as its main components: a bracket 12'BL which guides the transceiver module 14 at the time of attachment and detachment of the transceiver module 14 as described above; two side wall portions 12'RW and 12'LW being connected to the bracket 12'BL and constituting a contour; a top portion 12'T connecting the two side wall portions 12'RW and 12'LW to each other; a partition plate 12'PA which partitions an inner side of the bracket 12'BL and transceiver module accommodating portions connected to the inner side of the bracket 12'BL; the two heatsinks 24 which radiate heat generated from the transceiver modules 14; and two host connectors 22' each of which electrically connects the group of contact pads being the connection end of the attached transceiver module 14, to a conductive pattern on a printed wiring board PB2.

The bracket 12'BL has two guide slots which are partitioned at a central part by the partition plate 12'PA, and penetrate the bracket 12'BL along the two side wall portions 12'RW and 12'LW. Guide portions 12'BE to be engaged with the grooves 14Bg of the transceiver module 14 are formed in such a way as to protrude inward at two corners of a lower end portion of an inner peripheral portion of the bracket 12'BL which defines each guide slot.

As shown in FIG. 22, the partition plate 12'PA extends from the central part on the inside of the bracket 12'BL to a partition wall portion 12'EP so as to be substantially in parallel to the two side wall portions 12'RW and 12'LW. One end of the partition plate 12'PA is supported by the inner peripheral portion of the bracket 12'BL, while another end of the partition plate 12'PA is supported by the partition wall portion 12'EP. The partition wall portion 12'EP is designed to partition host connector accommodating portion to be connected to the transceiver module accommodating portions, respectively. At portions of the partition plate 12'PA in the vicinity of the guide slots of the bracket 12'BL, two lock pieces 12'LF are formed at positions corresponding to the lock/unlock mechanism of the attached transceiver module 14. A tip end portion of each lock piece 12'LF protrudes obliquely toward the corresponding transceiver module accommodating portion. Thus, each lock piece 12'LF is configured to selectively hold the transceiver module 14 in conjunction with the lock/unlock mechanism of the transceiver module 14 mentioned above. Moreover, the side wall portions 12'RW and 12'LW are also provided with the lock pieces 12'LF that are opposed to the lock pieces 12'LF on the partition plate 12'PA.

Figure 26A:
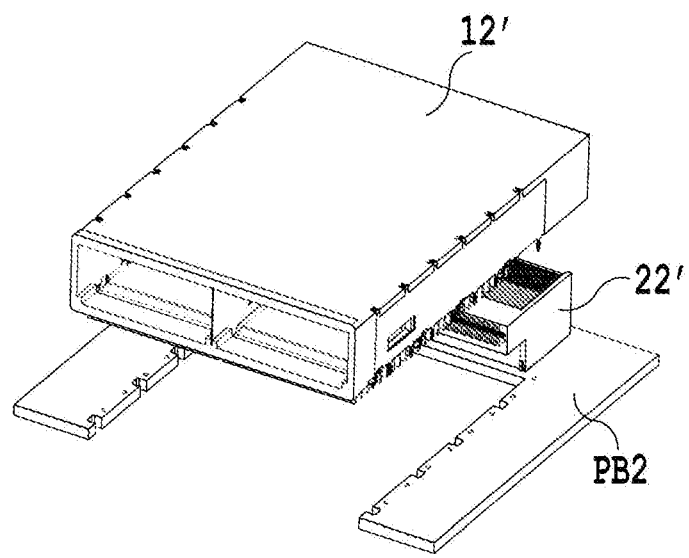
FIG. 26A is a perspective view made available for explaining the fabricating procedures of the second embodiment of the transceiver module assembly according to the present invention.
Figure 26B:
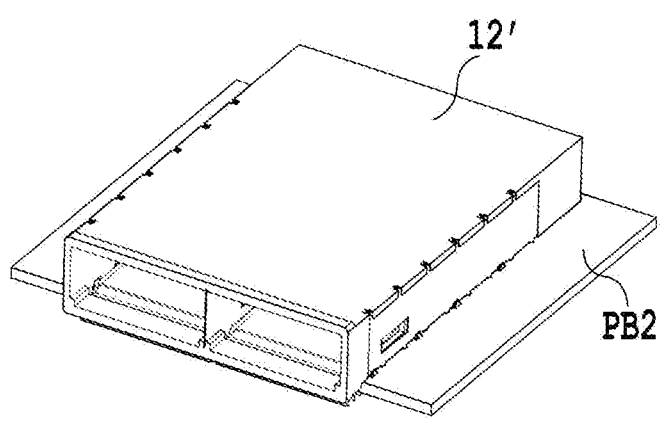
FIG. 26B is a perspective view made available for explaining the fabricating procedures of the second embodiment of the transceiver module assembly according to the present invention.

A plurality of press-fit nibs 12'Pi are formed at predetermined intervals on a lower end of each of: a portion of the partition plate 12'PA supported by the partition wall portion 12'EP; the side wall portion 12'RW; and the side wall portion 12'LF. Each of the press-fit nibs 12'Pi is press-fitted into each of pores formed in a surface of the printed wiring board PB2 in conformity to arrays of the press-fit nibs 12'Pi. Thus, as shown in FIG. 26B, a lower end surface of the transceiver module receptacle assembly 12' is closely attached and fixed to the surface of the printed wiring board PB2.

Figure 23:
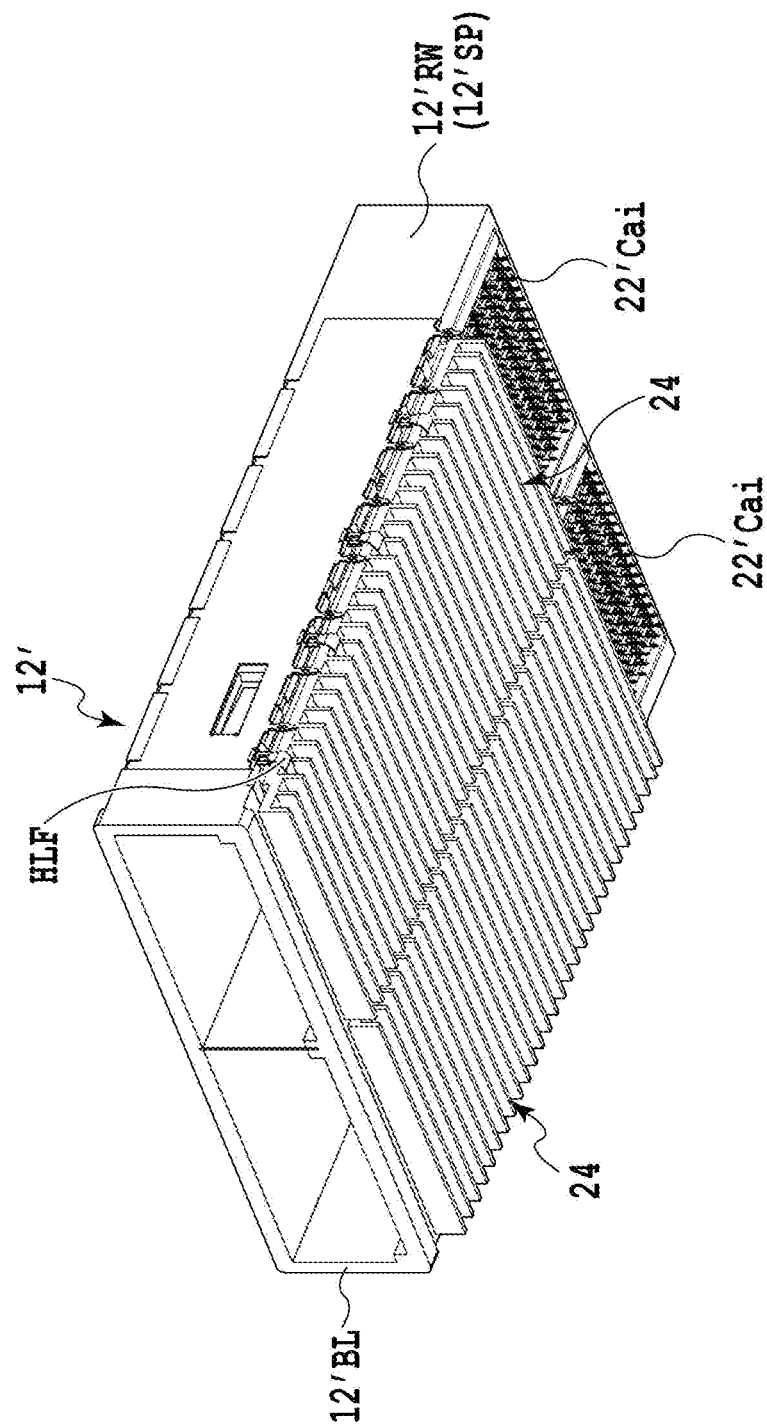
FIG. 23 is a perspective view showing the transceiver module receptacle assembly used in the second embodiment of the transceiver module assembly according to the present invention, which is viewed from a heatsink side.

The two heatsinks 24 are located at a portion immediately below the top portion 12'T in such a way as to close respective apertures partitioned by the partition plate 12'PA. As shown in FIG. 23, each heatsink 24 is supported on the lower ends of the partition plate 12'PA and any of the side wall portions 12'RW and 12'LW by using the four elastic clip pieces HLF.

Moreover, a plurality of positioning pieces, which are to be positioned with respect to grooves formed in a peripheral edge of an aperture PBA of the printed wiring board PB2 to be described later, are formed in a line at predetermined intervals on a lower end of a plate 12'SP.

As a consequence, a cage of the transceiver module receptacle assembly 12' is formed by the bracket 12'BL, the two side wall portions 12'RW and 12'LW, the top portion 12'T, and the partition plate 12'PA.

The printed wiring board PB2 is formed from a multilayer substrate as described later, and has the aperture PBA located at a central part thereof as shown in the enlarged view of FIG. 24A. The aperture PBA is formed by being surrounded by long sides of the printed wiring board PB2, which are relatively long and opposed to each other, and by the connector placing portion PBHC that is orthogonal to end portions of the long sides and designed to connect the end portions of the long sides.

The host connectors 22' to be described later are disposed on the connector placing portion PBHC located immediately below an aperture 12'HA of the top portion 12'T of the transceiver module receptacle assembly 12'.

Figure 21:
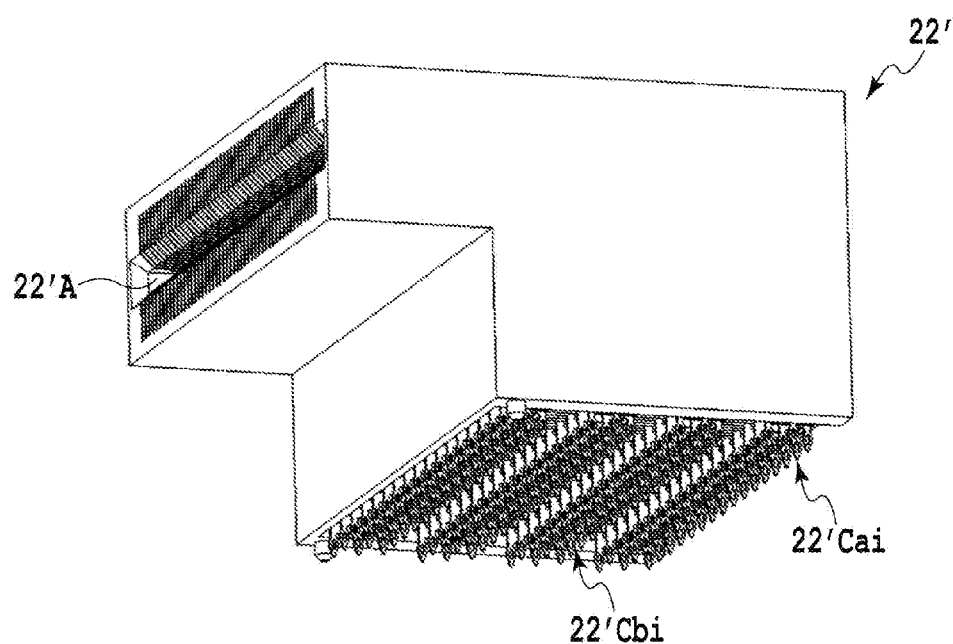
FIG. 21 is a perspective view showing a host connector used in the second embodiment of the transceiver module assembly according to the present invention.

As shown in FIG. 21, each host connector 22' comprises a connector insulator provided with a slot 22'A into which the connection end of the transceiver module 14 is detachably inserted, and a plurality of contact terminals 22'Cai and 22'Cbi (i=1 to n, n is a positive integer). The respective contact terminals 22'Cai and 22'Cbi are configured to electrically connect the connection end of the transceiver module 14 to a group of plated through-holes (see FIG. 18) to be connected to the conductive pattern on the printed wiring board PB2.

Figure 17:
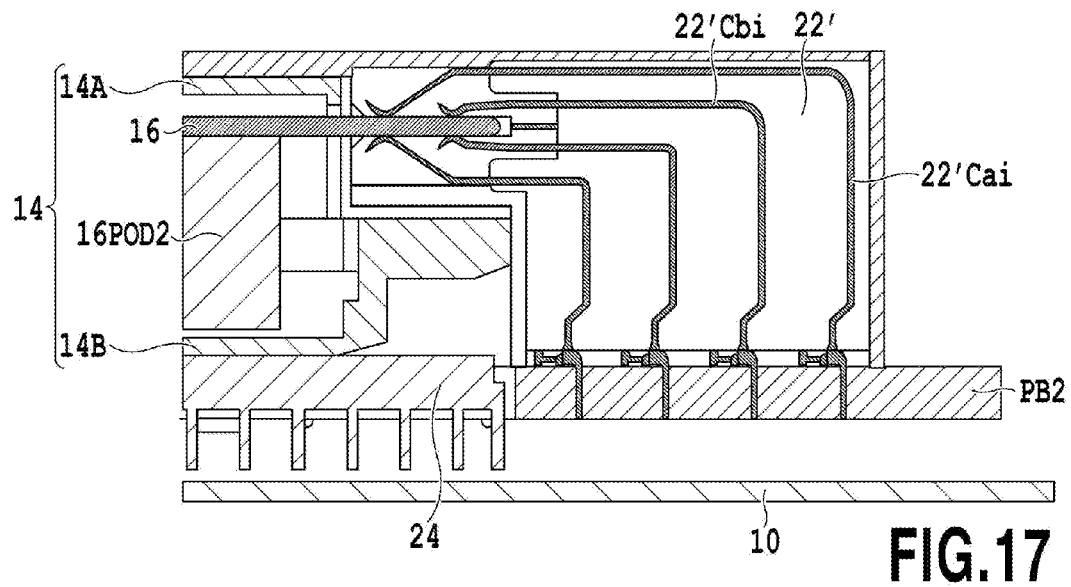
FIG. 17 is a partial enlarged cross-sectional view showing a part of the embodiment shown in FIG. 16.

Each of the contact terminals 22'Cai and 22'Cbi is made of a thin metal sheet material, and is comprised from: movable contact portions to be connected to the electrode portion of the module board 16 described above; solder fixation terminals each connected to the corresponding one of the group of plated through-holes of the printed wiring board PB2; and connecting portions to connect the movable contact portions to the solder fixation terminals. As shown in FIG. 17, the contact terminals 22'Cai are disposed in such a way as to surround the contact terminals 22'Cbi located inside.

For example, a plurality of slits to be formed at predetermined intervals along a Y coordinate axis of orthogonal coordinates in FIG. 22, are formed in two lines along a Z coordinate axis on peripheral edges of the slot 22'A of the connector insulator formed by using a resin material. Each space between two adjacent slits is partitioned by a partition wall.

As shown in FIG. 17, one of the movable contact portions of the contact terminal 22'Cai and one of the movable contact portions of the contact terminal 22'Cbi are disposed inside each of the slits on an upper side. The one movable contact portion of the contact terminal 22'Cai and the one movable contact portion of the contact terminal 22'Cbi are connected to the electrode portion formed on the surface 16A of the module board 16 mentioned above. The one movable contact portion of the contact terminal 22'Cai is connected to the corresponding signal line pad 16EAi and the corresponding ground line pad 16EGi in the electrode portion. Moreover, the one movable contact portion of the contact terminal 22'Cbi is connected to the corresponding signal line pad 16EBi and the corresponding ground line pad 16EGi in the electrode portion.

As shown in FIG. 17, another of the movable contact portions of the contact terminal 22'Cai and another of the movable contact portions of the contact terminal 22'Cbi are disposed inside each of the slits on a lower side. The another movable contact portion of the contact terminal 22'Cai and the another movable contact portion of the contact terminal 22'Cbi are connected to the electrode portion formed on the surface 16B of the module board 16 mentioned above. The another movable contact portion of the contact terminal 22'Cai is connected to the corresponding signal line pad 16EAi and the corresponding ground line pad 16EGi in the electrode portion. Moreover, the another movable contact portion of the contact terminal 22'Cbi is connected to the corresponding signal line pad 16EBi and the corresponding ground line pad 16EGi in the electrode portion.

Figure 18:
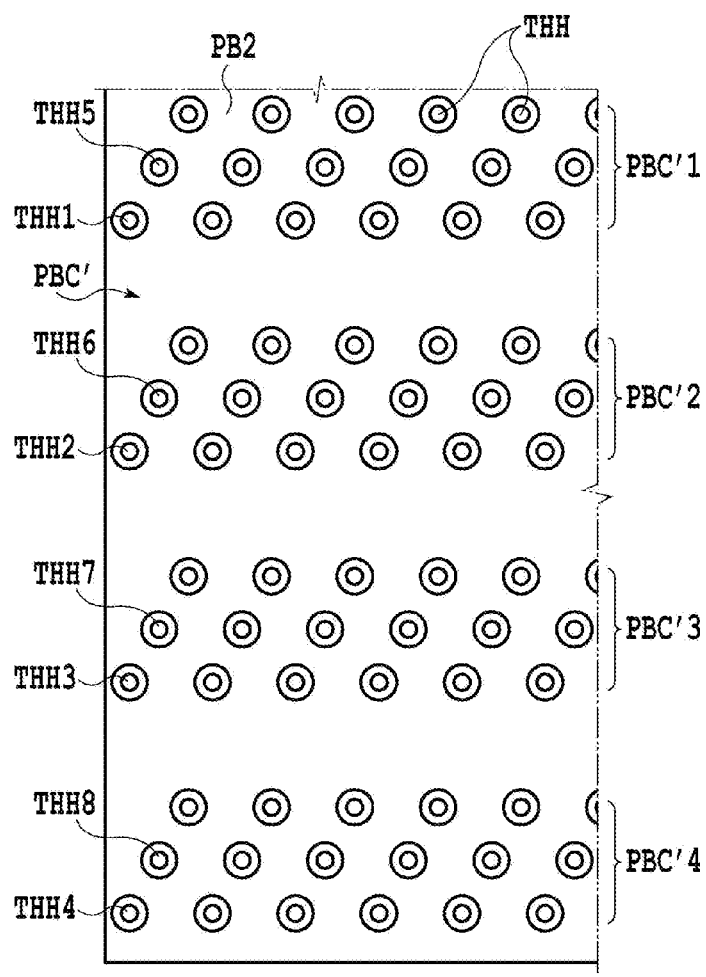
FIG. 18 is a plan view partially showing a group of plated-through holes in a printed wiring board.
Figure 24A:
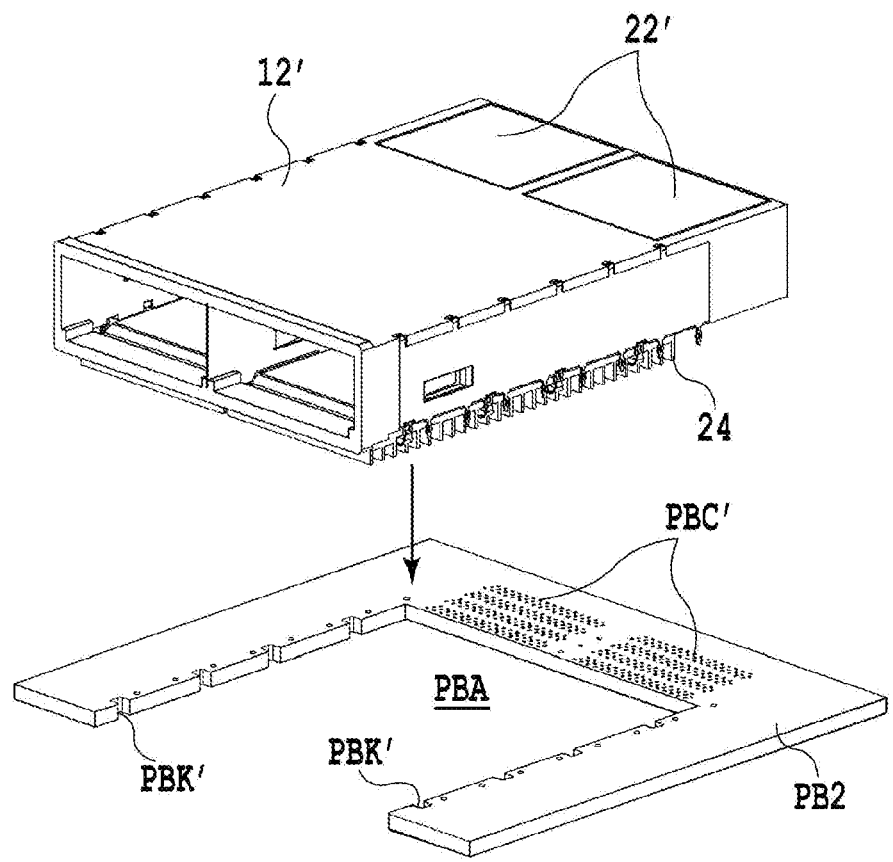
FIG. 24A is a perspective view of the transceiver module receptacle assembly used in the second embodiment of the transceiver module assembly according to the present invention, which shows a state of the transceiver module receptacle assembly detached from a printed wiring board.

As shown in FIG. 24A, a group of plated through-holes PBC' are formed on the connector placing portion PBHC of the printed wiring board PB2 so as to correspond to the arrays of the solder fixation terminals of the contact terminals 22'Cai and 22'Cbi of the respective host conductors 22'. Note that FIG. 18 illustrates the group of plated through-holes for one host connector 22' out of the two host connectors 22'.

The solder fixation terminals of the contact terminals 22'Cai are fixed to arrays of plated through-holes PBC'1 and PBC'4 in the group of plated through-holes PBC'. Moreover, the solder fixation terminals of the contact terminals 22'Cbi are fixed to the remaining arrays of plated through-holes PBC'2 and PBC'3. The arrays of plated through-holes PBC'1 to PBC'4 are formed at predetermined intervals. Moreover, the arrays of plated through-holes PBC'1 to PBC'4 have the same layout. Specifically, in FIG. 18, three lines of the plated through-holes are formed in parallel to one another. Moreover, the lines of the plated though-holes are formed in a staggered arrangement.

Figure 19:
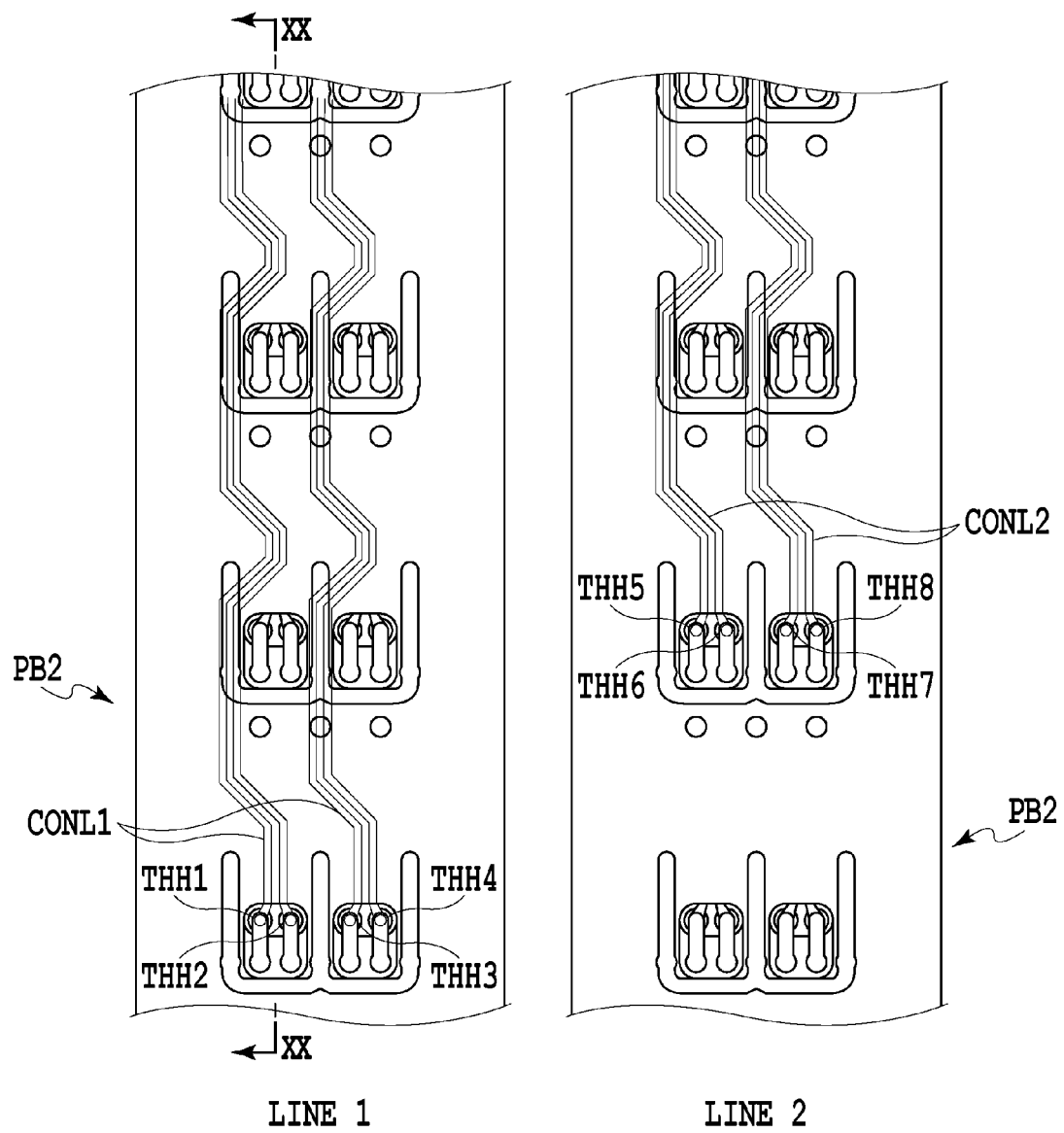
FIG. 19A is a partial cross-sectional view showing a conductive pattern on a partial cross section of a multilayer board constituting a printed wiring board.
FIG. 19B is a partial cross-sectional view showing a conductive pattern on a partial cross section of a multilayer board constituting a printed wiring board.
Figure 20:
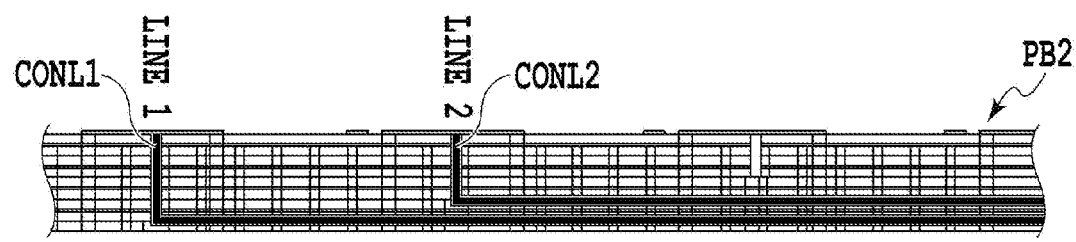
FIG. 20 is a cross-sectional view taken along XX-XX line in FIG. 19A.

For example, as shown in FIG. 19A and FIG. 20, plated through-holes THH1 and THH4 in the arrays of plated through-holes PBC'1 and PBC'4, and plated through-holes THH2 and THH3 in the arrays of plated through-holes PBC'2 and PBC'3, are connected to a conductive pattern CONL1 on a substrate constituting a certain layer in the printed wiring board PB2. Moreover, as shown in FIG. 19B and FIG. 20, plated through-holes THH5 and THH8 in the arrays of plated through-holes PBC'1 and PBC'4, and plated through-holes THH6 and THH7 in the arrays of plated through-holes PBC'2 and PBC'3, are connected to a conductive pattern CONL2 on a substrate constituting a different layer in the printed wiring board PB2, the different layer being a layer located above the aforementioned certain layer.

Figure 24B:
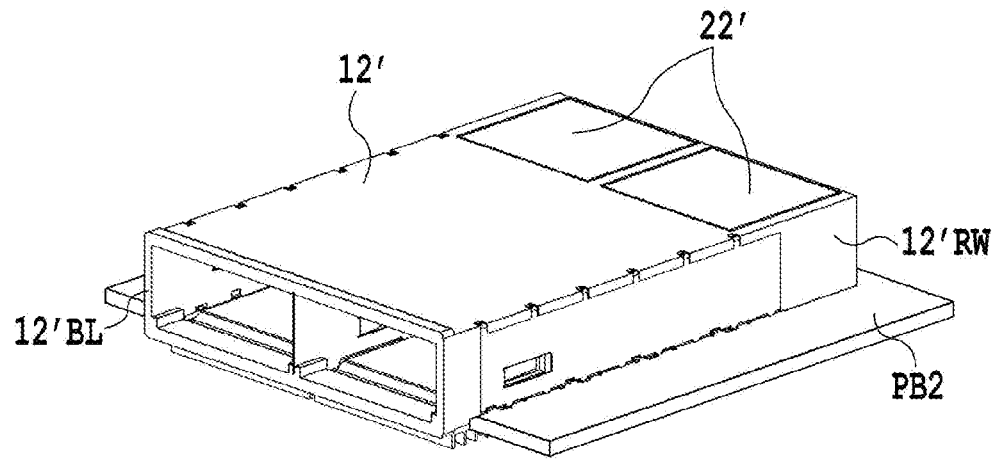
FIG. 24B is a perspective view of the transceiver module receptacle assembly used in the second embodiment of the transceiver module assembly according to the present invention, which shows a state of the transceiver module receptacle assembly fixed to the printed wiring board.
Figure 25A:
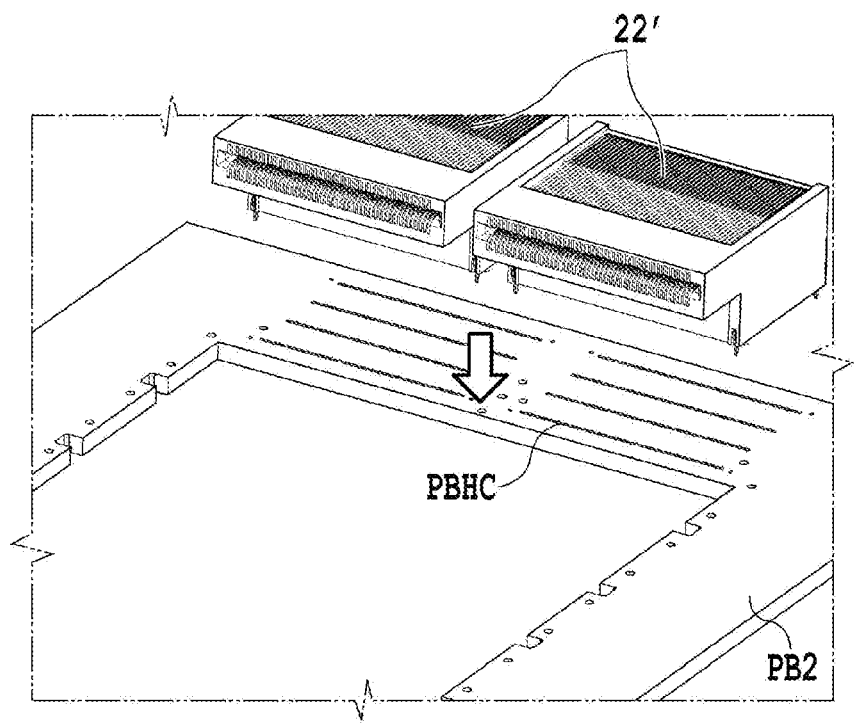
FIG. 25A is a perspective view made available for explaining fabricating procedures of the second embodiment of the transceiver module assembly according to the present invention.
Figure 25B:
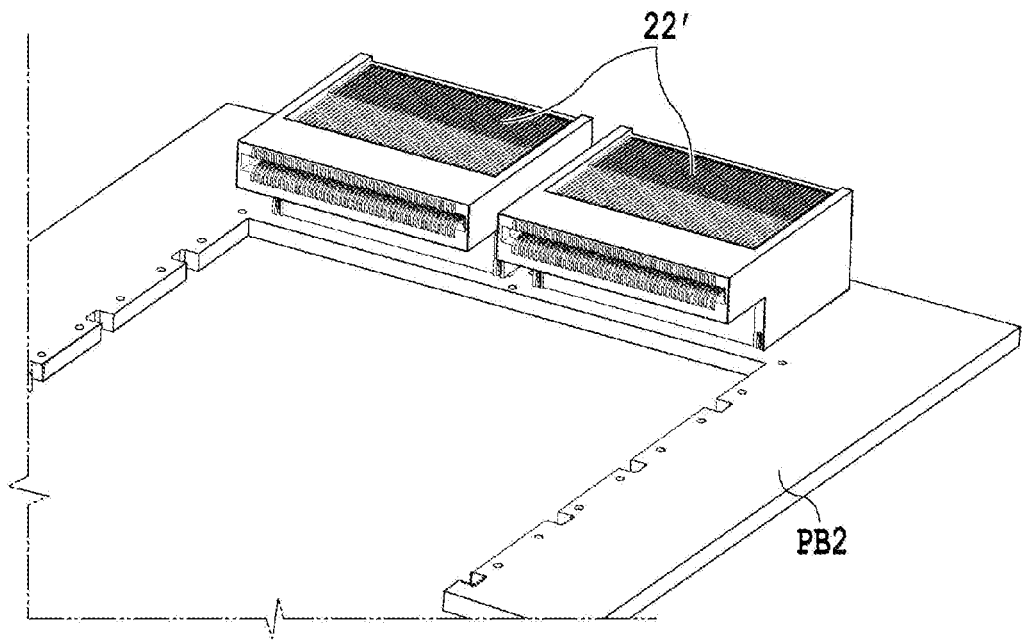
FIG. 25B is a perspective view made available for explaining the fabricating procedures of the second embodiment of the transceiver module assembly according to the present invention.

When the transceiver module receptacle assembly 12' is fabricated, the host connectors 22' are first fixed to the connector placing portion PBHC of the printed wiring board PB2 as shown in FIG. 25A and FIG. 25B. Next, as shown in FIG. 26A, the aperture 12'HA of the top portion 12'T of the transceiver module receptacle assembly 12', to which the heatsink 24 are attached, are positioned with respect to the host connectors 22'. Moreover, as shown in FIG. 24B and FIG. 26B, the positioning pieces are positioned with respect to grooves PBK', and the press-fit nibs 12'Pi are press-fitted into the pores formed in the surface of the printed wiring board PB2, respectively. Thus, the cage of the transceiver module receptacle assembly 12' is fixed to the printed wiring board PB2.

Figure 37:
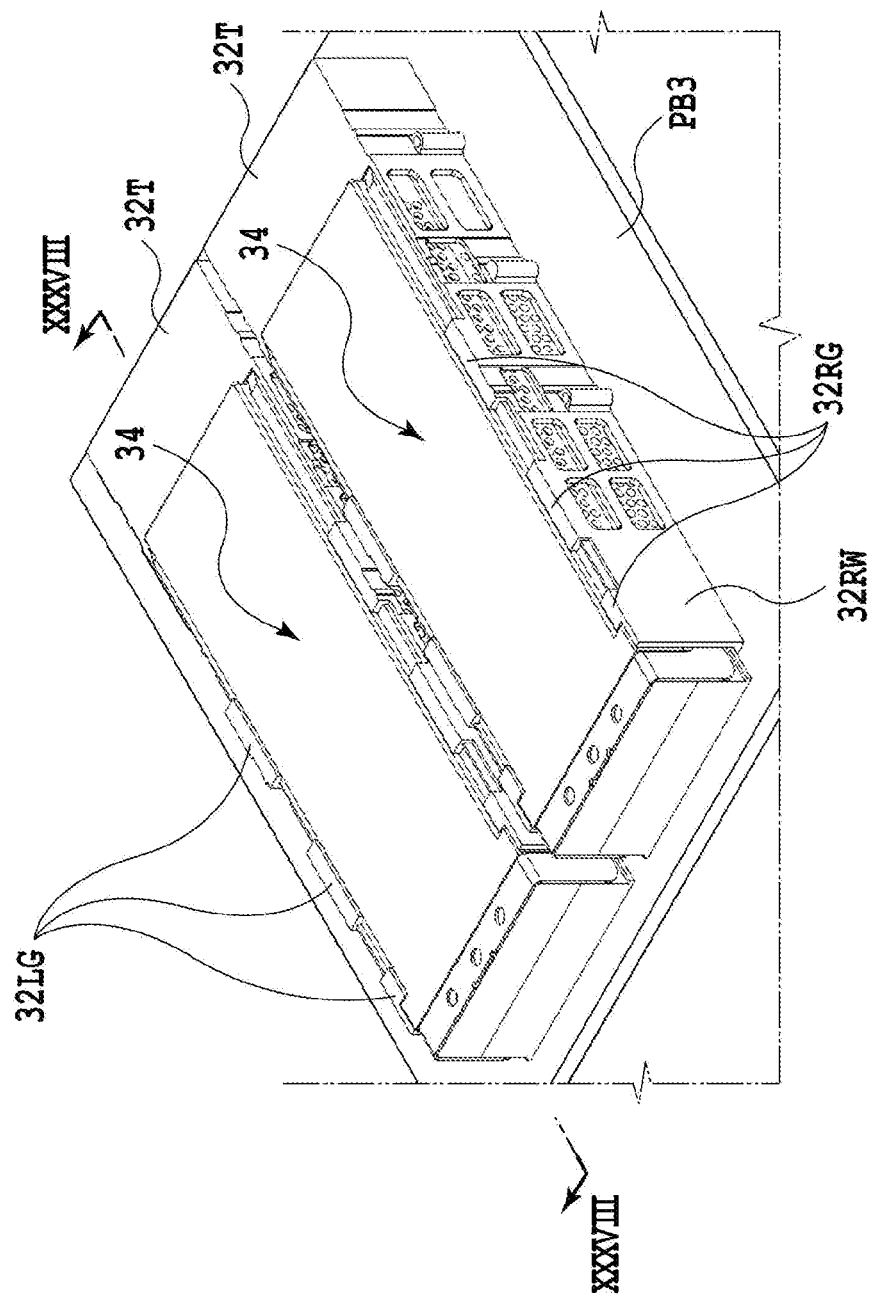
FIG. 37 is a perspective view of a transceiver module receptacle assembly used in a third embodiment of a transceiver module assembly according to the present invention, which shows a state where a transceiver module is attached to the transceiver module receptacle assembly.

FIG. 37 shows external appearance of a transceiver module assembly according to a third embodiment of the present invention.

In each of the above-described transceiver module assemblies according to the first embodiment and the second embodiment of the present invention, the module board 16 in the transceiver module has the electrode portions (see FIG. 1) as the connection end. Instead, in the example shown in FIG. 37, a module board 36 has two plug connectors 40 and 42 (see FIG. 35) as a connection end.

In FIG. 37, the transceiver module assembly according to the present invention comprises transceiver modules 34 to be described later, and transceiver module receptacle assemblies 32.

A plurality of transceiver module receptacle assemblies 32 are juxtaposed on a support panel inside predetermined electronic equipment. Note that FIG. 37 representatively illustrates two transceiver module receptacle assemblies 32 which are supported by the support panel and configured to house transceiver modules 34 individually. Each transceiver module receptacle assembly 32 is fixed to a predetermined position of a printed wiring board PB3 by using small screws (not shown) and nuts.

Figure 27:
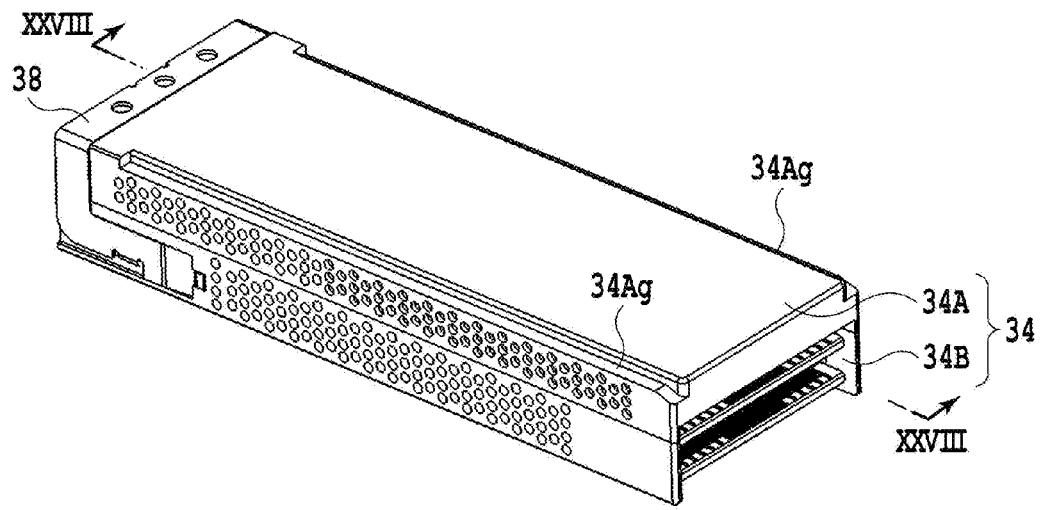
FIG. 27 is a perspective view showing an example of a transceiver module used in a third embodiment of a transceiver module assembly according to the present invention.
Figure 28:
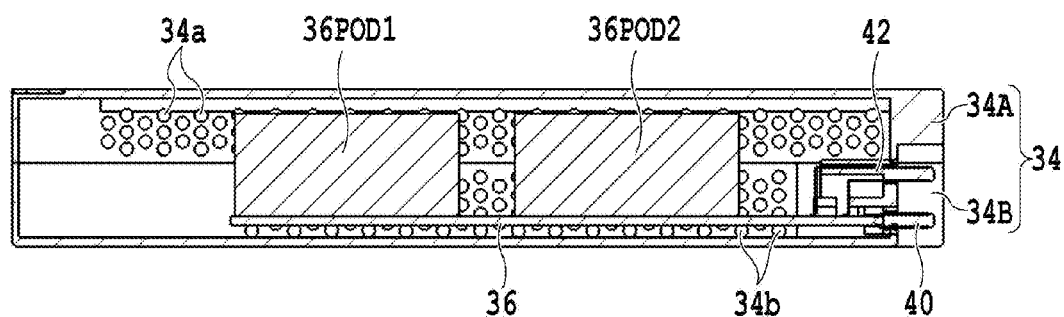
FIG. 28 is a cross-sectional view taken along XXVIII-XXVIII line in FIG. 27.

As shown in FIG. 27, each transceiver module 34 comprises, as its main components: an upper case 34A and a lower case 34B which are made of a metal and collectively constitute a contour; and the module board 36 of an on-board type (see FIG. 28) located at a predetermined position in a housing space defined between the upper case 34A and the lower case 34B.

The upper case 34A as an upper member has a lower end that is opened. At portions of a top portion of the upper case 34A to be connected to two side wall portions, grooves 34Ag are formed in a longitudinal direction. When the transceiver module 34 is attached to the corresponding transceiver module receptacle assembly 32, the grooves 34Ag are brought into engagement with guide members 32RG and 32LG of the transceiver module receptacle assembly 32 to be described later. Numerous pores 34a to establish communication between the inside and outside of the upper case 34A are formed in the two side wall portions, respectively.

Figure 29:
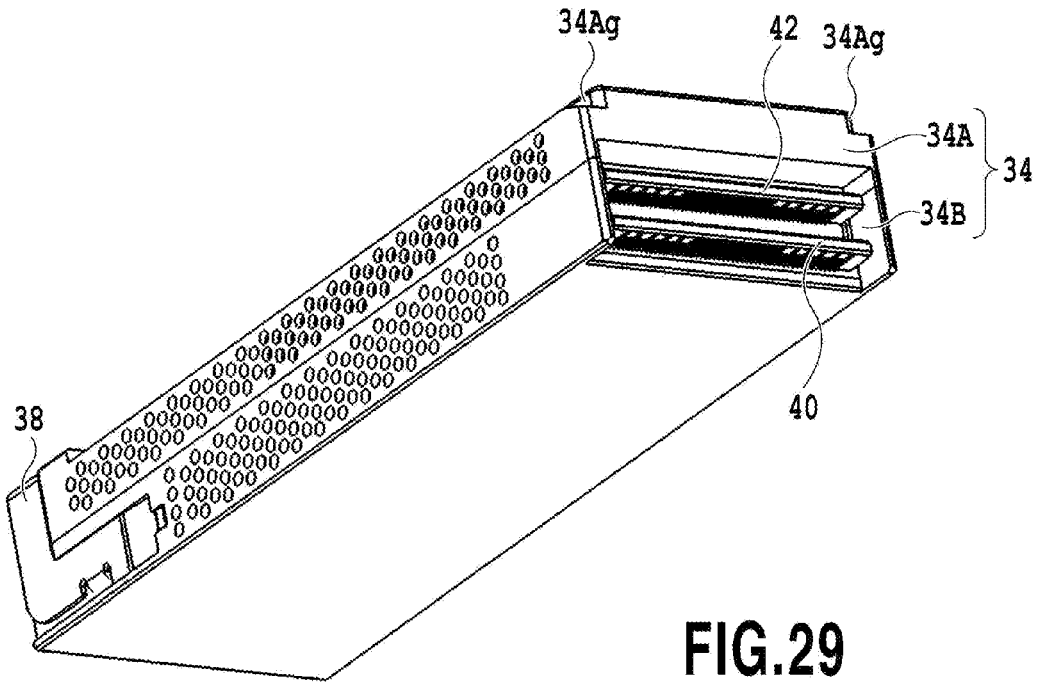
FIG. 29 is perspective view showing the example of the transceiver module used in the third embodiment of the transceiver module assembly according to the present invention.

At one end portion of the lower case 34B as a lower member, a pair of protection walls having a thin sheet shape and protruding in a longitudinal direction continuously with two side surfaces of the lower case are formed to be opposed to each other. As shown in FIG. 29, a space between the pair of protection walls is opened upward and downward. Numerous pores 34b to establish communication between the inside and outside of the lower case 34B are formed in two side wall portions, respectively.

Figure 30:
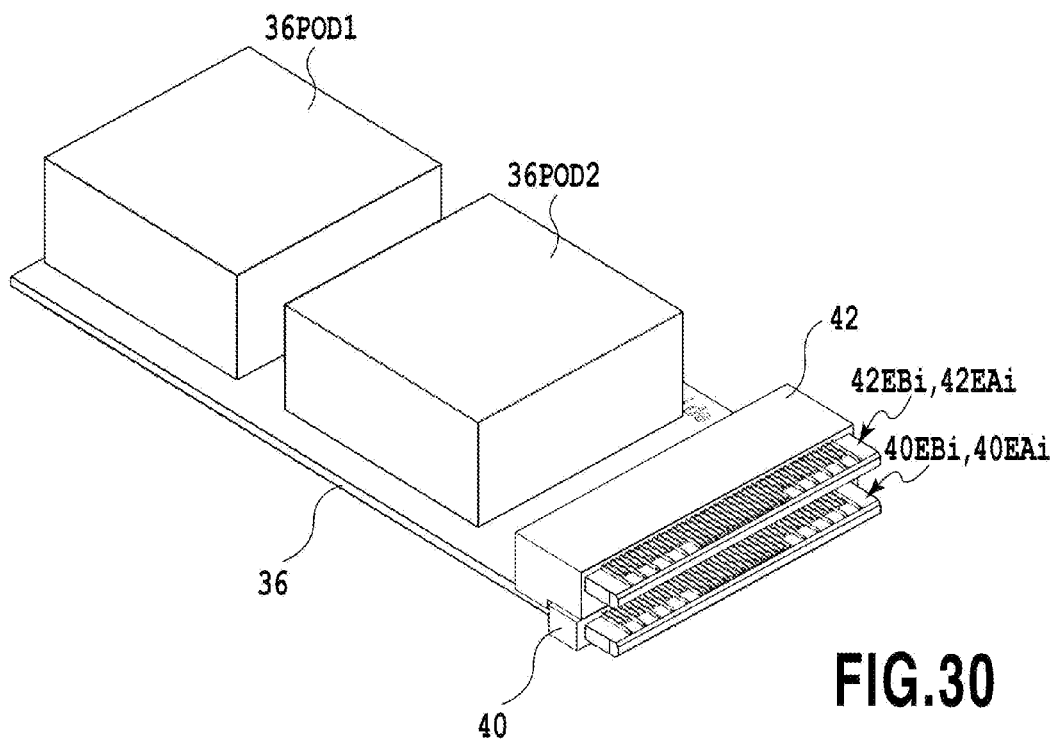
FIG. 30 is a perspective view showing a module board provided in the transceiver module illustrated in FIG. 28.

As shown in the enlarged view of FIG. 30, one end portion of the module board 36, which protrudes into the space between the pair of protection walls mentioned above, is inserted to an inner side of and connected to the plug connector 40 as the connection end. In the meantime, the plug connector 42 is stacked on an upper surface of the plug connector 40.

Figure 35:
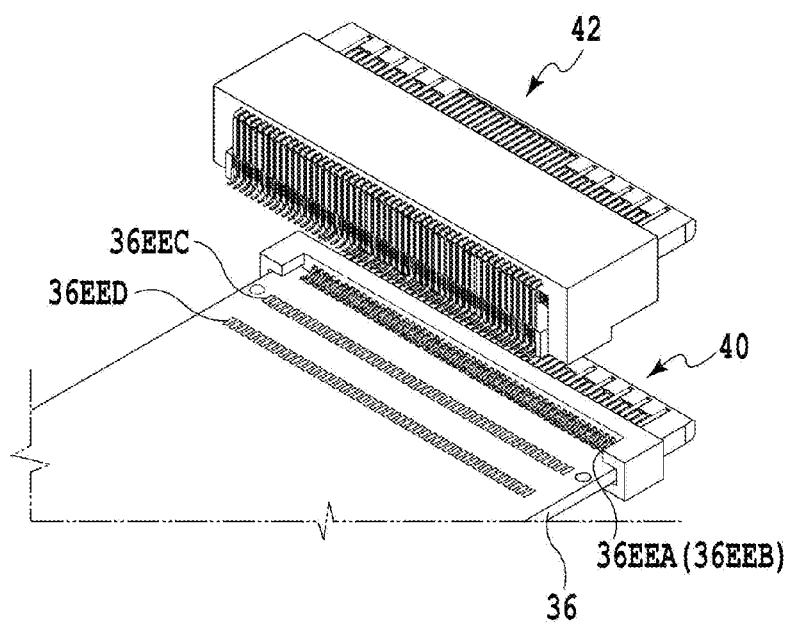
FIG. 35 is an exploded and enlarged perspective view showing the plug connector used in the module board illustrated in FIG. 30.

As shown in FIG. 35, an electrode portion 36EEA and an electrode portion 36EEB, which comprise a plurality of contact pads to be connected to a plurality of contact terminals 40EAi and 40EBi of the plug connector 40 to be described later, are formed opposite from one another on a top surface and a bottom surface at the one end portion of the module board 36. The contact pads are arrayed in a line at predetermined intervals in a direction substantially orthogonal to a direction of insertion of the module board 36 into the plug connector 40. Moreover, at positions away by predetermined distances from the electrode portion 36EEA, an electrode portion 36EEC and an electrode portion 36EED, which comprise a plurality of contact pads to be connected to a plurality of contact terminals 42EAi and 42EBi of the plug connector 42 to be described later, are formed in two lines with a predetermined interval in between. The contact pads that belong to each of these electrode portions are arrayed in a line at predetermined intervals in the direction substantially orthogonal to the direction of insertion of the module board 36 into the plug connector 40. The electrode portions are electrically connected to a conductive layer formed inside the module board 36, respectively. The conductive layer is electrically connected to an electronic component (not shown) to be mounted on the module board 36. As shown in FIG. 30, pod connectors 36POD1 and 36POD2 are mounted on amounting surface of the module board 36. The pod connectors 36POD1 and 36POD2 incorporate IC chips that have photoelectric conversion elements. Each of the pod connectors 36POD1 and 36POD2 is connected to an optical connector at a port (not shown). Thus, the module board 36 can be replaced easily.

Figure 31:
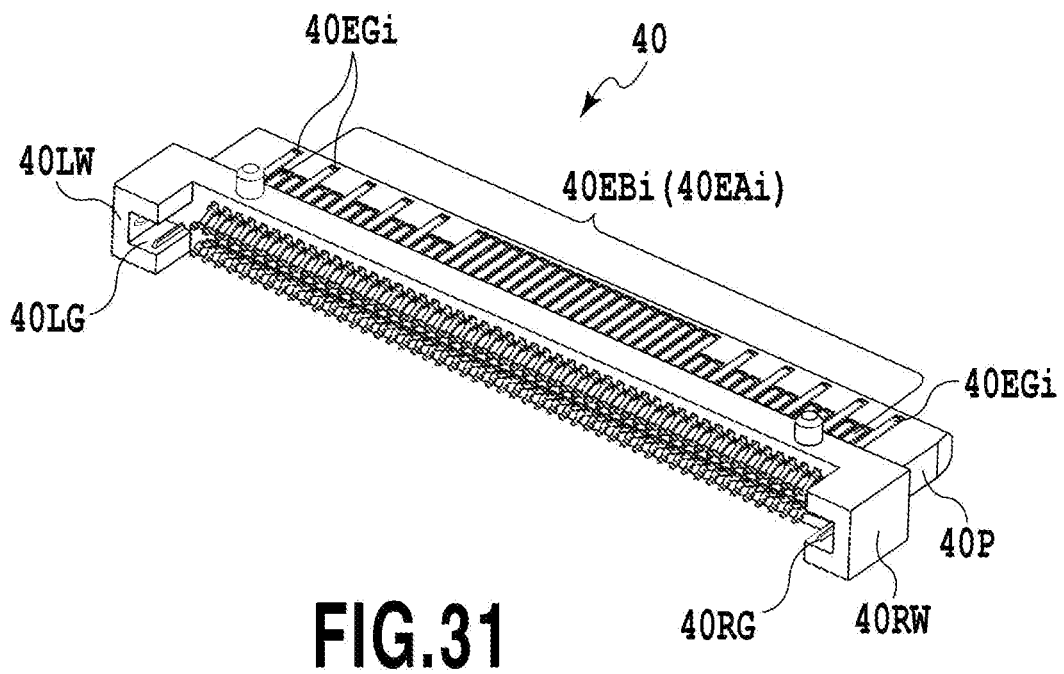
FIG. 31 is an enlarged perspective view showing a plug connector used in the module board illustrated in FIG. 30.

The plug connector 40 is integrally molded by using a resin material, for example. As shown in the enlarged view of FIG. 31, the plug connector 40 comprises a connection end 40P, a board support portion provided continuously with the connection end 40P and configured to support the one end portion of the module board 36, and a plurality of contact terminals 40EAi and 40EBi (i=1 to n, n is a positive integer) supported by the connection end 40P and the board support portion.

Figure 32:
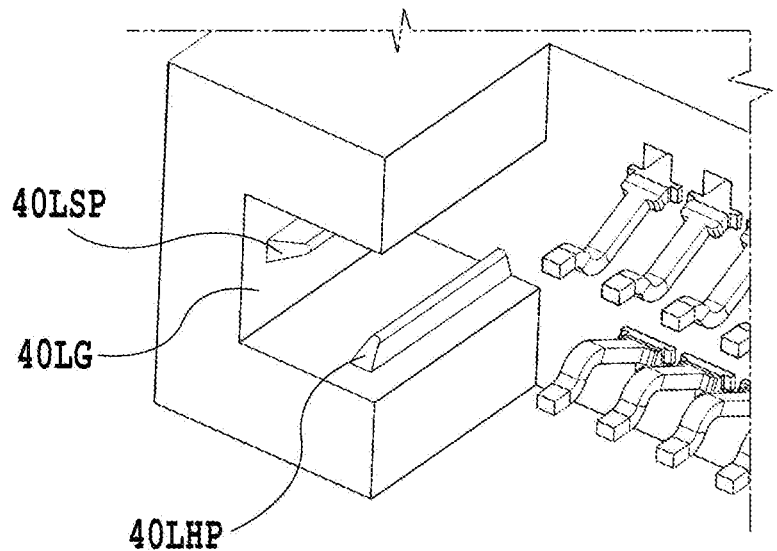
FIG. 32 is a perspective view showing a partial enlarged portion of the plug connector in FIG. 32.

The connection end 40P is inserted into a slot 53L of a host connector 53 to be described later through open end portions of the upper case 34A and the lower plate 34B. As shown in the enlarged view of FIG. 32, the connection end 40P has a recess located in an inner side thereof, into which the one end of the module board 36 mentioned above is inserted. Grooves 40RG and 40LG are formed on two side portions of the recess. On a closed end portion constituting part of the recess, a protrusion is formed at a substantially central position corresponding to a cutout portion (not shown) of the module board 36. The protrusion and the cutout portion serving as positioning tools are set in advance such that the contact terminals 40EAi and 40EBi correspond to prescribed contact pads. Moreover, as shown in FIG. 32, crush ribs 40LSP and 40LHP, which are designed to pinch and position an edge of the module board 36, are formed inside each of the grooves 40RG and 40LG that recede from the aforementioned protrusion toward side portions 40RW and 40LW, respectively. The crush ribs 40LSP and 40LHP are designed to position the one end portion of the module board 36 so as to keep the orientation of the module board 36 in parallel to an upper surface of the connection end 40P.

A pair of positioning pins to be inserted into positioning holes in the plug connector 42 to be described later are formed away from each other on an upper surface of the board support portion of the plug connector 40.

The contact terminals 40EBi are disposed on the upper surface of the connection end 40P opposed to the pair of positioning pins on the board support portion, and at predetermined intervals that correspond to the contact pads on the module board 36 mentioned above. The contact terminals 40EBi comprise power supply terminals, signal contact terminals, and ground contact terminals 40EGi, for example. A pair of adjacent signal contact terminals, for instance, are disposed between the ground contact terminals 40EGi. Each contact terminal 40EBi has a fixation terminal portion to be solder-fixed to a contact pad constituting the electrode portion 36EEA, and a contact portion to be brought into contact with a contact portion of a contact terminal of the host connector 53.

The contact terminals 40EAi are disposed on a lower surface of the connection end 40P opposed to spring portions (not shown) of the board support portion, and at the predetermined intervals that correspond to the contact pads on the module board 36 mentioned above. The contact terminals 40EAi comprise power supply terminals, signal contact terminals, and ground contact terminals, for example. A pair of adjacent signal contact terminals, for instance, are disposed between the ground contact terminals. Each contact terminal 40EAi comprises a fixation terminal portion to be solder-fixed to a contact pad, and a contact portion to be brought into contact with a contact portion of a contact terminal of the host connector 53.

Figure 33:
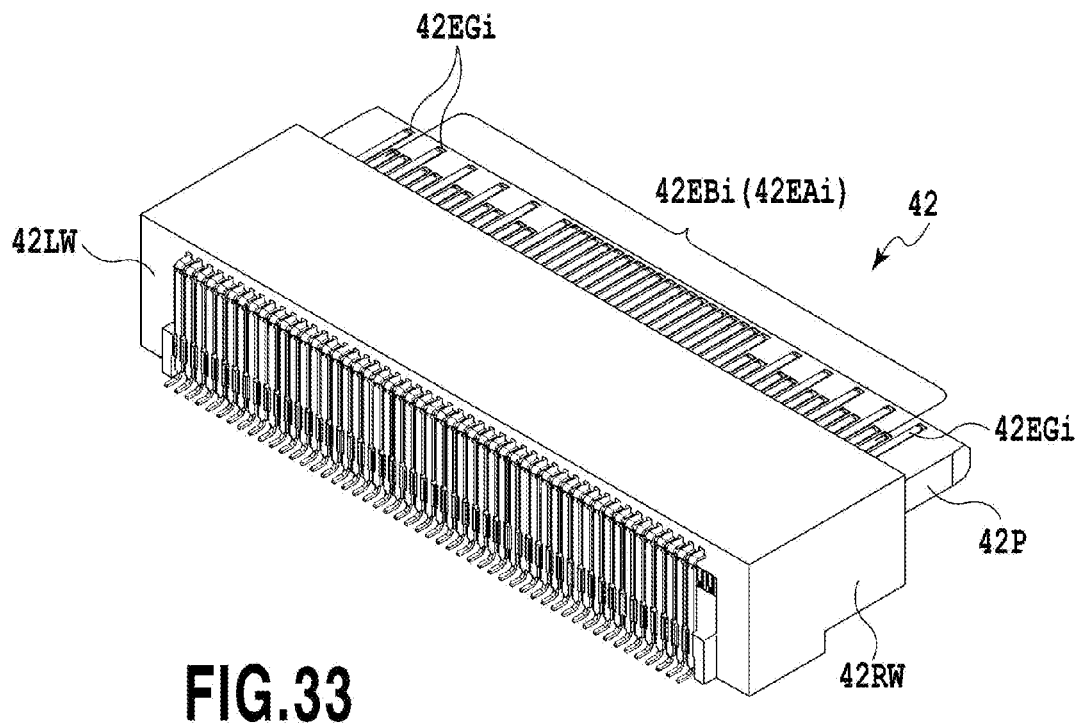
FIG. 33 is an enlarged perspective view showing plug connector used in the module board illustrated in FIG. 30.

The plug connector 42 is integrally molded by using a resin material, for example. As shown in the enlarged view of FIG. 33 and FIG. 34, the plug connector 42 comprises a connection end 42P, a contact terminal support portion provided continuously with the connection end 42P and configured to support a group of contact terminals, and the plurality of contact terminals 42EAi and 42EBi (i=1 to n, n is the positive integer) supported by the connection end 42P and the contact terminal support portion.

The connection end 42P is inserted into a slot 53U of the host connector 53 to be described later through open end portions of the upper case 34A and the lower plate 34B. A pair of positioning holes (not shown), into which the positioning pins of the plug connector 40 described above are to be inserted, are formed away from each other on a lower surface of the contact terminal support portion of the plug connector 42.

The contact terminals 42EBi are disposed on an upper surface of the connection end 42P opposed to an upper surface of the contact terminal support portion, and at the predetermined intervals that correspond to the contact pads on the module board 36 mentioned above. The contact terminals 42EBi comprise power supply terminals, signal contact terminals, and ground contact terminals 42EGi, for example. A pair of adjacent signal contact terminals, for instance, are disposed between the ground contact terminals 42EGi. Each contact terminal 42EBi has a fixation terminal portion to be solder-fixed to a contact pad constituting the electrode portion 36EED, and a contact portion to be brought into contact with a contact portion of a contact terminal of the host connector 53.

The contact terminals 42EAi are disposed on a lower surface of the connection end 42P, and at the predetermined intervals that correspond to the contact pads on the module board 36 mentioned above. As with the contact terminals 42EBi, the contact terminals 42EAi comprise power supply terminals, signal contact terminals, and ground contact terminals, for example. A pair of adjacent signal contact terminals, for instance, are disposed between the ground contact terminals. Each contact terminal 42EAi has a fixation terminal portion to be solder-fixed to a contact pad constituting the electrode portion 36EEC, and a contact portion to be brought into contact with a contact portion of a contact terminal of the host connector 53.

Figure 34:
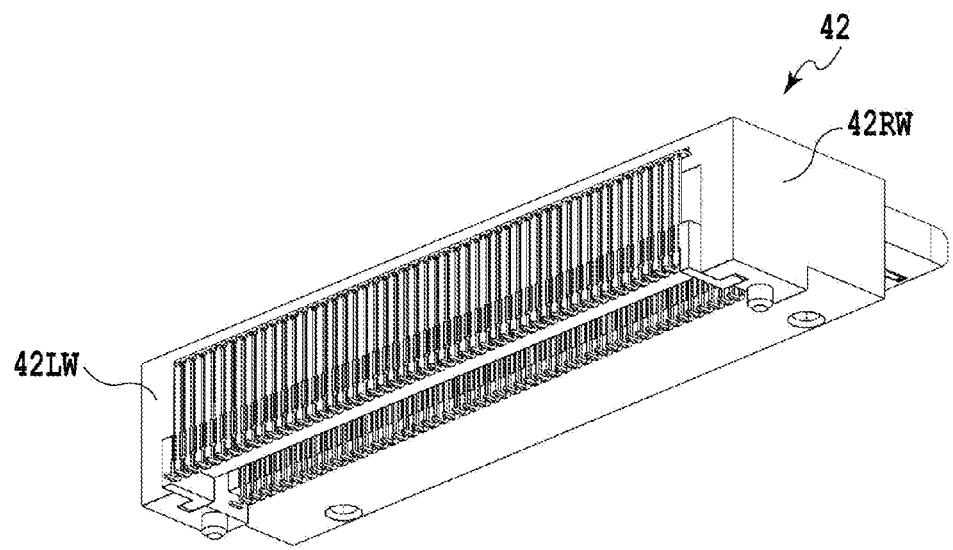
FIG. 34 is a perspective view showing the plug connector illustrated in FIG. 33, which is viewed from a back face side.

As shown in FIG. 30 and FIG. 34, cutout portions to be engaged with an upper corner of the plug connector 40 are formed at two side walls 42RW and 42LW of the contact terminal support portion of the plug connector 42.

Moreover, an optical connector coupled to an end of an optical cable is connected to a port (not shown) provided at an end portion of each of the transceiver modules 34 shown in FIG. 27. Another end of each optical cable is connected to an optical connector of another housing which constitutes a not-illustrated communication system. Here, the port of the transceiver module is not limited only to this example. For instance, the port may be configured to be connected to a coaxial connector coupled to a coaxial cable.

A manipulation lever 38 is provided to a portion of the upper case 34A located above the port (not shown). The manipulation lever 38 is linked to a lock/unlock mechanism provided on two side surface portions of each of the upper case 34A and the lower case 34B. Thus, a locked state of the transceiver module 34 with the transceiver module receptacle assembly 32 by means of the lock/unlock mechanism is changed to an unlocked state by pulling the manipulation lever 38 in a direction to recede from the support panel (not shown).

Figure 39:
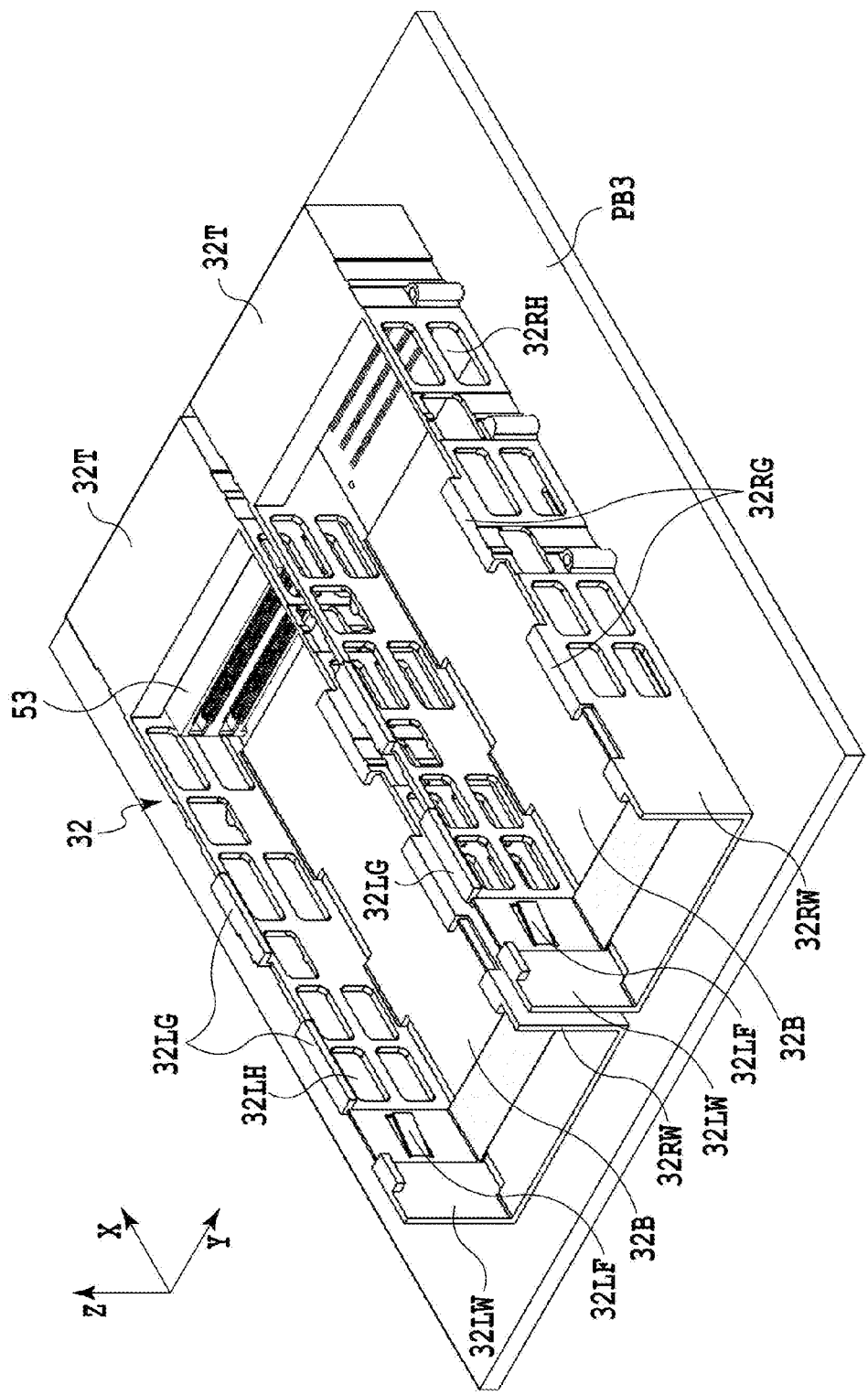
FIG. 39 is a perspective view of the transceiver module receptacle assembly used in the third embodiment of the transceiver module assembly according to the present invention, which shows a state where the transceiver module is detached from the transceiver module receptacle assembly.

As shown in FIG. 37 and FIG. 39, the transceiver module receptacle assembly 32 comprises, as its main components: receptacle cages each provided with guide members 32RG and 32LG which guide the transceiver module 34 at the time of attachment and detachment of the transceiver module 34 as described above; and the host connectors 53 each of which electrically connects the group of contact pads being the connection end of the attached transceiver module 34, to a conductive pattern on the printed wiring board PB3.

Each receptacle cage is made of stainless steel having fine heat conductivity and is integrally formed by die casting, for example. On the inner side, the receptacle cage has a module accommodating portion and a host connector accommodating portion.

The module accommodating portion is formed by being surrounded by side walls 32RW and 32LW, which are opposed to each other at a predetermined interval in between, and by a bottom wall portion 32B thereof. The side walls 32RW and 32LW extend along an X coordinate axis of orthogonal coordinates in FIG. 39, i.e., along an attachment/detachment direction of the transceiver module 34. Each of the side walls 32RW and 32LW has a lock piece 32LF located in the vicinity of a module slot to be described later. The lock pieces 32LF are formed at bent portions of support plates supported by the side walls 32RW and 32LW. Each lock piece 32LF is selectively brought into either an engaged state or a disengaged state with a fixing piece of the lock/unlock mechanism of the transceiver module 34, by using the above-mentioned manipulation lever 38 so as to establish the locked state of the transceiver module 34 with the module accommodating portion.

The module slot opened in the direction of the X coordinate axis is provided at one end of the module accommodating portion. Thus, the transceiver module 34 is attached and detached through the module slot.

At three positions on upper end portions of the side walls 32RW and 32LW of each module accommodating portion, the guide members 32RG and 32LG are integrally formed in such away as to protrude inward, respectively. As shown in FIG. 37, when the transceiver module 34 is attached to the module accommodating portion, the guide members 32RG and 32LG are brought into engagement with the above-mentioned grooves 34Ag of the transceiver module 34, respectively. The side walls 32RW and 32LW have a plurality of via-holes, respectively, which establish communication between the inside and outside of the module accommodating portion. The plurality of via-holes are formed to be opposed to the pores $34a$ and $34b$ of the transceiver module 34 mentioned above.

Moreover, another end of the module accommodating portion opposed to the module slot communicates with the inside of the host connector accommodating portion. A substantially rectangular aperture 32A opened along a Z coordinate axis in FIG. 39 is formed at a portion of the host connector accommodating portion opposed to the bottom wall portion 32B.

The bottom wall portion 32B, which connects lower ends of the side walls 32RW and 32LW to each other, comes into contact with a surface of the printed wiring board PB3.

The host connector accommodating portion opened toward the surface of the printed wiring board PB3 is formed by being surrounded by a host connector side closed end portion of the receptacle cage 32 opposed to the module slot, an upper portion 32T forming an upper part on the host connector side of the aperture 32A, and host connector side portions of the side walls 32RW and 32LW.

Figure 42:
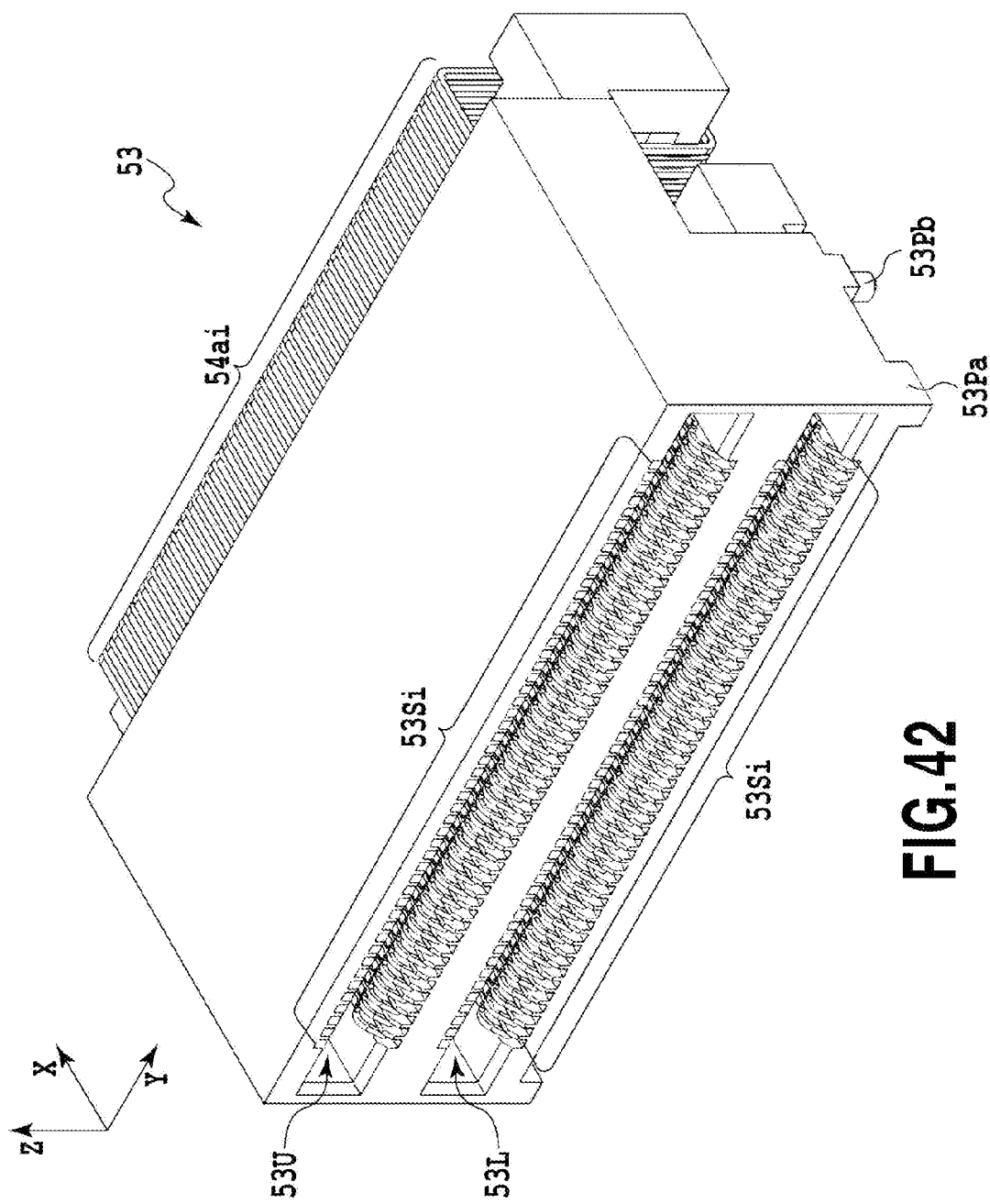
FIG. 42 is a perspective view showing a host connector used in the transceiver module receptacle assembly illustrated in FIG. 39.
Figure 43:
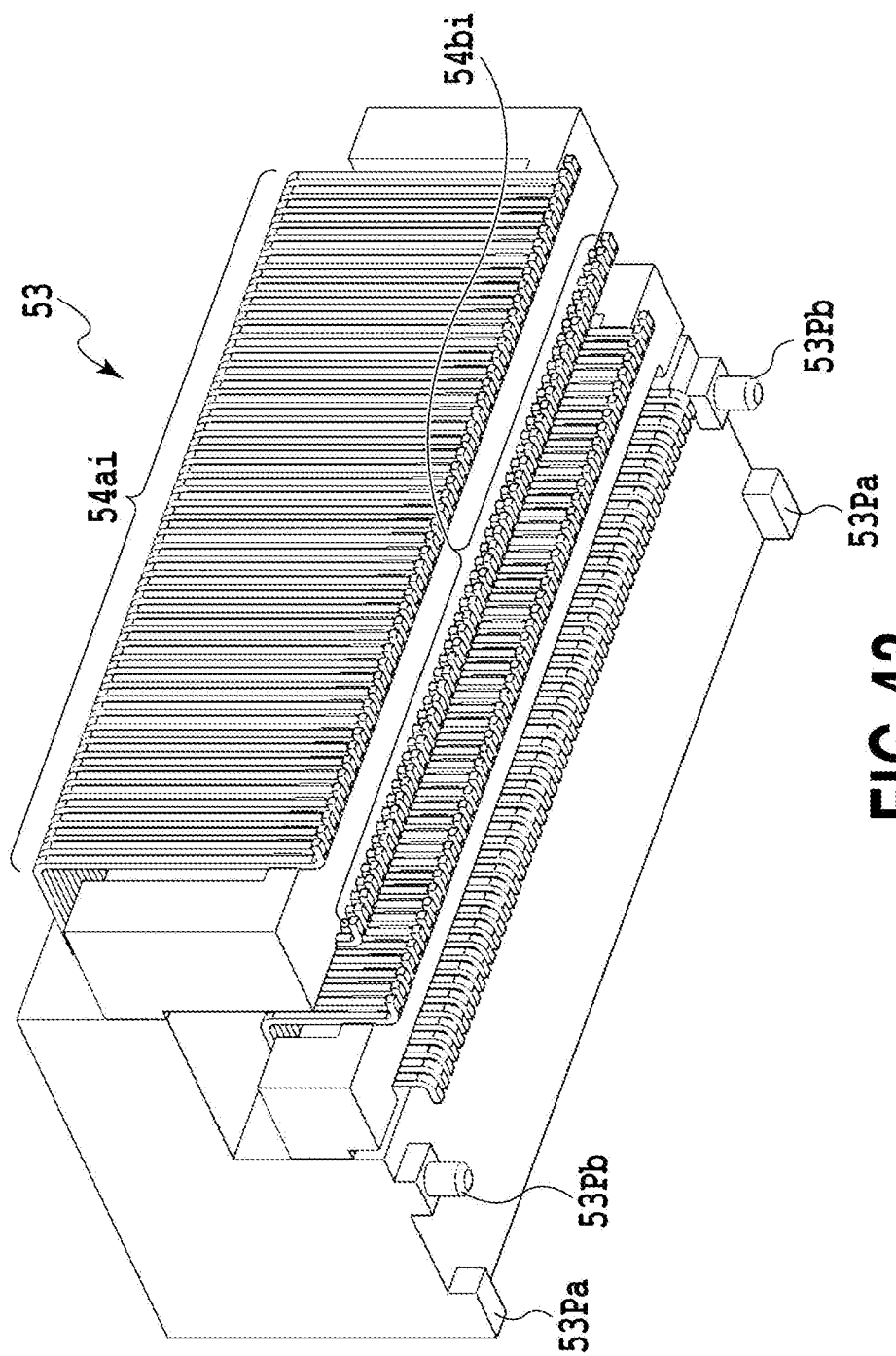
FIG. 43 is a perspective view showing the host connector illustrated in FIG. 42, which is viewed from a bottom side thereof.

As shown in the enlarged view of FIG. 42 and FIG. 43, each host connector 53 comprises: a connector insulator provided with the slot 53L and the slot 53U, into which the connection end 40P of the plug connector 40 of the transceiver module 34 and the connection end 42P of the plug connector 42 thereof are detachably inserted, respectively; and a plurality of contact terminals $54ai$ and $54bi$ (i=1 to n, n is the positive integer).

Figure 38:
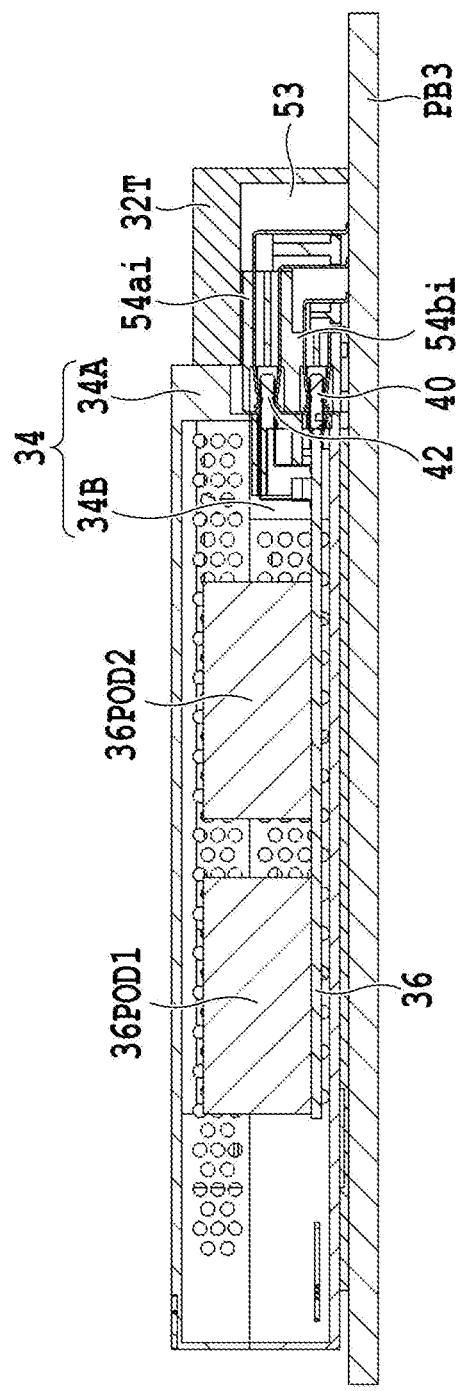
FIG. 38 is a cross-sectional view taken along XXXVIII-XXXVIII line in FIG. 37A.

The respective contact terminals $54ai$ and $54bi$ are configured to electrically connect the plug connectors 40 and 42 of the transceiver module 34 to a group of electrodes PBCC (see FIG. 40A) to be connected to the conductive pattern on the printed wiring board PB3. As shown in FIG. 38, one of a pair of the contact terminals $54ai$ comprises: a movable contact portion having a contact portion provided on one end to be brought into contact with the corresponding contact terminal 42EBi of the plug connector 42 of the transceiver module 34; a fixation portion having a fixation terminal portion to be solder-fixed to one of the group of electrodes on the printed wiring board PB3; and a connecting portion to connect the movable contact portion to the fixation portion. The other one of the pair of the contact terminals $54ai$ comprises: a movable contact portion having a contact portion provided on one end to be brought into contact with the corresponding contact terminal 42EAi of the plug connector 42 of the transceiver module 34; a fixation portion having a fixation terminal portion to be solder-fixed to another one of the group of electrodes on the printed wiring board PB3; and a connecting portion to connect the movable contact portion to the fixation portion.

One of a pair of the contact terminals 54*bi* comprises: a movable contact portion having a contact portion provided on one end to be brought into contact with the corresponding contact terminal 40EBi of the plug connector 40 of the transceiver module 34; a fixation portion having a fixation terminal portion to be solder-fixed to one of the group of electrodes on the printed wiring board PB3; and a connecting portion to connect another end of the movable contact portion to another end of the fixation portion. The other one of the pair of the contact terminals 54*bi* comprises: a movable contact portion having a contact portion provided on one end to be brought into contact with the corresponding contact terminal 40EAi of the plug connector 40 of the transceiver module 34; a fixation portion having a fixation terminal portion to be solder-fixed to another one of the group of electrodes on the printed wiring board PB3; and a connecting portion to connect another end of the movable contact portion to another end of the fixation portion.

The connector insulator is molded by using a resin material, and has the slots 53U and 53L extending along a Z coordinate axis in FIG. 42, to and from which the plug connectors 42 and 40 of the transceiver module 34 are attached and detached.

A plurality of slits 53Si (i=1 to n, n is the positive integer) to be formed at predetermined intervals along a Y coordinate axis shown in FIG. 42, are formed in the slot 53U. Each space between two adjacent slits 53Si is partitioned by a partition wall. As shown in FIG. 38, the movable contact portion of the one of the pair of the contact terminals 54*ai* and the movable contact portion of the other one of the pair of the contact terminals 54*ai* are disposed opposite to each other in each slit 53Si.

A plurality of slits 53Si (i=1 to n, n is the positive integer) to be formed at predetermined intervals along the Y coordinate axis shown in FIG. 42, are formed in the slot 53L. Each space between two adjacent slits 53Si is partitioned by a partition wall. As shown in FIG. 38, the movable contact portion of the one of the pair of the contact terminals 54*bi* and the movable contact portion of the other one of the pair of the contact terminals 54*bi* are disposed opposite to each other in each slit 53Si.

As shown in FIG. 43, a plurality of positioning pins 53Pa and 53Pb to be fitted into positioning holes in the printed wiring board PB3 are formed at a bottom part of the connector insulator.

Figure 40A:
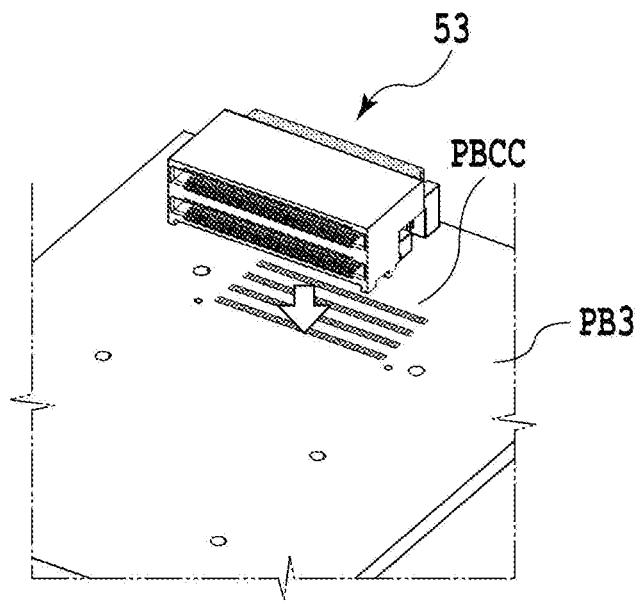
FIG. 40A is a perspective view made available for explaining fabricating procedures of the transceiver module receptacle assembly used in the third embodiment of the transceiver module assembly according to the present invention.
Figure 40B:
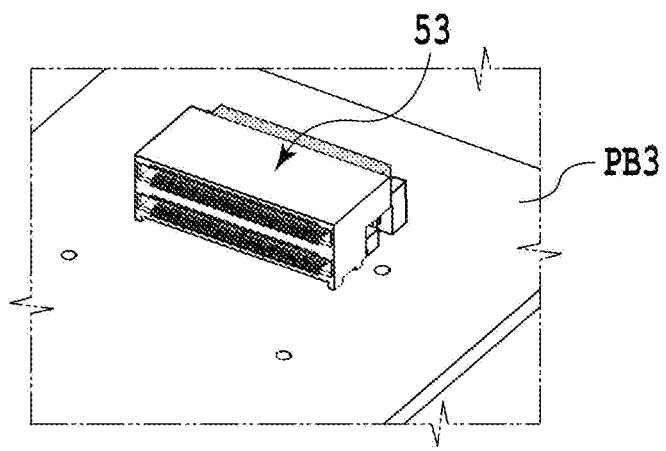
FIG. 40B is a perspective view made available for explaining the fabricating procedures of the transceiver module receptacle assembly used in the third embodiment of the transceiver module assembly according to the present invention.
Figure 41A:
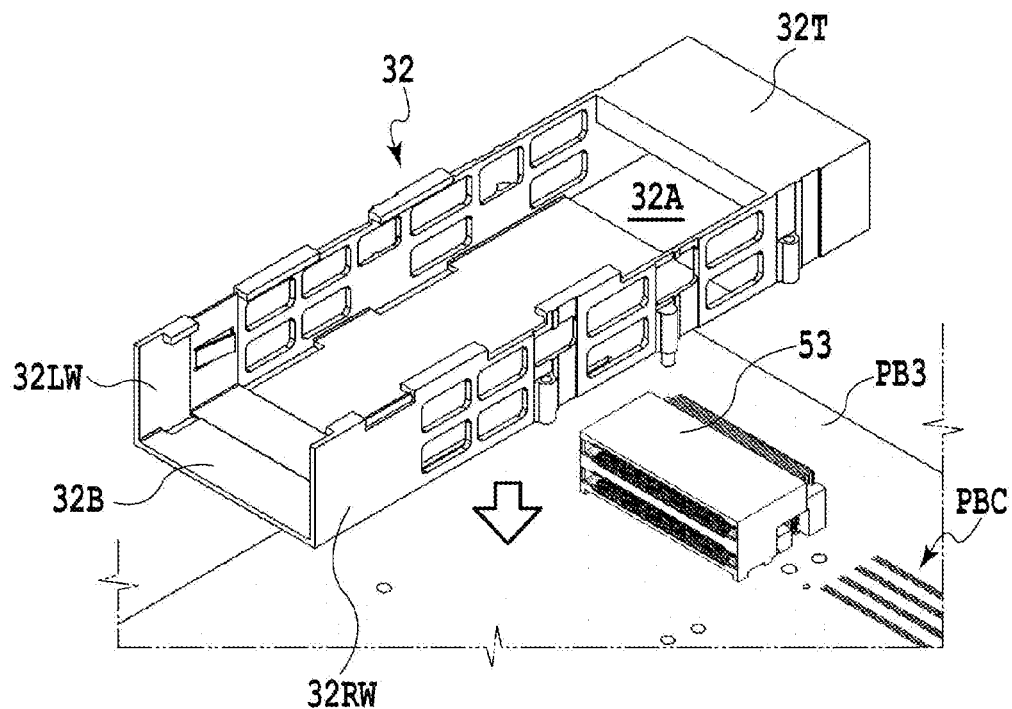
FIG. 41A is a perspective view made available for explaining the fabricating procedures of the transceiver module receptacle assembly used in the third embodiment of the transceiver module assembly according to the present invention.
Figure 41B:
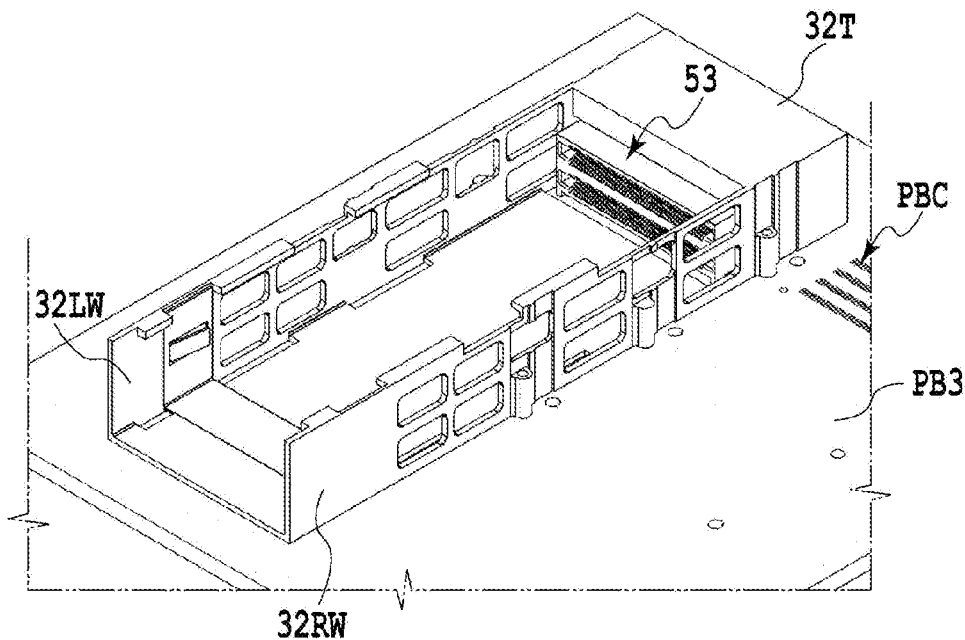
FIG. 41B is a perspective view made available for explaining the fabricating procedures of the transceiver module receptacle assembly used in the third embodiment of the transceiver module assembly according to the present invention.

When the transceiver module receptacle assembly 32 is fitted to the printed wiring board PB3, the host connector 53 is first positioned with respect to the group of electrodes PBCC of the printed wiring board PB3, and is solder-fixed thereto as shown in FIG. 40A and FIG. 40B. Next, as shown in FIG. 41A, the aperture 32A of the receptacle cage is positioned with respect to the host connector 53. Moreover, as shown in FIG. 41B, the receptacle cage is fixed to the printed wiring board PB3 by using the small screws and the nuts.

Figure 36:
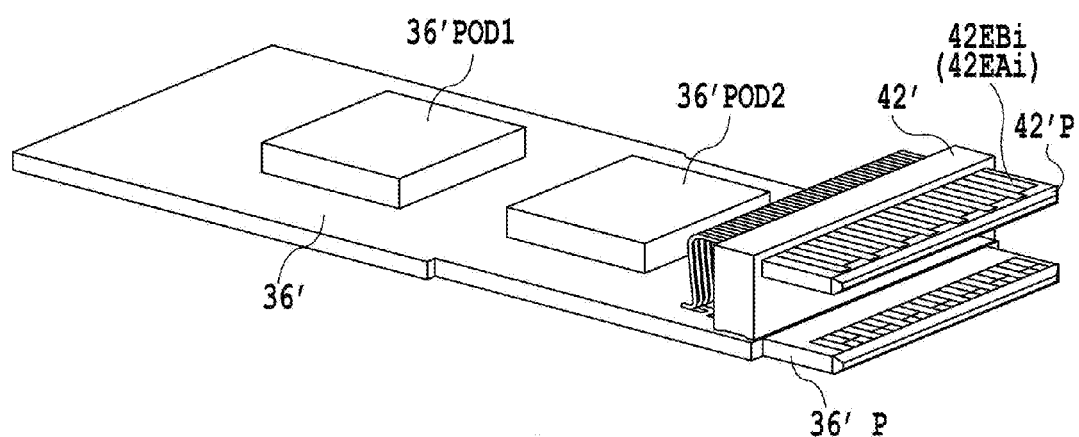
FIG. 36 is a perspective view showing another example of the module board provided to the transceiver module illustrated in FIG. 28.

Note that in the above-described example, the plug connector 40 as the connection end is provided to the one end portion of the module board 36 of the transceiver module 34. However, the present invention is not limited only to this example. For instance, instead of the plug connector 40, a module board 36' may comprise an electrode portion as a connection end as shown in FIG. 36, which is provided with a group of contact pads in conformity to the arrays of the plurality of contact terminals 40EAi and 40EBi. In this case, the module board 36' has a plug connector 42' instead of the plug connector 42. The plug connector 42' is integrally molded by using a resin material, for example, and comprises a connection end 42'P, a contact terminal support portion provided continuously with the connection end 42'P and configured to support a group of contact terminals, and the plurality of contact terminals 42EAi and 42EBi (i=1 to n, n is the positive integer) supported by the connection end 42'P and by the contact terminal support portion. Note that constituents in FIG. 36 which are the same as the constituents in FIG. 30 are denoted by the same reference numerals and overlapping description thereof will be omitted.

Pod connectors 36'POD1 and 36'POD2 are mounted on a mounting surface of the module board 36'. The pod connectors 36'POD1 and 36'POD2 incorporate IC chips that have photoelectric conversion elements. Each of the pod connectors 36'POD1 and 36'POD2 is connected to an optical connector that is coupled to a port (not shown). Thus, the module board 36' can be replaced easily.

Figure 44:
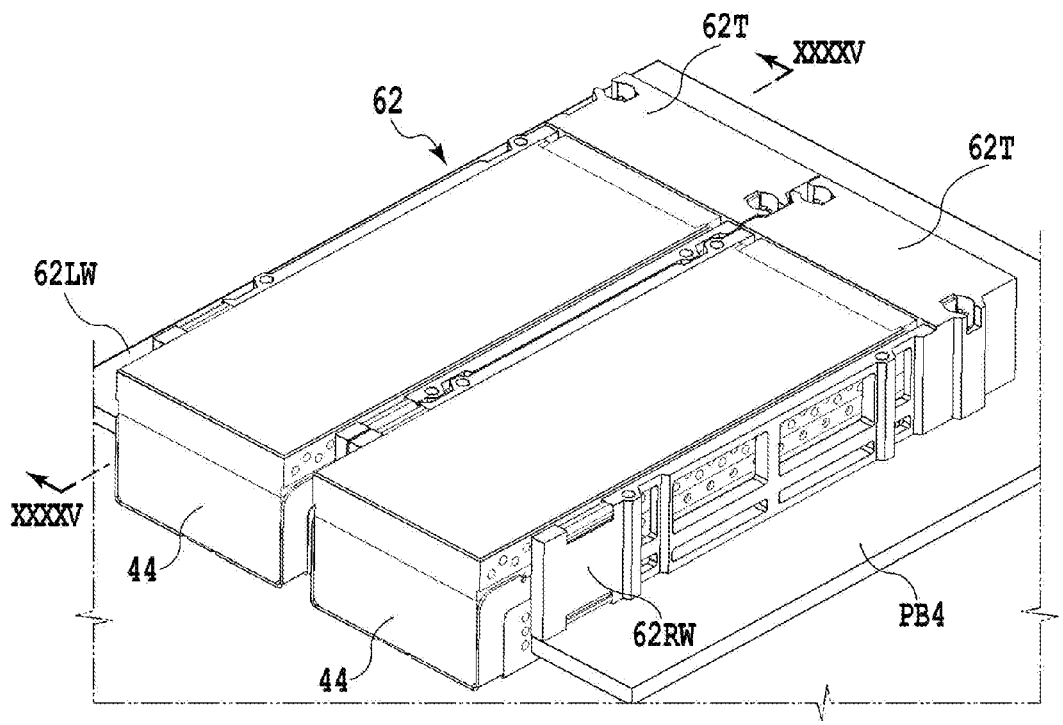
FIG. 44 is a perspective view of a transceiver module receptacle assembly used in a fourth embodiment of a transceiver module assembly according to the present invention, which shows a state where a transceiver module is attached to the transceiver module receptacle assembly.

FIG. 44 shows external appearance of a transceiver module assembly according to a fourth embodiment of the present invention.

In the transceiver module assemblies according to the first to third embodiments of the present invention described above, the transceiver module includes the single module board 16 or 36. Instead, the example shown in FIG. 44 includes two module boards 46 and 48.

In FIG. 44, the transceiver module assembly according to the present invention comprises transceiver modules 44 to be described later, and transceiver module receptacle assemblies 62.

A plurality of transceiver module receptacle assemblies 62 are juxtaposed on a support panel inside predetermined electronic equipment. Note that FIG. 44 representatively illustrates two transceiver module receptacle assemblies 62 which are supported by the support panel and configured to house the transceiver modules 44 individually. Each transceiver module receptacle assembly 62 is fixed to a predetermined position of a printed wiring board PB4 by using small screws (not shown) and nuts.

Figure 47:
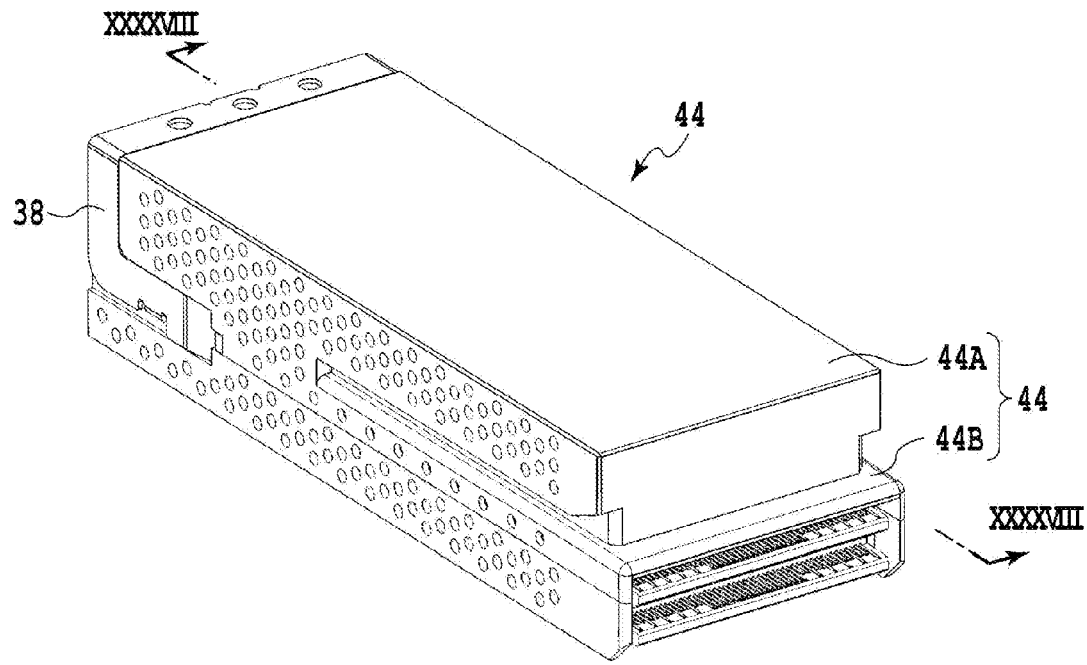
FIG. 47 is a perspective view showing an example of a transceiver module used in a fourth embodiment of a transceiver module assembly according to the present invention.

As shown in FIG. 47, each transceiver module 44 comprises, as its main components: a lower case 44A and an upper case 44B which are made of a metal and collectively constitute a contour; and the module board 46 of an on-board type and the module board 48 of an on-board type (see FIG. 48) located at predetermined positions in a housing space defined between the lower case 44A and the upper case 44B.

Figure 49:
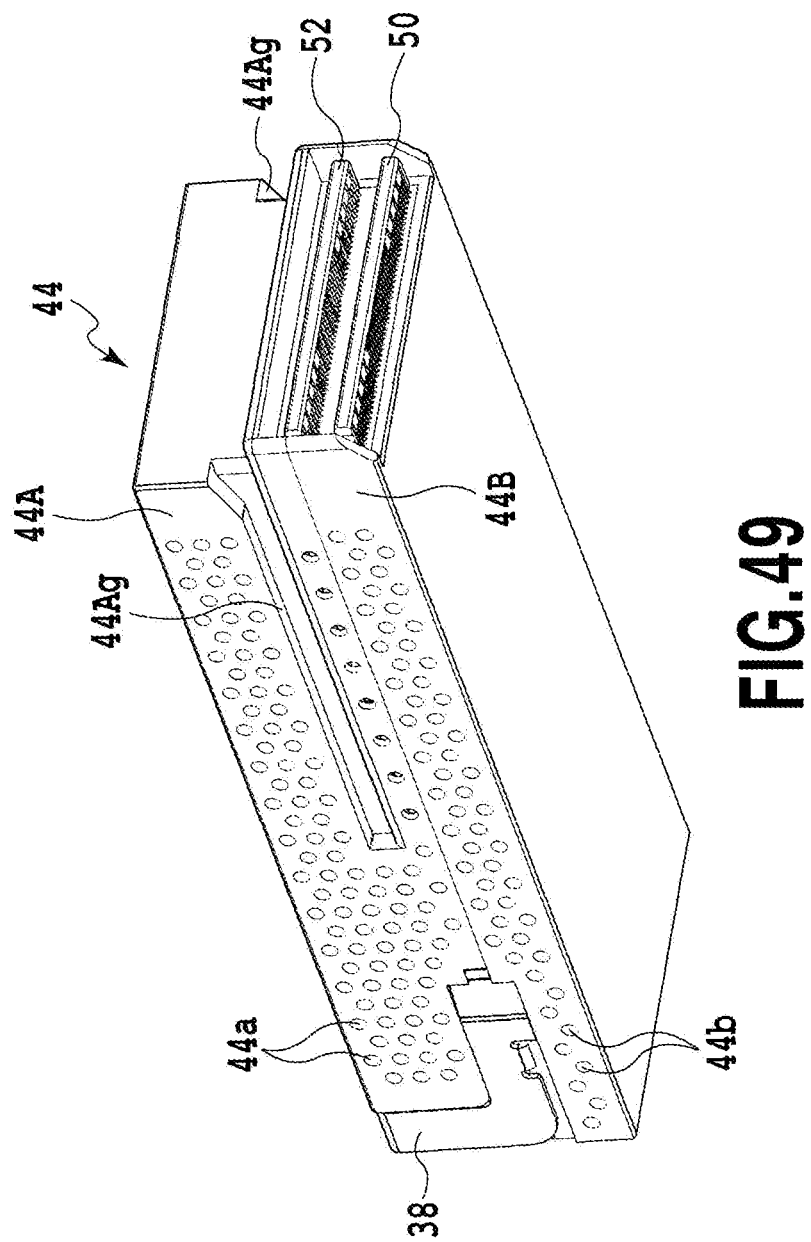
FIG. 49 is a perspective view showing the transceiver module illustrated in FIG. 47, which is viewed from above.

The lower case 44A as a lower member has an upper end that is opened. As shown in FIG. 49, a groove 44Ag is formed in an outer peripheral portion of each of two side wall portions of the lower case 44A, just for a predetermined length in a longitudinal direction thereof. When the transceiver module 44 is attached to the transceiver module receptacle assembly 62, the grooves 44Ag are brought into engagement with guide members 62RG and 62LG of the transceiver module receptacle assembly 62 to be described later. Thus, the transceiver module 44 is guided by the guide members 62RG and 62LG at the time of attachment and detachment, and is stopped at a predetermined position in the module accommodating portion at the time of attachment.

Moreover, at one end portion of the lower case 44A, a pair of protection walls having a thin sheet shape and protruding in a longitudinal direction continuously with two side surfaces of the lower case 44A are formed to be opposed to each other. A space between the pair of protection walls is opened downward in FIG. 49. Upper parts of the pair of protection walls in FIG. 49 are connected to each other.

Furthermore, numerous pores 44a to establish communication between the inside and outside of the lower case 44A are formed in the two side wall portions of the lower case 44A, respectively.

At one end portion of the upper case 44B as an upper member, a pair of protection walls having a thin sheet shape and protruding in a longitudinal direction continuously with two side surfaces of the upper case 44B are formed to be opposed to each other. As shown in FIG. 49, a space between the pair of protection walls is opened upward and downward. Numerous pores 44b to establish communication between the inside and outside of the upper case 44B are formed in two side wall portions, respectively.

Figure 48:
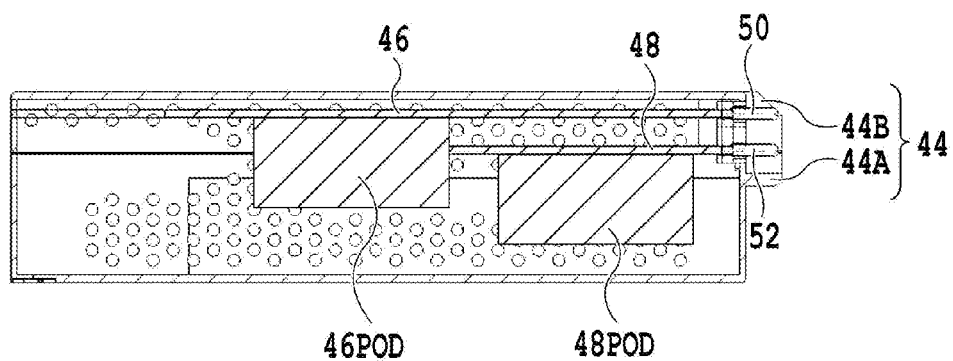
FIG. 48 is a cross-sectional view taken along XXXXVIII-XXXXVIII line in FIG. 47.

As shown in FIG. 48 and FIG. 49, one end portion of the module board 46, which protrudes into the space between the pair of protection walls mentioned above, is inserted to an inner side of and thus connected to a plug connector 50 as the connection end. In the meantime, as shown in FIG. 48, the module board 48 is disposed at a position below the module board 46 and in such a way as to be substantially in parallel thereto. One end portion of the module board 48, which protrudes into the space between the pair of protection walls mentioned above, is inserted to an inner side of and thus connected to a plug connector 52 as the connection end.

Figure 45:
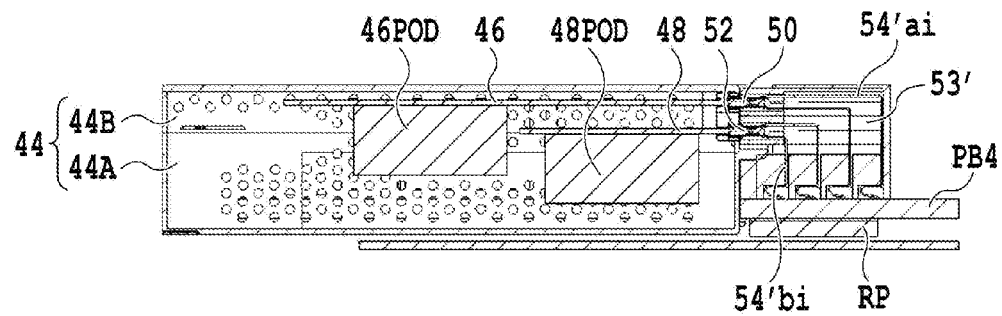
FIG. 45 is a cross-sectional view taken along XXXXV-XXXXV line in FIG. 44.

Electrode portions (not shown), each of which comprises a plurality of contact pads to be connected to a plurality of contact terminals of the plug connector 50 to be described later, are formed opposite from one another on a top surface and a bottom surface at the one end portion of the module board 46. The contact pads are arrayed in a line at predetermined intervals in a direction substantially orthogonal to a direction of insertion of the module board 46 into the plug connector 50. The electrode portions are electrically connected to a conductive layer formed inside the module board 46, respectively. The conductive layer is electrically connected to an electronic component (not shown) to be mounted on the module board 46. As shown in FIG. 45 and FIG. 48, a pod connector 46POD is mounted on a mounting surface of the module board 46. The pod connector 46POD incorporates an IC chip that has a photoelectric conversion element. The pod connector 46POD is connected to an optical connector that is coupled to a port (not shown). Thus, the module board 46 can be replaced easily.

Electrode portions (not shown), each of which comprises a plurality of contact pads to be connected to a plurality of contact terminals of the plug connector 52 to be described later, are formed opposite from one another on a top surface and a bottom surface at the one end portion of the module board 48. The contact pads are arrayed in a line at predetermined intervals in a direction substantially orthogonal to a direction of insertion of the module board 48 into the plug connector 52. The electrode portions are electrically connected to a conductive layer formed inside the module board 48, respectively. The conductive layer is electrically connected to an electronic component (not shown) to be mounted on the module board 48. As shown in FIG. 45 and FIG. 48, a pod connector 48POD is mounted on a mounting surface of the module board 48. The pod connector 48POD is connected to an optical connector that is coupled to a port (not shown). The pod connector 48POD incorporates an IC chip that has a photoelectric conversion element. Thus, the module board 48 can be replaced easily.

The plug connector 50 is integrally molded by using a resin material, for example. As with the example shown in FIG. 31, the plug connector 50 includes a connection end, aboard support portion provided continuously with the connection end and configured to support the one end portion of the module board 46, and a plurality of contact terminals supported by the connection end and the board support portion. Moreover, the plug connector 52 is integrally molded by using a resin material, for example. As with the example shown in FIG. 31, the plug connector 52 comprises a connection end, a board support portion provided continuously with the connection end and configured to support the one end portion of the module board 48, and a plurality of contact terminals supported by the connection end and the board support portion.

An optical connector coupled to an end of an optical cable is connected to the port (not shown) provided at the end portion of each of the transceiver modules 44 shown in FIG. 44. Another end of each optical cable is connected to an optical connector of another housing which constitutes a not-illustrated communication system. Here, the port of the transceiver module is not limited only to this example. For instance, the port may be configured to be connected to a coaxial connector coupled to a coaxial cable.

A manipulation lever 38 is provided to the upper case 44B. The manipulation lever 38 is linked to a lock/unlock mechanism provided on two side surface portions of each of the upper case 44B and the lower case 44A. Thus, a locked state of the transceiver module 44 with the transceiver module receptacle assembly 62 by means of the lock/unlock mechanism is changed to an unlocked state by pulling the manipulation lever 38 in a direction to recede from the support panel (not shown).

Figure 46:
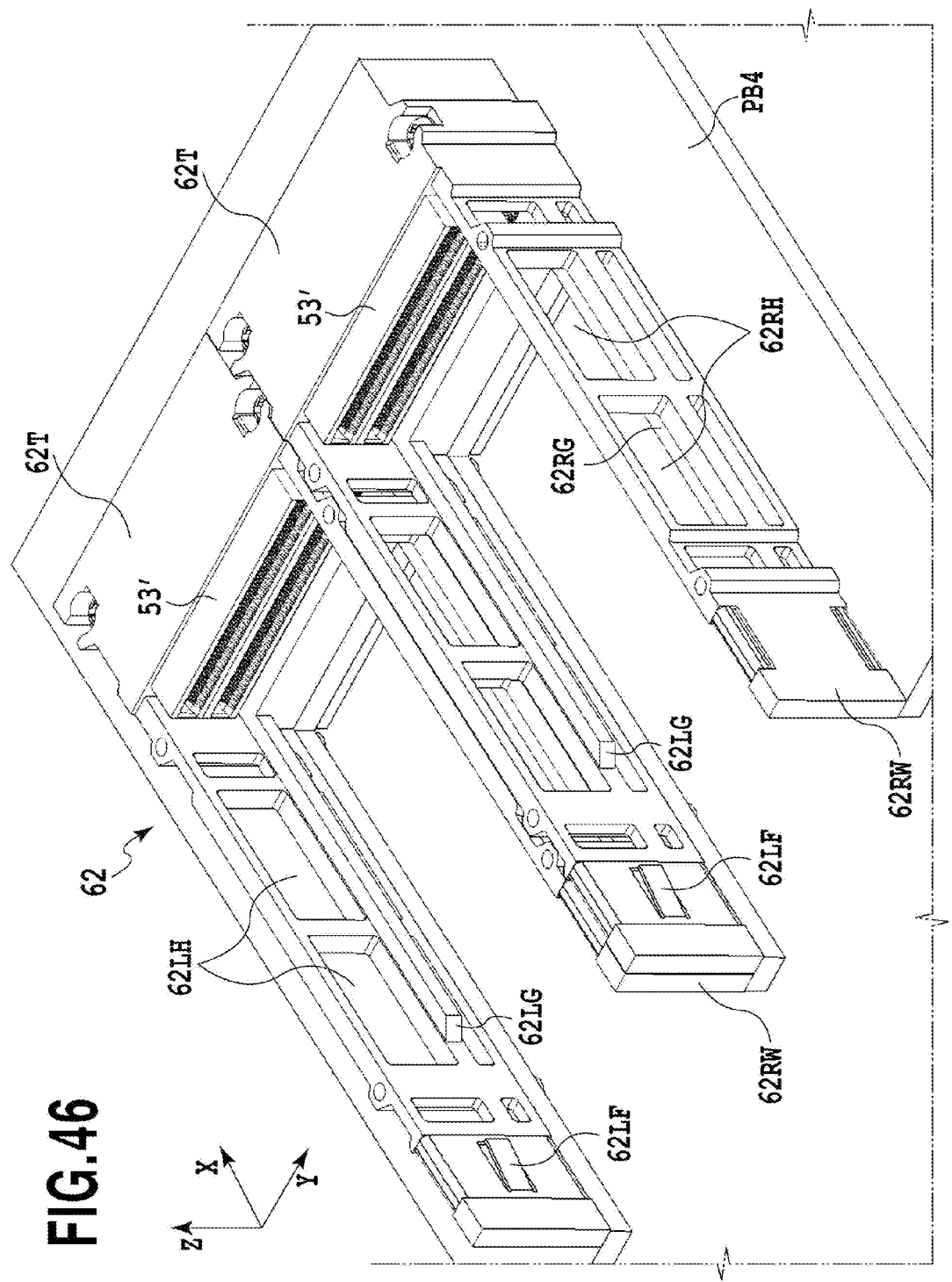
FIG. 46 is a perspective view of the transceiver module receptacle assembly used in the fourth embodiment of the transceiver module assembly according to the present invention, which shows a state where the transceiver module is detached from the transceiver module receptacle assembly.

As shown in FIG. 46, each transceiver module receptacle assembly 62 comprises, as its main components: a receptacle cage provided with the respective guide members 62RG and 62LG to guide the transceiver module 44 at the time of attachment and detachment of the transceiver module 44 as described above; and a host connector 53' which electrically connects the group of contact pads being the connection end of the attached transceiver module 44, to a conductive pattern on the printed wiring board PB4.

The receptacle cage is made of stainless steel having fine heat conductivity and is integrally formed by die casting, for example. On the inner side, the receptacle cage has a module accommodating portion and a host connector accommodating portion.

The module accommodating portion is formed by being surrounded by side walls 62RW and 62LW, which are opposed to each other at a predetermined interval in between. A space between the side walls 62RW and 62LW is opened along a Z coordinate axis of orthogonal coordinates in FIG. 46.

The side walls 62RW and 62LW extend along an X coordinate axis of the orthogonal coordinates in FIG. 46, i.e., along an attachment/detachment direction of the transceiver module 44. Each of the side walls 62RW and 62LW has a lock piece 62LF located in the vicinity of a module slot to be described later. The lock pieces 62LF are formed at support plates fixed to the side walls 62RW and 62LW, respectively. Each lock piece 62LF is selectively brought into either an engaged state or a disengaged state with a fixing piece of the lock/unlock mechanism of the transceiver module 44, by using the above-mentioned manipulation lever 38 so as to establish the locked state of the transceiver module 44 with the module accommodating portion.

The module slot opened in the direction of the X coordinate axis in FIG. 46 is provided at one end of the module accommodating portion. Thus, the transceiver module 44 is attached and detached through the module slot.

At intermediate positions of the side walls 62RW and 62LW of the module accommodating portion, the guide members 62RG and 62LG are integrally formed in such away as to protrude inward, respectively. When the transceiver module 44 is attached to the module accommodating portion, the guide members 62RG and 62LG are brought into engagement with the above-mentioned grooves 44Ag of the transceiver module 44, respectively. The side walls 62RW and 62LW have a plurality of via-holes 62RH and 62LH, respectively, which establish communication between the inside and outside of the module accommodating portion. The plurality of via-holes 62RH and 62LH are formed to be opposed to the pores 44a and 44b of the transceiver module 44 mentioned above.

Moreover, another end of the module accommodating portion opposed to the module slot communicates with the inside of the host connector accommodating portion.

An aperture is formed at a position of the printed wiring board PB4 immediately below the module accommodating portion. Moreover, groups of electrodes, on which the host connector 53' to be described later is disposed, are formed at a position of the printed wiring board PB4 immediately below the host connector accommodating portion. Moreover, a reinforcing plate RP is disposed, by the intermediary of an insulating film (not shown), on a back surface of the printed wiring board PB4 located opposite from the groups of electrodes.

The host connector accommodating portion is formed by being surrounded by a host connector side closed end portion of the receptacle cage 62 opposed to the module slot, an upper portion 62T connecting upper end portions of the side walls 62RW and 62LW to each other, and host connector side portions of the side walls 62RW and 62LW.

The host connector 53' includes the same constituents as those of the above-mentioned host connector 53 with the exception of the contact terminals 54ai and 54bi.

The host connector 53' comprises: a connector insulator provided with two slots, into which the connection end of the plug connector 50 of the transceiver module 44 and the connection end of the plug connector 52 thereof are detachably inserted; and a plurality of contact terminals 54'ai and 54'bi (i=1 to n, n is a positive integer).

The respective contact terminals 54'ai and 54'bi are configured to electrically connect the plug connectors 50 and 52 of the transceiver module 44 to a group of electrodes (not shown) to be connected to the conductive pattern on the printed wiring board PB4. As shown in FIG. 45, one of a pair of the contact terminals 54'ai comprises: a movable contact portion having a contact portion provided on one end to be brought into contact with one of a pair of the contact terminals of the plug connector 50 of the transceiver module 44; a fixation portion having a press-fit terminal portion on one end to come into contact with one of the groups of electrodes on the printed wiring board PB4; and a connecting portion to connect the movable contact portion to the fixation portion. The other one of the pair of the contact terminals 54'ai comprises: a movable contact portion having a contact portion provided on one end to be brought into contact with another one of the pair of the contact terminals of the plug connector 50 of the transceiver module 44; a fixation portion having a press-fit terminal portion on one end to come into contact with another one of the group of electrodes on the printed wiring board PB4; and a connecting portion to connect the movable contact portion to the fixation portion.

One of a pair of the contact terminals 54'bi comprises: a movable contact portion having a contact portion provided on one end to be brought into contact with one of a pair of the contact terminals of the plug connector 52 of the transceiver module 44; a fixation portion having a press-fit terminal portion on one end to come into contact with one of the groups of electrodes on the printed wiring board PB4; and a connecting portion to connect another end of the movable contact portion to another end of the fixation portion. The other one of the pair of the contact terminals 54'bi comprises: a movable contact portion having a contact portion provided on one end to be brought into contact with another one of the pair of the contact terminals of the plug connector 52 of the transceiver module 44; a fixation portion having a press-fit terminal portion on one end to come into contact with one of the group of electrodes on the printed wiring board PB4; and a connecting portion to connect another end of the movable contact portion to another end of the fixation portion.

In this example as well, since the transceiver module 44 includes the module boards 46 and 48, and the module boards 46 and 48 are electrically connected to the groups of electrodes on the printed wiring board PB4 through the plug connectors 50 and 52, each of which has the line of contact terminals. Thus, it is possible to achieve a higher speed, a higher density, and an increase in the number of channels in data transmission.

Figure 50:
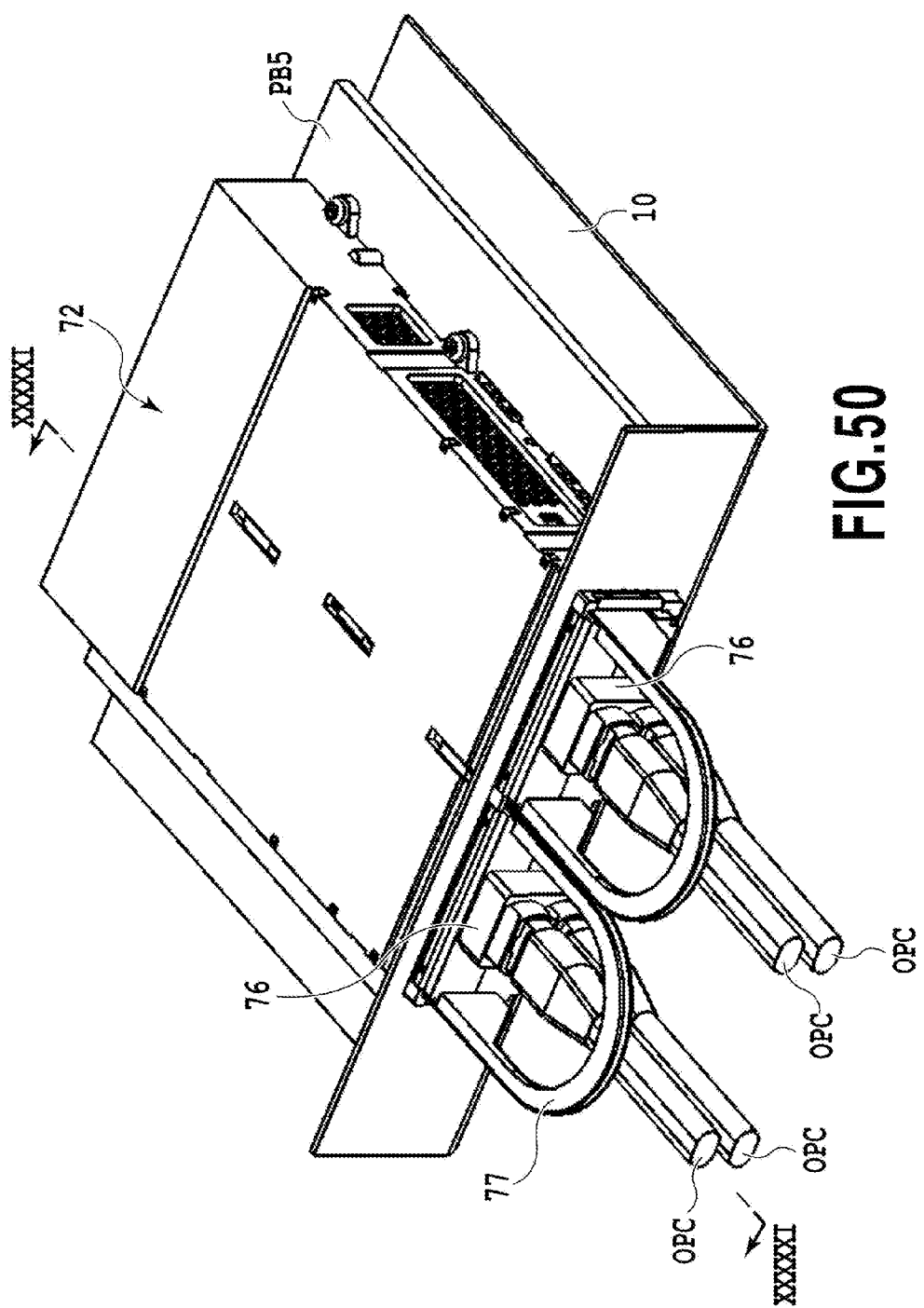
FIG. 50 is a perspective view showing external appearance of a fifth embodiment of a transceiver module assembly according to the present invention.

FIG. 50 shows external appearance of a transceiver module assembly according to a fifth embodiment of the present invention. Note that constituents in FIG. 50 which are the same as the constituents in the example shown in FIG. 2 will be denoted by the same reference numerals and overlapping description thereof will be omitted.

In FIG. 50, the transceiver module assembly according to the present invention comprises transceiver modules 74 to be described later, and transceiver module receptacle assemblies 72.

A plurality of transceiver module receptacle assemblies 72 are juxtaposed on the support panel 10 inside predetermined electronic equipment. Note that FIG. 50 representatively illustrates a transceiver module receptacle assembly which is supported by the support panel 10 and configured to house two transceiver modules 74 individually.

Figure 57:
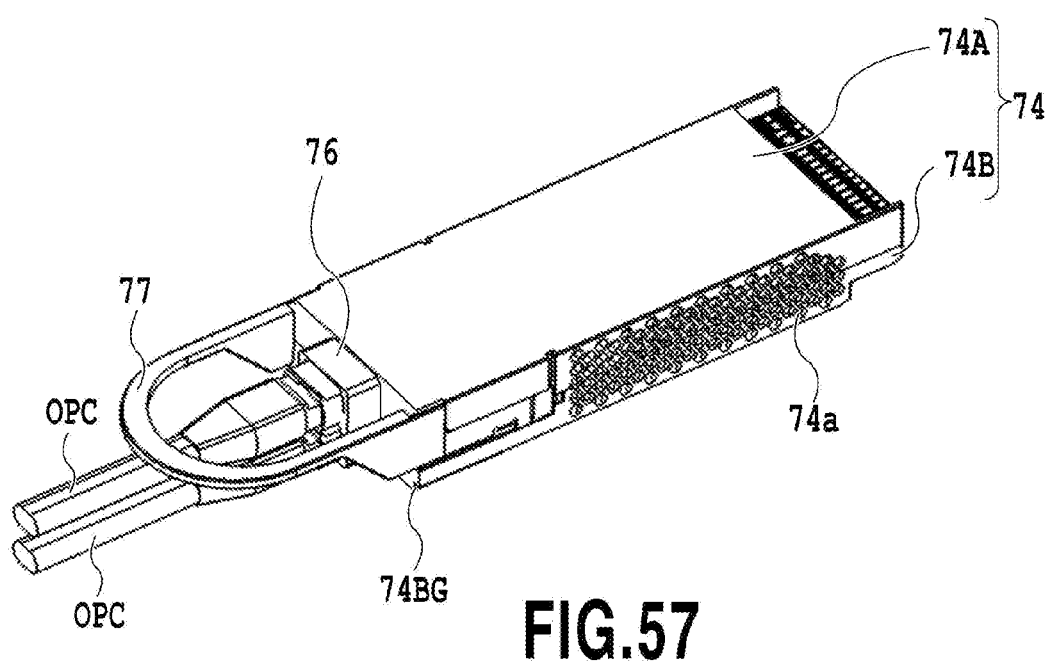
FIG. 57 is a perspective view showing external appearance of the transceiver module used in the fifth embodiment of the transceiver module assembly according to the present invention.

As shown in FIG. 57, each transceiver module 74 comprises, as its main components: an upper case 74A and a lower case 74B which are made of a metal and collectively constitute a contour; and a module board 80 of an on-board type located at a predetermined position in a housing space defined between the upper case 74A and the lower case 74B.

The upper case 74A as an upper member has a lower end that is opened. A pair of protection walls having a thin sheet shape and protruding in a longitudinal direction continuously with two side surfaces of the upper case 74A are formed at one end portion of the upper case 74A. As shown in FIG. 57, a space between the pair of protection walls is opened upward.

The module board 80 has electrode portions serving as a connection end, which is located at one end portion protruding into the space between the pair of protection walls mentioned above. The electrode portions have the same configurations as those in the example shown in FIG. 1, and are formed on one surface and another surface of the end portion of the module board 80, respectively. Description of the respective electrode portions will therefore be omitted.

Accordingly, since two lines of signal line pads 80EAi and 80EBi are formed on the module board 80 as well, it is possible to achieve a higher speed, a higher density, and an increase in the number of channels in data transmission.

Pod connectors 80POD1 and 80POD2 are mounted on one of the surfaces of the module board 80. Each of the pod connectors 80POD1 and 80POD2 is connected to an optical connector at a port 76. The pod connectors 80POD1 and 80POD2 incorporate IC chips that have photoelectric conversion elements. Thus, the module board 80 can be replaced easily.

The lower case 74B as a lower member is fixed to the lower end of the upper case 74A in such a way as to cover the above-mentioned aperture at the lower end of the upper case 74A. Two corners at a lower end of the lower case 74B are provided with grooves 74BG, respectively. The grooves 74BG are engaged with guide portions (not shown) which are formed on peripheral edges of a module slot of the corresponding transceiver module receptacle assembly 72 to be described later.

Here, the above-mentioned module board 80 has a group of contact pads as a connection end. However, the present invention is not limited only to this example. For instance, the module board may have plug connectors as the connection end as described later.

Each optical connector coupled to an end of each optical cable OPC is connected to the port 76 provided at an end portion of each of the transceiver modules 74 shown in FIG. 57. Another end of each optical cable is connected to an optical connector of another housing which constitutes a not-illustrated communication system. Here, the port of the transceiver module is not limited only to this example. For instance, the port may be configured to be connected to a coaxial connector coupled to a coaxial cable.

A manipulation lever 77 is provided to an upper part of an end portion of the upper case 74A. The manipulation lever 77 provided with a hole is linked to a lock/unlock mechanism provided on two side surface portions of each of the upper case 74A and the lower case 74B. Thus, a locked state of the transceiver module 74 with the transceiver module receptacle assembly 72 by means of the lock/unlock mechanism is changed to an unlocked state by pulling the manipulation lever 77 in a direction to recede from the support panel 10. Moreover, two side surface portions of the upper case 74A and of the lower case 74B are provided with a plurality of pores 74a to establish communication between the inside and outside of the upper case 74A and the lower case 74B.

Figure 52:
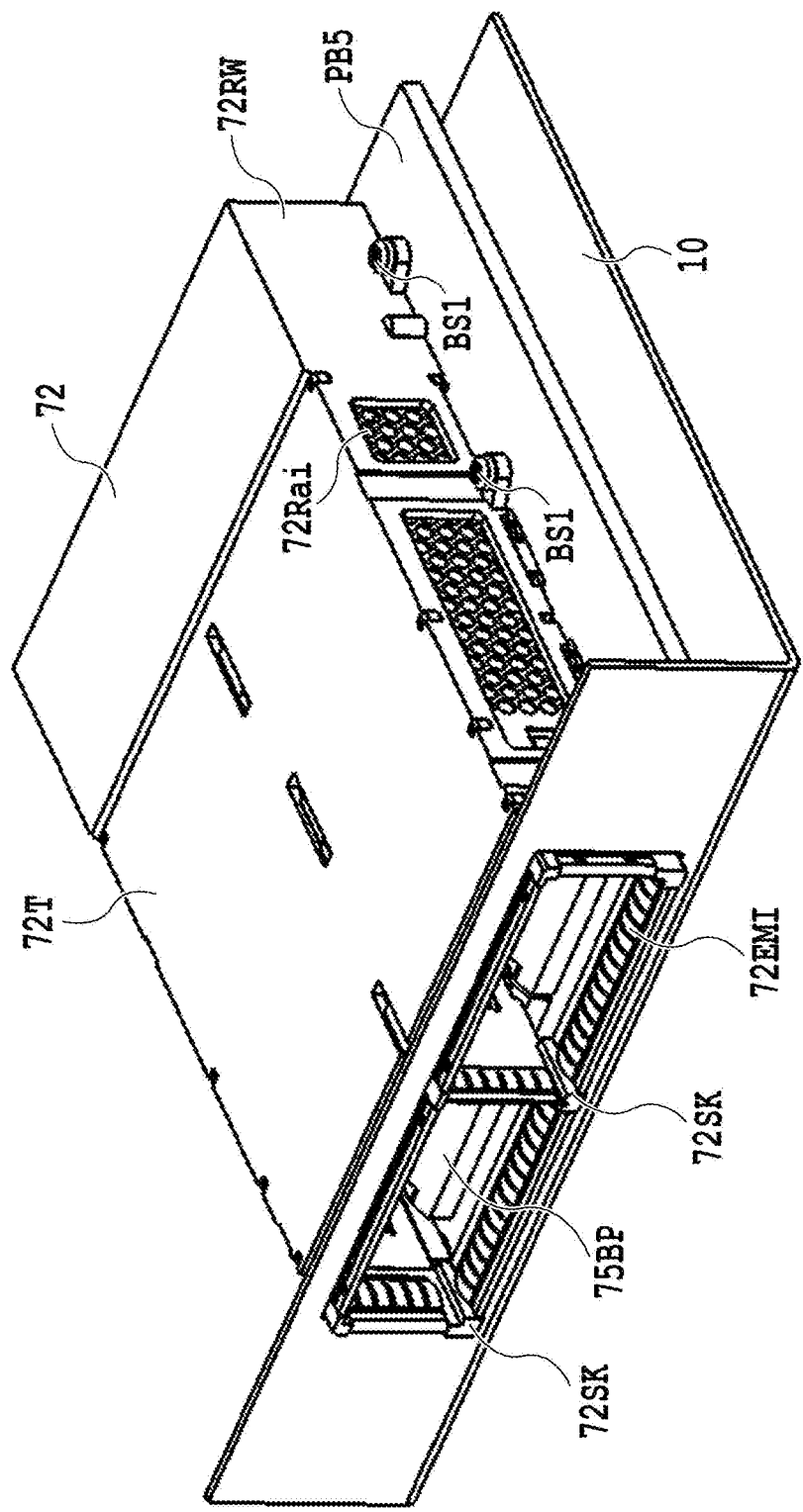
FIG. 52 is a perspective view of a transceiver module receptacle assembly used in the fifth embodiment of the transceiver module assembly according to the present invention, which shows a state where a transceiver module is detached from the transceiver module receptacle assembly.

As shown in FIG. 50 and FIG. 52, the transceiver module receptacle assembly 72 is supported by the support panel 10.

Figure 56:
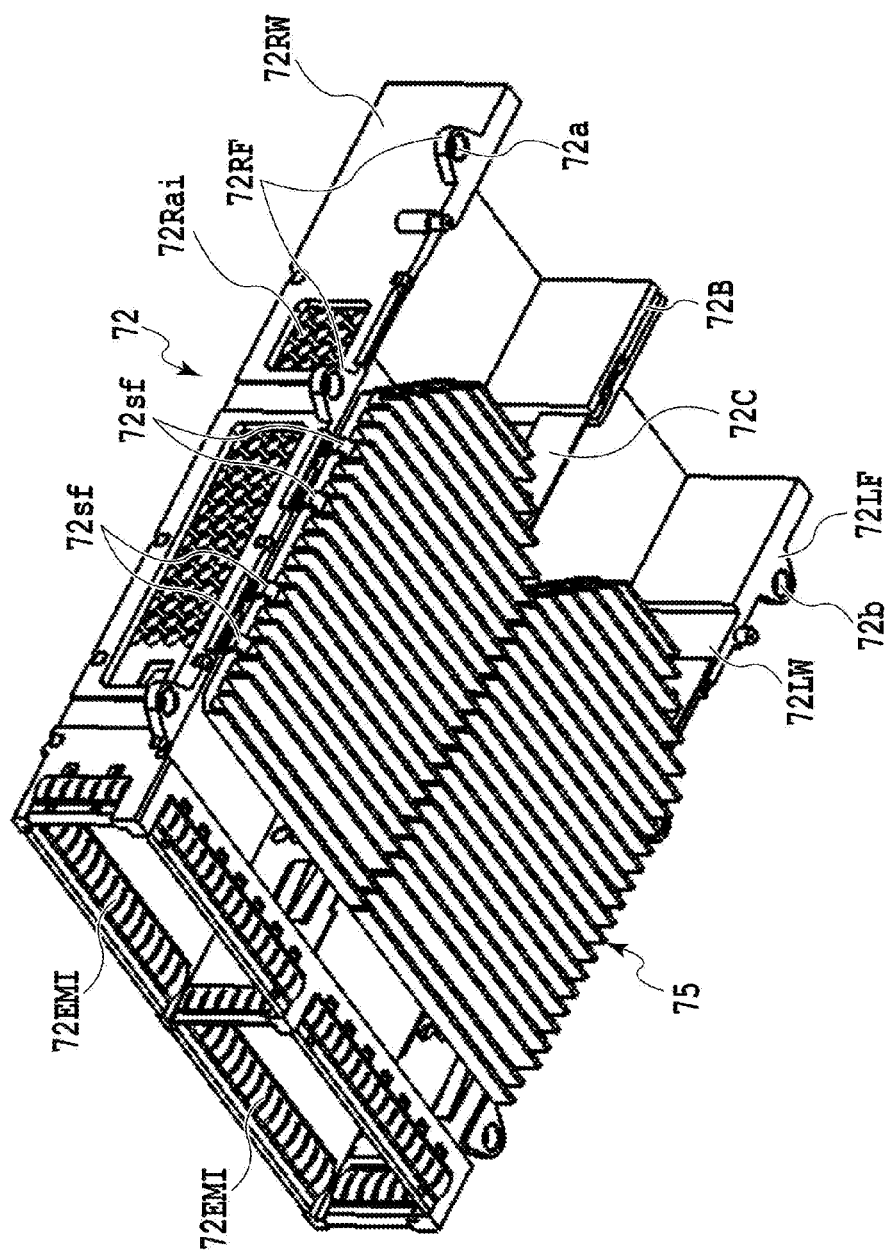
FIG. 56 is a perspective view showing the transceiver module receptacle assembly used in the fifth embodiment of the transceiver module assembly according to the present invention, which is viewed from a heatsink side.

As shown in FIG. 52 and FIG. 56, the transceiver module receptacle assembly 72 comprises, as its main components: a bracket which guides the transceiver module 74 at the time of attachment and detachment of the transceiver module 74 as described above; two side wall portions 72RW and 72LW being connected to the bracket and constituting a contour; a top portion 72T connecting the two side wall portions 72RW and 72LW to each other; a partition plate 72C which partitions an inner side of the bracket and transceiver module accommodating portions connected to the inner side of the bracket; two heatsinks 75 which radiate heat generated from the transceiver modules 74; and two host connectors 78 each of which electrically connects the group of contact pads being the connection end of the attached transceiver module 74, to a conductive pattern on a printed wiring board PB5.

Figure 59:
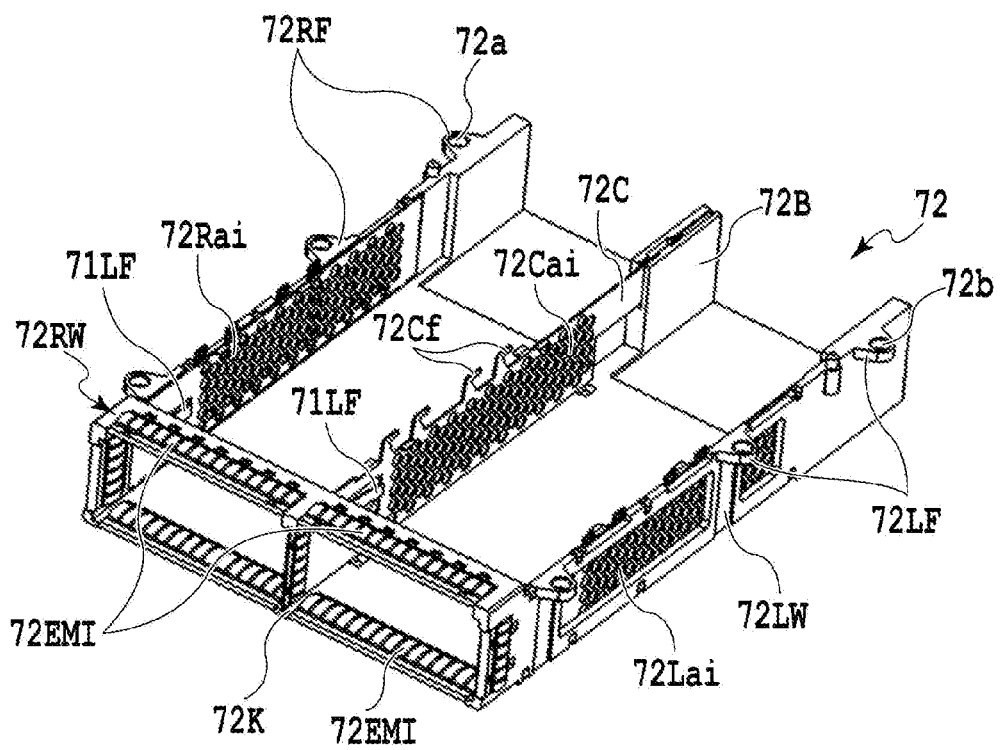
FIG. 59 is a perspective view showing the transceiver module receptacle assembly illustrated in FIG. 56 in a state where the heatsink is detached therefrom.
Figure 60:
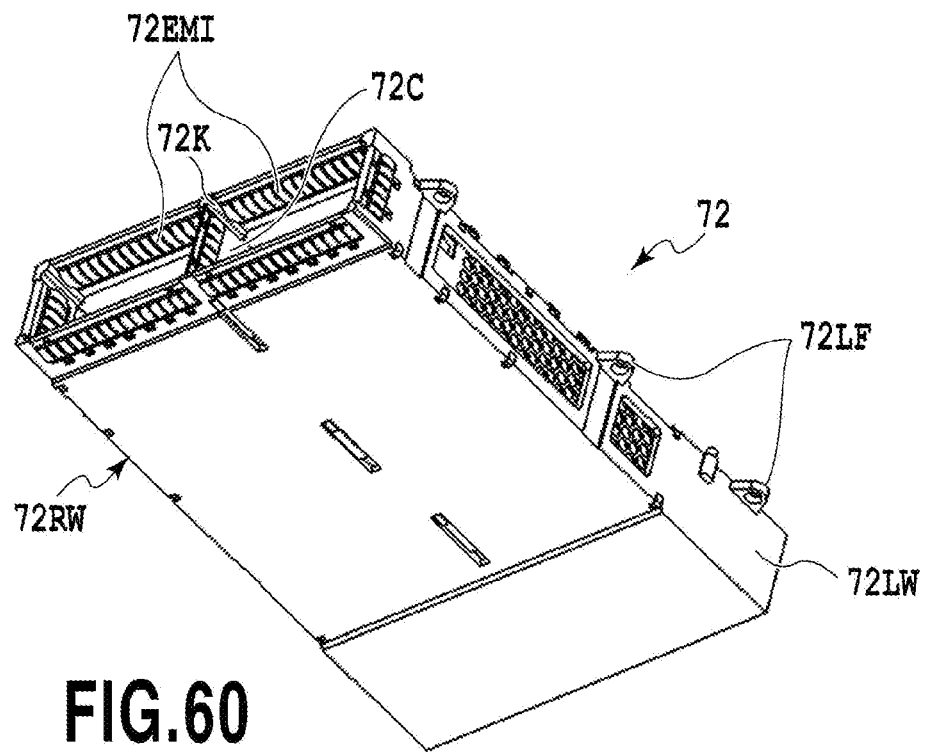
FIG. 60 is a perspective view showing the transceiver module receptacle assembly illustrated in FIG. 56 in the state where the heatsink is detached therefrom.
Figure 61:
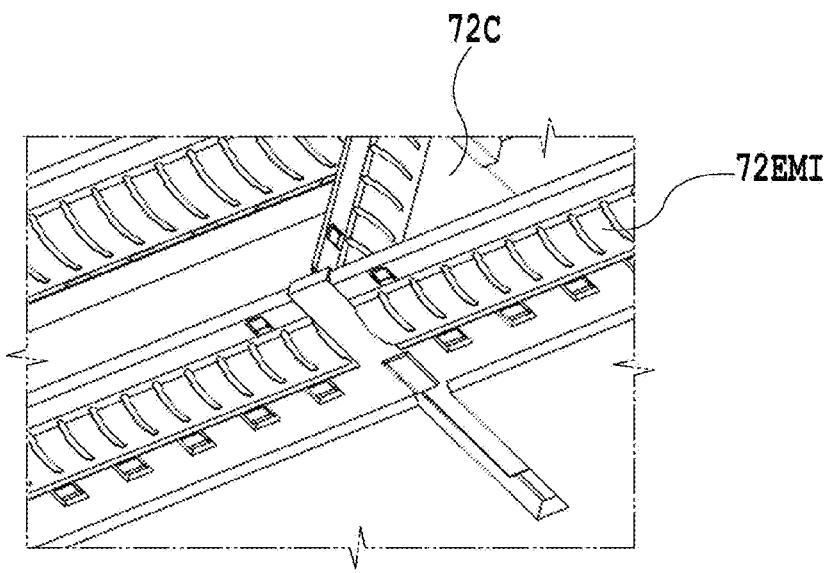
FIG. 61 is a perspective view showing an enlarged part of the transceiver module receptacle assembly illustrated in FIG. 60.

The bracket has two guide slots which are partitioned at a central part by the partition plate 72C, and penetrate the bracket along the two side wall portions 72RW and 72LW. Guide portions to be engaged with the grooves 74BG of the transceiver module 74 are formed in such a way as to protrude inward at two corners of a lower end portion of an inner peripheral portion of the bracket which defines each guide slot. As shown in FIG. 59 to FIG. 61, EMI fingers 72EMI are provided on peripheral edges of the guide slots of the bracket.

As shown in FIG. 59, the partition plate 72C extends from the central part on the inside of the bracket to a partition wall portion 72B so as to be substantially in parallel to the two side wall portions 72RW and 72LW. One end of the partition plate 72C is supported by being inserted into grooves 72K in an inner peripheral portion of the bracket, while another end of the partition plate 72C is supported by being inserted into a groove in the partition wall portion 72B. The partition wall portion 72B is designed to partition host connector accommodating portion to communicate with the transceiver module accommodating portions, respectively. As shown in FIG. 59, the partition plate 72C is provided with a plurality of pores 72Cai (i=1 to n, n is a positive integer) which establish communication between the adjacent transceiver module accommodating portions. The side wall portions 72RW and 72LW are also provided with a plurality of pores 72Rai and 72Lai (i=1 to n, n is the positive integer) which establish communication between the inside and outside of the transceiver module accommodating portions.

Figure 62A:
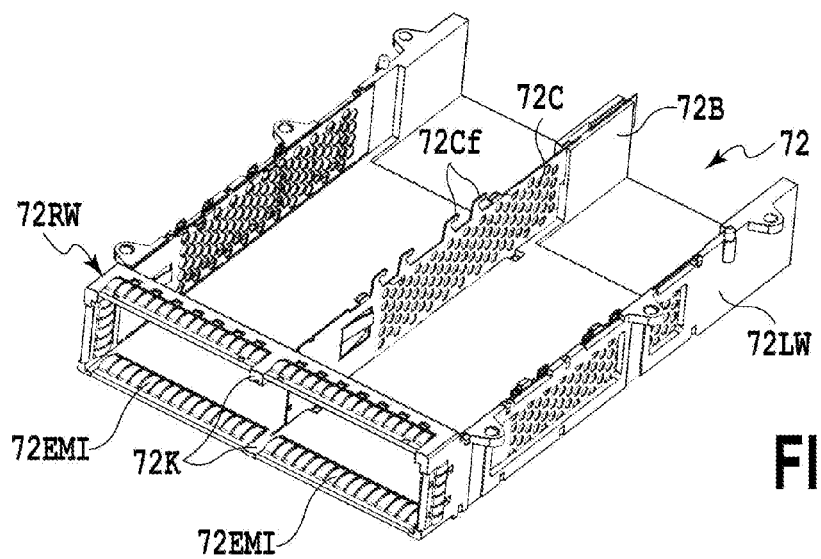
FIG. 62A is a perspective view for explaining fabricating procedures of the transceiver module receptacle assembly shown in FIG. 59.
Figure 62B:
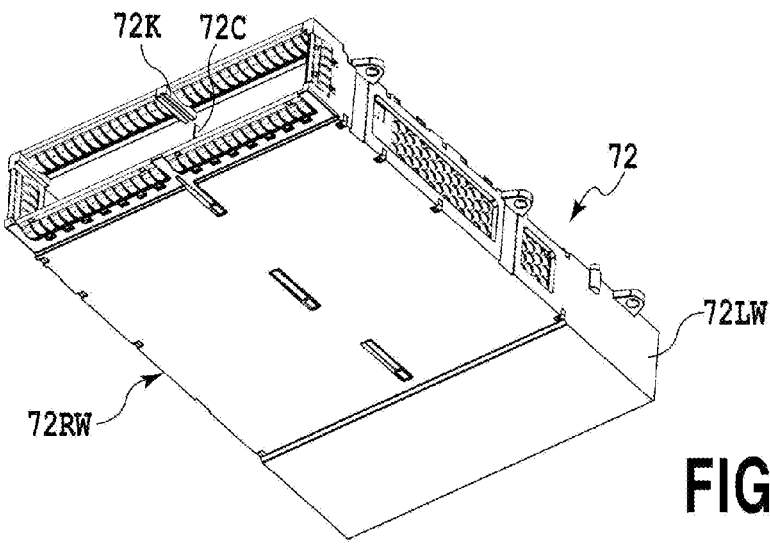
FIG. 62B is a perspective view made available for explaining the fabricating procedures of the transceiver module receptacle assembly shown in FIG. 59.
Figure 62C:
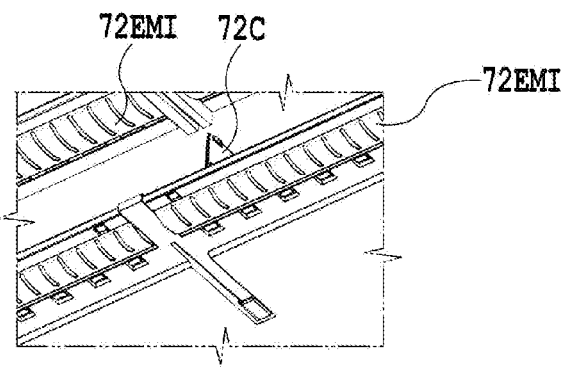
FIG. 62C is a perspective view made available for explaining the fabricating procedures of the transceiver module receptacle assembly shown in FIG. 59.

When the partition plate 72C is fitted to a place between the two side wall portions 72RW and 72LW, as shown in FIG. 62A to FIG. 62C, the one end portion of the partition plate 72C is first inserted toward the guide slots via the groove in the partition wall portion 72B, and then the one end portion of the partition plate 72C is further pushed into the grooves 72K in the inner peripheral portion of the bracket. Hence, the fitting of the partition plate 72C is completed.

At portions of the partition plate 72C in the vicinity of the guide slots of the bracket, two lock pieces 71LF are formed at positions corresponding to the lock/unlock mechanism of the attached transceiver module 74. A tip end portion of each lock piece 71LF protrudes obliquely toward the corresponding transceiver module accommodating portion. Thus, each lock piece 71LF is configured to selectively hold the transceiver module 74 in conjunction with the lock/unlock mechanism of the transceiver module 74 mentioned above. Moreover, the side wall portions 72RW and 72LW are also provided with the lock pieces 71LF that are opposed to the lock pieces 71LF on the partition plate 72C.

A plurality of flanges 72RF and 72LF are formed at predetermined intervals on lower ends of the side wall portions 72RW and 72LW, respectively. The flanges 72RF and 72LF have fitting holes, and are fastened to the printed wiring board PB5 by using small screws BS1 and nuts, and through holes to be formed in the printed wiring board PB5 in conformity to arrays of the flanges 72RF and 72LF. Thus, as shown in FIG. 52, a lower end surface of the transceiver module receptacle assembly 72 is fixed to a surface of the printed wiring board PB5.

Figure 53:
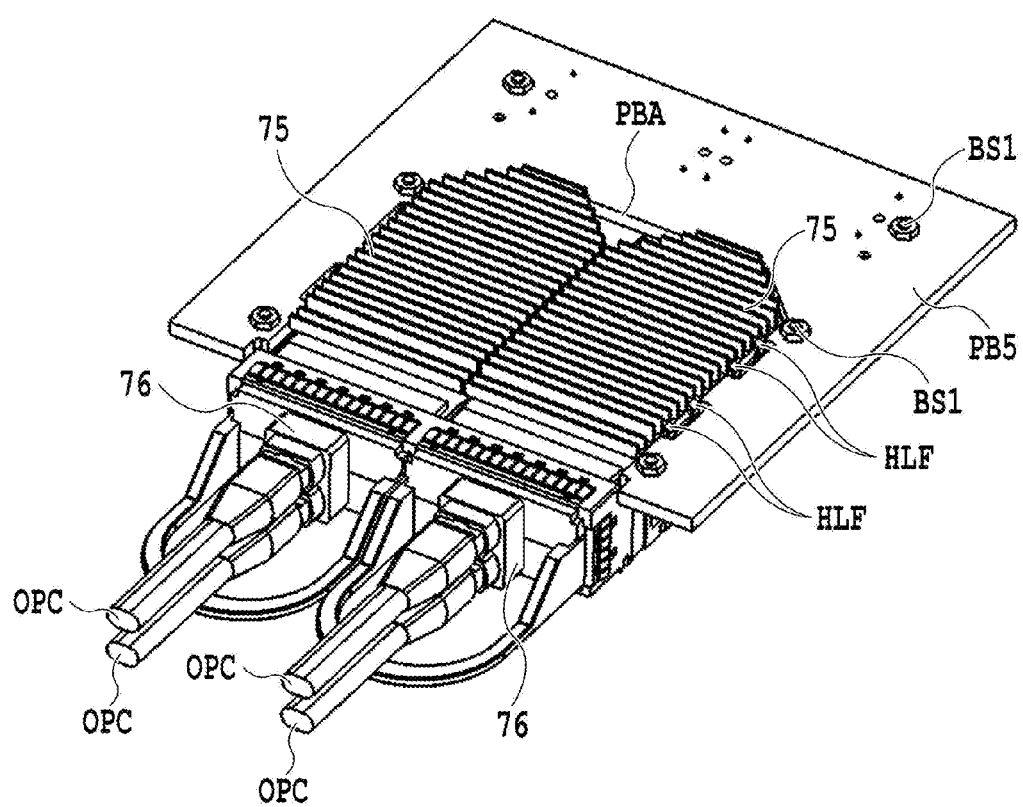
FIG. 53 is a perspective view showing the transceiver module assembly illustrated in FIG. 50, which is viewed from a heatsink side.
Figure 54:
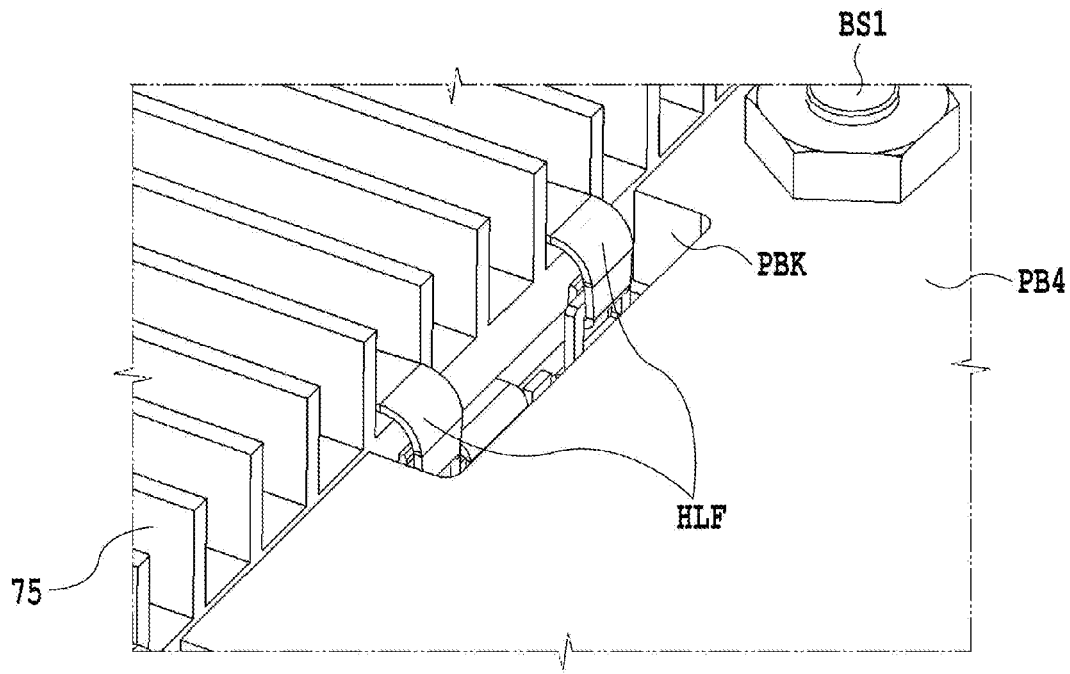
FIG. 54 is an enlarged perspective view showing a portion shown in FIG. 53.
Figure 55:
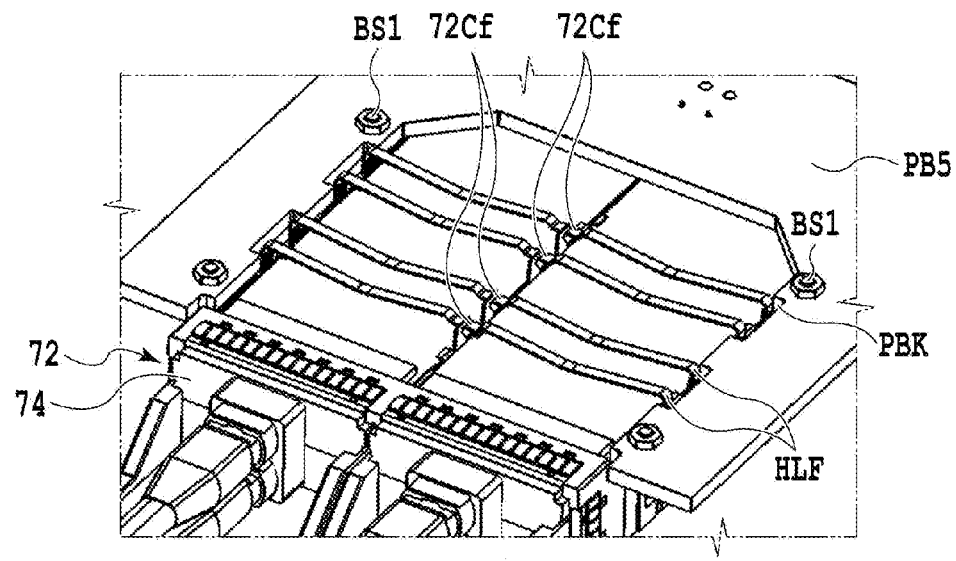
FIG. 55 is a perspective view showing a state where the heatsink in FIG. 53 is detached.

As shown in FIG. 53 and FIG. 56, the two heatsinks 75 are located at a portion immediately below the top portion 72T in such a way as to close respective apertures partitioned by the partition plate 72C. As shown in FIG. 53 and FIG. 55, each heatsink 75 is supported on the lower ends of the partition plate 72C and any of the side wall portions 72RW and 72LW by using four elastic clip pieces HLF. As shown in the enlarged view of FIG. 54, two ends of each clip piece HLF are fixed with a fixing piece 72sf formed at a lower end of a plate that forms part of any of the side wall portions 72RW and 72LW. Here, as shown in the enlarged view of FIG. 54, the fixing piece 72sf is inserted into a cutout portion PBK formed at a peripheral edge of the aperture of the printed wiring board PB5. Moreover, as shown in FIG. 55, a central part of each clip piece HLF is fixed with a hook piece 72Cf formed at the lower end of the partition plate 72C. Thus, each heatsink 75 is biased by an elastic force of the clip pieces HLF toward the inside of the corresponding one of the apertures partitioned by the partition plate 72C.

As a consequence, a cage of the transceiver module receptacle assembly 72 is formed by the bracket, the two side wall portions 72RW and 72LW, the top portion 72T, and the partition plate 72C.

Figure 51:
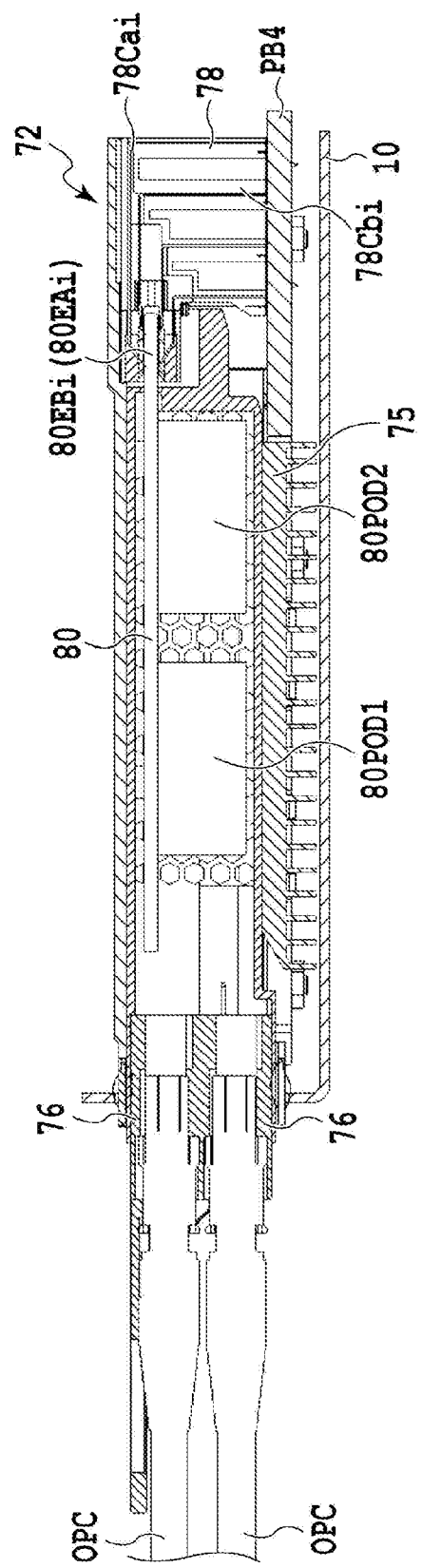
FIG. 51 is a cross-sectional view taken along XXXXXI-XXXXXI line in FIG. 50.

Each heatsink 75 is formed into a thin sheet shape by using a metal having fine heat conductivity such as an aluminum alloy. At a portion of the heatsink 75 inserted into the transceiver module accommodating portion, there is formed a contact portion 75BP (see FIG. 52), which comes into contact with a surface of the lower case 74B of the attached transceiver module 74 with a predetermined pressure attributed to the elastic force of the clip pieces HLF. Moreover, a group of fins are formed at a portion of the heatsink 75 to be inserted into an aperture PBA of the printed wiring board PB5 to be described later. The group of fins are formed from a plurality of heat radiating fins each having a rectangular transverse section. The heat radiating fins are arrayed in a longitudinal direction of the heatsink 75 at predetermined intervals, and are formed in parallel to one another. As shown in FIG. 51, the group of fins protrude from the aperture PBA of the printed wiring board PB5 toward a surface of the support panel 10 located below.

When the heatsinks 75 are fitted to the lower ends of the side wall portions 72RW and 72LW by using the clip pieces HLF, the groups of fins of the heatsinks 75 are disposed between a lower surface of the printed wiring board PB5 and the surface of the support panel 10. Hence, a height from a mounting surface of the printed wiring board PB5 to the top portion 72T of the transceiver module receptacle assembly 72 is set relatively small. As a consequence, the height of the transceiver module receptacle assembly 72 is practically reduced.

The printed wiring board PB5 has the aperture PBA located at a central part thereof. The aperture PBA is formed by being surrounded by long sides of the printed wiring board PB5, which are relatively long and opposed to each other, and by a connector placing portion that is orthogonal to end portions of the long sides and designed to connect the end portions of the long sides. The host connectors 78 shown in FIG. 58 are disposed on the connector placing portion.

Each host connector 78 comprises a connector insulator provided with a slot 78A into which the connection end of the transceiver module 74 is detachably inserted, and a plurality of contact terminals 78Cai and 78Cbi (i=1 to n, n is a positive integer) (see FIG. 51). The respective contact terminals 78Cai and 78Cbi are configured to electrically connect the connection end of the transceiver module 74 to a group of electrodes to be connected to the conductive pattern on the printed wiring board PB5.

Each of the contact terminals 78Cai and 78Cbi is made of a thin metal sheet material, and comprises: movable contact portions to be connected to the corresponding electrode portions of the module board 80 described above; solder ball terminals each connected to the corresponding one of the group of electrodes of the printed wiring board PB5; and connecting portions to connect the movable contact portions to the solder ball terminals. The contact terminals 78Cai are disposed in such a way as to surround the contact terminals 78Cbi located inside.

Figure 58:
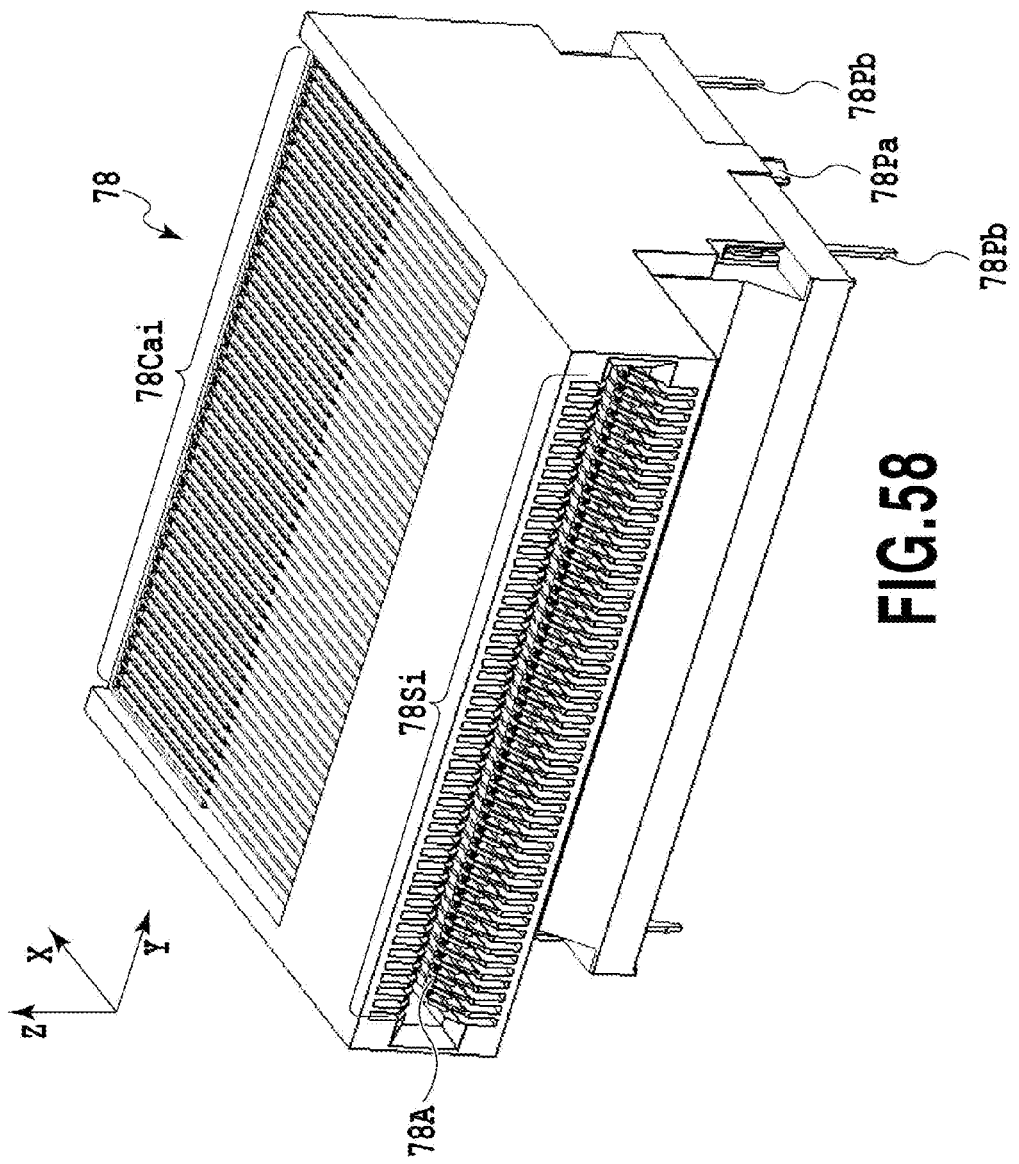
FIG. 58 is a perspective view showing a host connector used in the transceiver module receptacle assembly illustrated in FIG. 52.

For example, a plurality of slits 78Si (i=1 to n, n is the positive integer) to be formed at predetermined intervals along a Y coordinate axis of orthogonal coordinates in FIG. 58, are formed in two lines along a Z coordinate axis on peripheral edges of the slot 78A of the connector insulator formed by using a resin material. Each space between two adjacent slits 78Si is partitioned by a partition wall.

One of the movable contact portions of the contact terminal 78Cai and one of the movable contact portions of the contact terminal 78Cbi are disposed inside each of the slits 78Si on an upper side. The one movable contact portion of the contact terminal 78Cai and the one movable contact portion of the contact terminal 78Cbi are connected to the electrode portion formed on one surface of the module board 80 mentioned above. The one movable contact portion of the contact terminal 78Cai is connected to the corresponding signal line pad 80EAi and the corresponding ground line pad in the electrode portion. Moreover, the one movable contact portion of the contact terminal 78Cbi is connected to the corresponding signal line pad 80EBi and the corresponding ground line pad in the electrode portion.

Another of the movable contact portions of the contact terminal 78Cai and another of the movable contact portions of the contact terminal 78Cbi are disposed inside each of the slits 78Si on a lower side. The another movable contact portion of the contact terminal 78Cai and the another movable contact portion of the contact terminal 78Cbi are connected to the electrode portion formed on another surface of the module board 80 mentioned above. The another movable contact portion of the contact terminal 78Cai is connected to the corresponding signal line pad 80EAi and the corresponding ground line pad in the electrode portion. Moreover, the another movable contact portion of the contact terminal 78Cbi is connected to the corresponding signal line pad 80EBi and the corresponding ground line pad in the electrode portion.

A group of electrodes are formed on the connector placing portion so as to correspond to the arrays of the solder ball terminals of the contact terminals 78Cai and 78Cbi. Positioning holes, into which positioning pins 78Pa and 78Pb of the connector insulator are to be inserted, are formed at positions adjacent to the group of electrodes.

Accordingly, in this example as well, since the two lines of signal line pads 80EAi and 80EBi are formed on the module board 80, it is possible to achieve a higher speed, a higher density, and an increase in the number of channels in data transmission.

Figure 63:
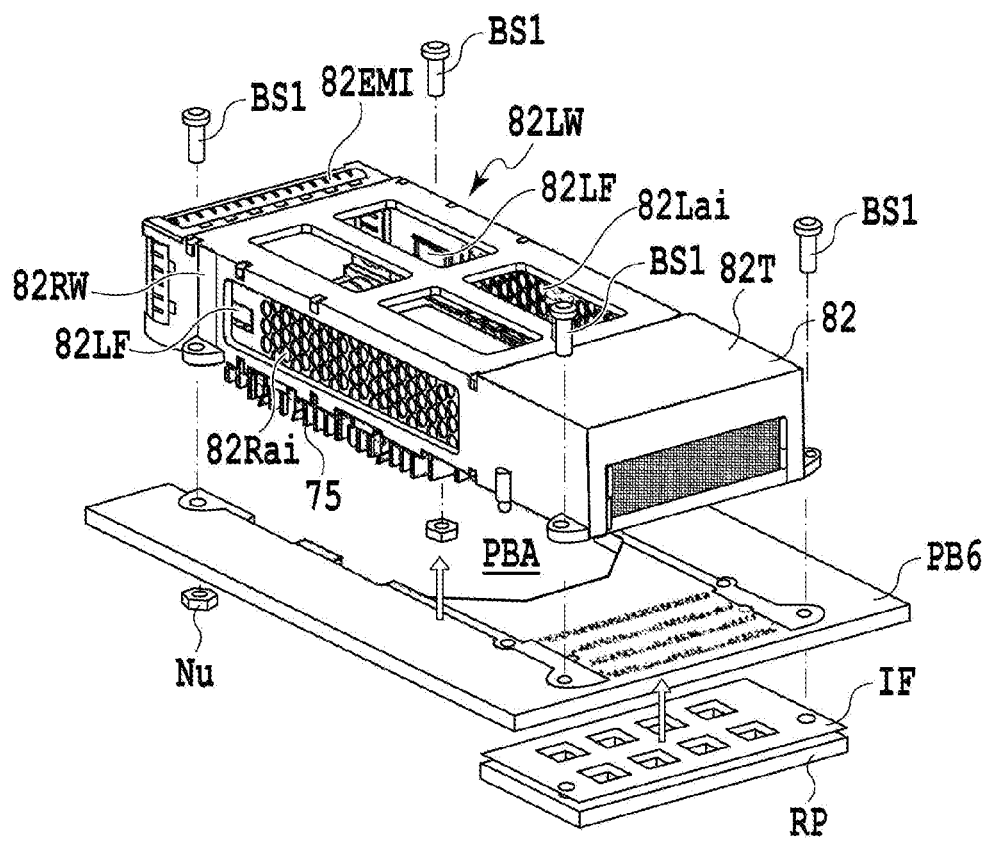
FIG. 63 is an exploded perspective view showing a transceiver module receptacle assembly used in a sixth embodiment of a transceiver module assembly according to the present invention.

FIG. 63 shows a configuration of a transceiver module receptacle assembly used in a transceiver module assembly according to a sixth embodiment of the present invention. Note that constituents in FIG. 63 which are the same as the constituents in the example shown in FIG. 53 will be denoted by the same reference numerals and overlapping description thereof will be omitted.

In FIG. 63, the transceiver module assembly according to the present invention comprises the transceiver modules 74 (see FIG. 57), and transceiver module receptacle assemblies 82. Note that the transceiver module assembly may include the above-described transceiver modules 14 (see FIG. 5) instead of the transceiver modules 74.

A plurality of transceiver module receptacle assemblies 82 are juxtaposed on a support panel inside predetermined electronic equipment. Note that FIG. 63 representatively illustrates a transceiver module receptacle assembly which is supported by the support panel and configured to house one transceiver module individually.

Figure 64:
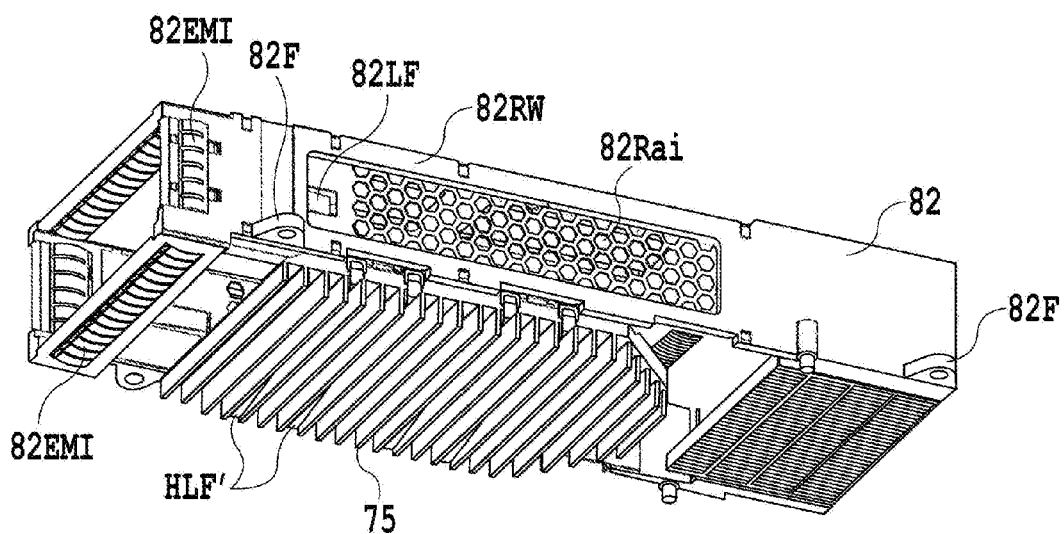
FIG. 64 is a perspective view showing the transceiver module receptacle assembly used in the sixth embodiment of the transceiver module assembly according to the present invention.

As shown in FIG. 64, each transceiver module receptacle assembly 82 comprises, as its main components: a bracket which guides the transceiver module 74 at the time of attachment and detachment of the transceiver module 74 as described above; two side wall portions 82RW and 82LW being connected to the bracket and constituting a contour; a top portion 82T connecting the two side wall portions 82RW and 82LW to each other; one heatsink 75 which radiates heat generated from the transceiver module 74; and a host connector 88 which electrically connects a group of contact pads being the connection end of the attached transceiver module 74, to a conductive pattern on a printed wiring board PB6.

The bracket has a guide slot which penetrates the bracket along the two side wall portions 82RW and 82LW. Guide portions to be engaged with the grooves 74BG of the transceiver module 74 are formed in such a way as to protrude inward at two corners of a lower end portion of an inner peripheral portion of the bracket which defines the guide slot. EMI fingers 82EMI are provided on peripheral edges of the guide slot of the bracket.

The side wall portions 82RW and 82LW are provided with a plurality of pores 82Rai and 82Lai (i=1 to n, n is a positive integer) which establish communication between the inside and outside of a transceiver module accommodating portion.

At portions of the side wall portions 82RW and 82LW in the vicinity of the guide slot of the bracket, lock pieces 82LF are formed to be opposed to each other at positions corresponding to a lock/unlock mechanism of the attached transceiver module 74. A tip end portion of each lock piece 82LF protrudes obliquely toward the transceiver module accommodating portion. Thus, the lock pieces 82LF are configured to selectively hold the transceiver module 74 in conjunction with the lock/unlock mechanism of the transceiver module 74 mentioned above.

A plurality of flanges 82F are formed at predetermined intervals on lower ends the side wall portions 82RW and 82LW, respectively. The flanges 82F have fitting holes, and are fastened to the printed wiring board PB6 by using small screws BS1 and nuts Nu, and through holes to be formed in the printed wiring board PB6 in conformity to arrays of the flanges 82F. Thus, a lower end surface of the transceiver module receptacle assembly 82 is fixed to a surface of the printed wiring board PB6. Openings that are partitioned substantially crosswise are formed in an upper part of the transceiver module accommodating portion located adjacent to the top portion 82T. The heatsink 75 is located at a portion immediately below the transceiver module accommodating portion in such a way as to close the aperture. The heatsink 75 is fixed to the lower ends of the side wall portions 82RW and 82LW by using elastic clip pieces HLF'.

As a consequence, a cage of the transceiver module receptacle assembly 82 is formed by the bracket, the two side wall portions 82RW and 82LW, and the top portion 82T.

Figure 65:
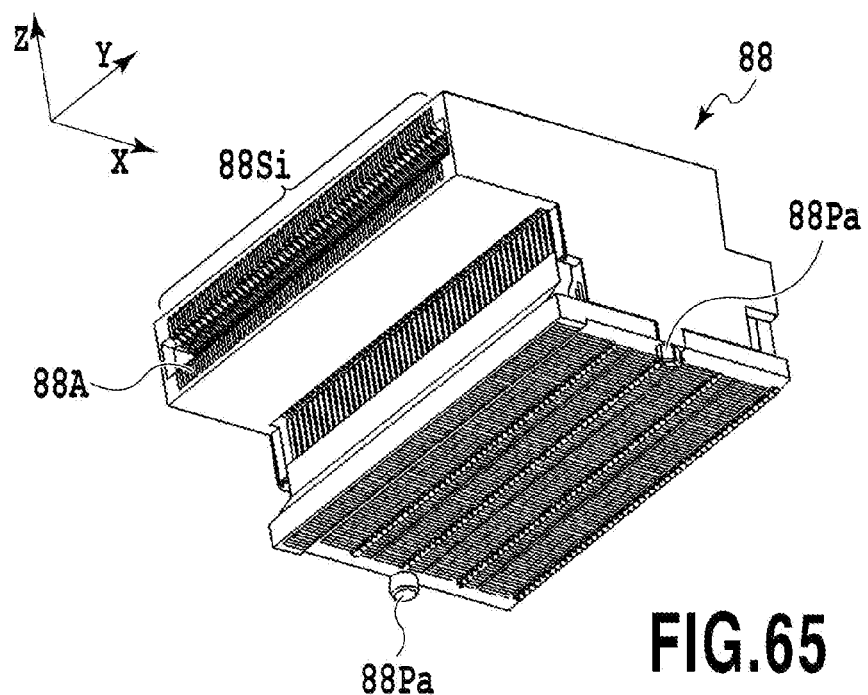
FIG. 65 is a perspective view showing a host connector used in the transceiver module receptacle assembly illustrated in FIG. 64.
Figure 66:
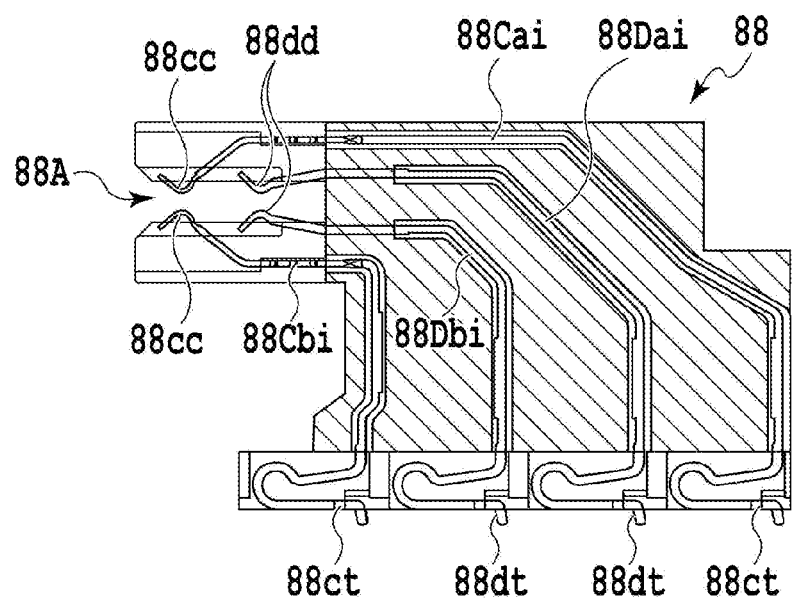
FIG. 66 is a cross-sectional view of the host connector shown in FIG. 65.

The printed wiring board PB6 has an aperture PBA located at a central part thereof. The aperture PBA is formed by being surrounded by long sides of the printed wiring board PB6, which are relatively long and opposed to each other, and by a connector placing portion that is orthogonal to end portions of the long sides and designed to connect the end portions of the long sides. The host connector 88 shown in FIG. 65 is disposed on the connector placing portion. A reinforcing plate RP is disposed on a back surface side of the connector placing portion by the intermediary of an insulating sheet IF.

The host connector 88 comprises a connector insulator provided with a slot 88A into which the connection end of the transceiver module 74 is detachably inserted, a plurality of contact terminals 88Cai and 88Cbi (i=1 to n, n is a positive integer) (see FIG. 51), and a plurality of contact terminals 88Dai and 88Dbi (i=1 to n, n is the positive integer) (see FIG. 51). The respective contact terminals 88Cai and 88Cbi and the respective contact terminals 88Dai and 88Dbi are configured to electrically connect the connection end of the transceiver module 74 to a group of electrodes to be connected to the conductive pattern on the printed wiring board PB6.

Each of the contact terminals 88Cai and 88Cbi is made of a thin metal sheet material, and comprises: movable contact portions 88cc to be connected to the corresponding electrode portions of the module board 80 described above; press-fit terminal portions 88ct each configured to come into contact with the corresponding one of the groups of electrodes on the printed wiring board PB6; and connecting portions to connect the movable contact portions 88cc to the press-fit terminal portions 88ct. The contact terminals 88Cai and 88Cbi are disposed in such a way as to surround the contact terminals 88Dai and 88Dbi located inside.

For example, a plurality of slits 88Si (i=1 to n, n is the positive integer) to be formed at predetermined intervals along a Y coordinate axis of orthogonal coordinates in FIG. 65, are formed in two lines along a Z coordinate axis on peripheral edges of the slot 88A of the connector insulator formed by using a resin material. Each space between two adjacent slits 88Si is partitioned by a partition wall.

The movable contact portion 88cc of the contact terminal 88Cai and the movable contact portion 88dd of the contact terminal 88Dai are disposed inside each of the slits 88Si on an upper side. The movable contact portion 88cc of the contact terminal 88Cai and the movable contact portion 88dd of the contact terminal 88Dai are connected to the electrode portion formed on one surface of the module board 80 mentioned above. The movable contact portion 88cc of the contact terminal 88Cai is connected to the corresponding signal line pad 80EAi and the corresponding ground line pad in the electrode portion. Moreover, the movable contact portion 88dd of the contact terminal 88Dai is connected to the corresponding signal line pad 80EBi and the corresponding ground line pad in the electrode portion.

The movable contact portion 88cc of the contact terminal 88Cbi and the movable contact portion 88dd of the contact terminal 88Dbi are disposed inside each of the slits 88Si on a lower side. The movable contact portion 88cc of the contact terminal 88Cbi and the movable contact portion 88dd of the contact terminal 88Dbi are connected to the electrode portion formed on another surface of the module board 80 mentioned above. The movable contact portion 88cc of the contact terminal 88Cbi is connected to the corresponding signal line pad 80EAi and the corresponding ground line pad in the electrode portion. Moreover, the movable contact portion 88dd of the contact terminal 88Dbi is connected to the corresponding signal line pad 80EBi and the corresponding ground line pad in the electrode portion.

A group of electrodes are formed on the connector placing portion so as to correspond to the arrays of the contact terminals 88Cai and 88Cbi, the contact terminals 88Dai and 88Dbi, and the press-fit terminal portions 88ct and 88dt. Positioning holes, into which positioning pins 88Pa of the connector insulator are to be inserted, are formed at positions adjacent to the group of electrodes.

Accordingly, in this example as well, since the two lines of signal line pads 80EAi and 80EBi are formed on the module board 80, it is possible to achieve a higher speed, a higher density, and an increase in the number of channels in data transmission.

Note that in the transceiver module according to each of the embodiments of the present invention, the module board includes at least one pod connector. However, the transceiver module does not always have to be formed in this way. For instance, the transceiver module may include a TOSA and any of an ROSA and a BOSA, and the module board may be configured to be connected to an optical connector at a port through the TOSA and any of the ROSA and the BOSA.

Furthermore, it goes without saying that the transceiver module, the transceiver module receptacle assembly, and the transceiver module assembly according to any of the embodiments of the present invention are also applicable to transceiver modules, transceiver module receptacle assemblies, and transceiver module assemblies for transmitting and receiving optical signals in other formats.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A transceiver module comprising:
   at least one module board which is electrically connected to at least one electric signal transmission path, and has a connection end; and
   a case having an aperture from which the connection end of the module board protrudes, and being configured to accommodate the module board, wherein
   both electrode surfaces of the connection end of the module board include:
      a first contact pad array comprising a plurality of contact pads including ground line pads arrayed at predetermined intervals and in parallel to one another and two signal line pads formed at an equal interval between two adjacent ground line pads, and
      a second contact pad array located away from the first contact pad array, and comprising a plurality of contact pads including ground line pads, arrayed at predetermined intervals and in parallel to one another, and two signal line pads formed at an equal interval between two adjacent ground line pads, wherein
      at least one of the first contact pad array and the second contact pad array has the same configuration on both electrode surfaces.

2. The transceiver module according to claim 1, wherein a ground line contact pad is formed across the first contact pad array and the second contact pad array.

3. A transceiver module receptacle assembly comprising:
   a connector to be connected to the transceiver module according to claim 1; and
   a receptacle cage having
   a module accommodating portion having a module slot at one end to allow passage of the transceiver module, and being configured to detachably accommodate the transceiver module, and
   a connector accommodating portion communicating with the module accommodating portion and configured to accommodate the connector.

4. A transceiver module assembly comprising:
   the transceiver module according to claim 1; and
   a transceiver module receptacle assembly including
   a connector to be connected to the transceiver module, and
   a receptacle cage having
   a module accommodating portion having a module slot at one end to allow passage of the transceiver module, and being configured to detachably accommodate the transceiver module, and
   a connector accommodating portion communicating with the module accommodating portion and configured to accommodate the connector.

5. A transceiver module comprising:
   at least one module board which is electrically connected to at least one electric signal transmission path, and has a connection end; and
   a case having an aperture from which the connection end of the module board protrudes, and being configured to accommodate the module board, wherein
   the connection end of the module board includes a plurality of contact pads arrayed at predetermined intervals and in parallel to one another, and
   at least one electrode surface of the connection end of the module board includes:
      a first plug connector having a first plurality of contact terminals to be electrically connected to the connection end, and
      a second plug connector stacked on the first plug connector, and having a second plurality of contact terminals, arranged the same as the first plurality of contact terminals, to be electrically connected to the connection end.

6. A transceiver module receptacle assembly comprising:
   a connector to be connected to the transceiver module according to claim 5; and
   a receptacle cage having
   a module accommodating portion having a module slot at one end to allow passage of the transceiver module, and being configured to detachably accommodate the transceiver module, and
   a connector accommodating portion communicating with the module accommodating portion and configured to accommodate the connector.

7. A transceiver module assembly comprising:
   the transceiver module according to claim 5; and
   a transceiver module receptacle assembly including
   a connector to be connected to the transceiver module, and
   a receptacle cage having
   a module accommodating portion having a module slot at one end to allow passage of the transceiver module, and being configured to detachably accommodate the transceiver module, and
   a connector accommodating portion communicating with the module accommodating portion and configured to accommodate the connector.

8. A transceiver module comprising:
   a first module board and a second module board which are electrically connected to at least one electric signal transmission path, and each of which has both a connection end and a pod connector incorporating an IC chip having a photoelectric conversion element; and
   a case having an aperture from which the connection ends of the first module board and the second module board protrude, and being configured to accommodate the module boards, wherein
   the connection end of the first module board includes a first plug connector having a plurality of contact terminals to be electrically connected to the connection end of the first module board, and
   the connection end of the second module board includes a second plug connector having a plurality of contact terminals to be electrically connected to the connection end of the second module board.

9. A transceiver module receptacle assembly comprising:
a connector to be connected to the transceiver module according to claim 8; and
a receptacle cage having
a module accommodating portion having a module slot at one end to allow passage of the transceiver module, and being configured to detachably accommodate the transceiver module, and
a connector accommodating portion communicating with the module accommodating portion and configured to accommodate the connector.

10. A transceiver module assembly comprising:
the transceiver module according to claim 8; and
a transceiver module receptacle assembly including
a connector to be connected to the transceiver module, and
a receptacle cage having
a module accommodating portion having a module slot at one end to allow passage of the transceiver module, and being configured to detachably accommodate the transceiver module, and
a connector accommodating portion communicating with the module accommodating portion and configured to accommodate the connector.

* * * * *